(12) United States Patent
Yamazaki et al.

(10) Patent No.: US 9,887,296 B2
(45) Date of Patent: Feb. 6, 2018

(54) SEMICONDUCTOR ELEMENT, METHOD FOR MANUFACTURING SEMICONDUCTOR ELEMENT, AND SEMICONDUCTOR DEVICE INCLUDING SEMICONDUCTOR ELEMENT

(71) Applicant: Semiconductor Energy Laboratory Co., Ltd., Atsugi-shi, Kanagawa-ken (JP)

(72) Inventors: Shunpei Yamazaki, Setagaya (JP);
Tatsuya Honda, Isehara (JP);
Suzunosuke Hiraishi, Tochigi (JP);
Hiroshi Kanemura, Tochigi (JP);
Masashi Oota, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 116 days.

(21) Appl. No.: 13/675,532

(22) Filed: Nov. 13, 2012

(65) Prior Publication Data

US 2013/0126868 A1     May 23, 2013

(30) Foreign Application Priority Data

Nov. 18, 2011    (JP) ................................. 2011-252641

(51) Int. Cl.
*H01L 29/78*           (2006.01)
*H01L 29/786*         (2006.01)

(52) U.S. Cl.
CPC ................. *H01L 29/7869* (2013.01)

(58) Field of Classification Search
CPC ....................................................... H01L 29/78
(Continued)

(56) References Cited

U.S. PATENT DOCUMENTS 5,731,856 A     3/1998    Kim et al.
5,744,864 A     4/1998    Cillessen et al.
(Continued)

FOREIGN PATENT DOCUMENTS

CN       001445821 A     10/2003
CN       101252134 A     8/2008
(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.
(Continued)

*Primary Examiner* — Lynne Gurley
*Assistant Examiner* — Vernon P Webb
(74) *Attorney, Agent, or Firm* — Robinson Intellectual Property Law Office; Eric J. Robinson

(57) ABSTRACT

In a semiconductor element including an oxide semiconductor film as an active layer, stable electrical characteristics are achieved. A semiconductor element includes a base film which is an oxide film at least a surface of which has crystallinity; an oxide semiconductor film having crystallinity over the base film; a gate insulating film over the oxide semiconductor film; a gate electrode overlapping with at least the oxide semiconductor film, over the gate insulating film; and a source electrode and a drain electrode which are electrically connected to the oxide semiconductor film. The base film is a film containing indium and zinc. With the structure, a state of crystals in the oxide semiconductor film reflects that in the base film; thus, the oxide semiconductor film can have crystallinity in a large region in the thickness direction. Accordingly, the electrical characteristics of the
(Continued)

semiconductor element including the film can be made stable.

22 Claims, 27 Drawing Sheets

(58) Field of Classification Search
USPC ..... 257/57, 347, E21.411, E29.273; 438/151
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,134,156 B2 | 3/2012 | Akimoto |
| 8,158,464 B2 | 4/2012 | Akimoto |
| 8,319,218 B2 | 11/2012 | Yamazaki et al. |
| 8,368,079 B2 | 2/2013 | Akimoto |
| 8,502,216 B2 | 8/2013 | Akimoto et al. |
| 8,525,165 B2 | 9/2013 | Akimoto |
| 8,748,881 B2 | 6/2014 | Yamazaki |
| 8,779,420 B2 | 7/2014 | Yamazaki |
| 8,809,852 B2 | 8/2014 | Yamazaki et al. |
| 9,214,520 B2 | 12/2015 | Yamazaki |
| 9,306,072 B2 | 4/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0290604 A1* | 12/2007 | Sakanoue ........... H01L 51/5088 313/503 |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0242992 A1* | 10/2009 | Kim ................ H01L 21/823462 257/360 |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0032668 A1* | 2/2010 | Yamazaki et al. .............. 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0127523 A1 | 6/2011 | Yamazaki |
| 2012/0052606 A1* | 3/2012 | Yamazaki ....................... 438/23 |
| 2012/0161125 A1 | 6/2012 | Yamazaki |
| 2013/0069053 A1 | 3/2013 | Yamazaki et al. |
| 2013/0069054 A1 | 3/2013 | Isobe et al. |
| 2013/0069055 A1 | 3/2013 | Yamazaki et al. |
| 2013/0299824 A1 | 11/2013 | Akimoto et al. |
| 2014/0087517 A1 | 3/2014 | Akimoto et al. |
| 2016/0163871 A1 | 6/2016 | Yamazaki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |

(56) References Cited

FOREIGN PATENT DOCUMENTS

| JP | 2003-086808 A | 3/2003 |
|---|---|---|
| JP | 2004-006686 A | 1/2004 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-135770 A | 6/2010 |
| JP | 2011-086954 A | 4/2011 |
| JP | 2011-100979 A | 5/2011 |
| JP | 2011-135063 A | 7/2011 |
| JP | 2012-134468 A | 7/2012 |
| WO | WO-2004/114391 | 12/2004 |
| WO | WO-2007/058329 | 5/2007 |
| WO | WO-2010/053060 | 5/2010 |
| WO | WO-2011/043176 | 4/2011 |
| WO | WO-2011/065243 | 6/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites For Displya Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases For Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure To Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Chinese Office Action (Application No. 201210461422.X) dated Jun. 23, 2016.

Chinese Office Action (Application No. 201210461422.X) dated Mar. 2, 2017.

\* cited by examiner

SEMICONDUCTOR ELEMENT, METHOD FOR MANUFACTURING SEMICONDUCTOR ELEMENT, AND SEMICONDUCTOR DEVICE INCLUDING SEMICONDUCTOR ELEMENT

BACKGROUND OF THE INVENTION

1. Field of the Invention

The present invention relates to a semiconductor element, a method for manufacturing the semiconductor element, and a semiconductor device including the semiconductor element.

In this specification, a "semiconductor element" refers to an element that can function by utilizing semiconductor characteristics, such as a transistor or a diode. Further, a "semiconductor device" refers to any device that can function by utilizing semiconductor characteristics of the semiconductor element; an electro-optical device, a semiconductor circuit, and an electronic device are all included in the category of the semiconductor device.

2. Description of the Related Art

A technique by which a transistor is formed using a semiconductor thin film formed over a substrate having an insulating surface has been attracting attention. The transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor including an amorphous oxide semiconductor film containing indium (In), gallium (Ga), and zinc (Zn) as an active layer is disclosed (see Patent Document 1).

REFERENCE

Patent Document

[Patent Document 1] Japanese Published Patent Application No. 2006-165528

SUMMARY OF THE INVENTION

A transistor including an oxide semiconductor film as an active layer (hereinafter referred to as an oxide semiconductor transistor) operates faster (it can also be said that the field effect mobility is higher) than a transistor including an amorphous silicon film as an active layer and is manufactured more easily than a transistor including a polycrystalline silicon film as an active layer.

However, some problems of the transistor including an oxide semiconductor film as an active layer have been pointed out. One of the problems is unstable electrical characteristics. Specifically, a problem that the threshold voltage of the transistor is negatively shifted by a bias-temperature stress test (also referred to as a BT stress test) or irradiation of visible light or ultraviolet light, so that the transistor tends to be normally on has been pointed out. As one of factors of the problem, oxygen vacancy in the oxide semiconductor film can be given.

When the oxide semiconductor film is amorphous, the bonding state of metal atoms and oxygen atoms in the oxide semiconductor film is not ordered; thus, oxygen vacancy is likely to be created. For this reason, the electrical characteristics (e.g., electrical conductivity) of the oxide semiconductor film might be changed. Such a change can cause a variation in the electrical characteristics of a transistor, which leads to a reduction in reliability of a semiconductor device including the transistor.

In view of the above problem, one object of one embodiment of the present invention is to provide a transistor which has stable electrical characteristics even when an oxide semiconductor film is used as an active layer. Further, one object is to provide a method for manufacturing the transistor. Furthermore, one object is to provide a highly reliable semiconductor device which has stable electrical characteristics by using the transistor.

Over a surface where an oxide semiconductor film is to be formed, an oxide film at least a surface of which has crystallinity is provided as a base film and the oxide semiconductor film is provided over the film. Thus, a crystal in the base film functions as a seed crystal of the oxide semiconductor film. While depositing the oxide semiconductor film, crystal growth of the oxide semiconductor film, reflecting a state of crystals in the base film, occurs from a vicinity of an interface with the base film. Thus, the oxide semiconductor film turns into a film having crystallinity in a large region in the thickness direction, so that a transistor including the film has stable electrical characteristics.

That is, one embodiment of the present invention is a semiconductor element including a base film which is an oxide film at least a surface of which has crystallinity; an oxide semiconductor film having crystallinity over the base film; a gate insulating film over the oxide semiconductor film; a gate electrode overlapping with at least the oxide semiconductor film, over the gate insulating film; and a source electrode and a drain electrode which are electrically connected to the oxide semiconductor film. The base film contains indium and zinc.

With the structure described in the above embodiment, crystal growth of the oxide semiconductor film, reflecting a state of crystals in the base film, occurs while depositing the oxide semiconductor film; thus, the oxide semiconductor film can have crystallinity in a large region in the thickness direction. Accordingly, the electrical characteristics of a transistor including the film can be stable.

In the above structure, it is preferable that the base film contain indium, zinc, and one or more of zirconium, yttrium, and cerium because a conductivity of the base film can be reduced and thus carriers flowing between the source electrode and the drain electrode are less likely to be adversely affected by the base film.

Further, in the above structure, the oxide semiconductor film has a crystal-amorphous mixed phase structure where crystal parts are included in an amorphous phase. In each of the crystal parts, a c-axis is aligned with a direction parallel to a normal vector of a surface where the oxide semiconductor film is formed or a normal vector of a surface of the oxide semiconductor film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Thus, a transistor including the oxide semiconductor film is preferable because the transistor has stable electrical characteristics.

When the semiconductor element having the above-described structure is used as a part of a semiconductor device, the semiconductor device can have high reliability.

One embodiment of the present invention is a method for manufacturing a semiconductor element. The method includes the steps of forming a base film which is an oxide film at least a surface of which has crystallinity; forming an oxide semiconductor film having crystallinity over the base film; forming a gate insulating film over the oxide semiconductor film; forming a gate electrode overlapping with at least the oxide semiconductor film, over the gate insulating film; and forming a source electrode and a drain electrode which are electrically connected to the oxide semiconductor film. A film containing indium and zinc is formed as the base film.

With the manufacturing method described in the above embodiment, crystal growth of the oxide semiconductor film, reflecting a state of crystals in the base film, occurs while depositing the oxide semiconductor film; thus, the oxide semiconductor film can be formed to have crystallinity in a large region in the thickness direction. Accordingly, the electrical characteristics of a transistor including the film can be stable.

In the above-described manufacturing method, it is preferable that a film containing indium, zinc, and one or more of zirconium, yttrium, and cerium be used as the base film because the base film can be formed to have a low conductivity and thus carriers flowing between the source electrode and the drain electrode are less likely to be adversely affected by the base film.

Further, in the above-described manufacturing method, the oxide semiconductor film is preferably formed using a sputtering apparatus at a film formation temperature higher than or equal to 200° C. and lower than or equal to 450° C. because the oxide semiconductor film can be formed to have crystal parts in each of which a c-axis is aligned with a direction parallel to a normal vector of a surface where the oxide semiconductor film is formed or a normal vector of a surface of the oxide semiconductor film.

In the above-described manufacturing method, the oxide semiconductor film is preferably subjected to heat treatment at a temperature higher than or equal to 200° C. and lower than or equal to 700° C. after being formed using a sputtering apparatus because the oxide semiconductor film can be formed to have crystal parts in each of which a c-axis is aligned with a direction parallel to a normal vector of a surface of the oxide semiconductor film or a normal vector of a surface where the oxide semiconductor film.

Over a surface where an oxide semiconductor film is to be formed, an oxide film at least a surface of which has crystallinity is provided as a base film and the oxide semiconductor film is provided over the base film. Thus, while depositing the oxide semiconductor film, crystal growth of the oxide semiconductor film, reflecting a state of crystals in the base film, occurs from a vicinity of an interface with the base film, so that the oxide semiconductor film can have crystallinity in a large region in the thickness direction. Accordingly, the electrical characteristics of a transistor including the film can be stable.

DETAILED DESCRIPTION OF THE INVENTION

Figure 1A:
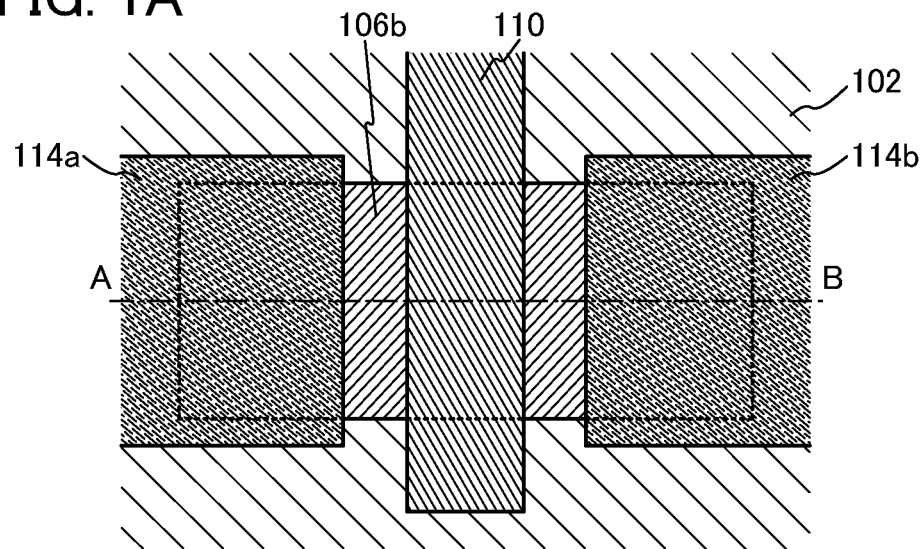
FIGS. 1A and 1B are a plan view and a cross-sectional view illustrating one embodiment of a semiconductor device.

Hereinafter, embodiments and an example of the invention disclosed in this specification will be described in detail below with reference to the accompanying drawings. Note that the present invention is not limited to the following description and it will be readily appreciated by those skilled in the art that modes and details can be modified in various ways without departing from the spirit and the scope of the present invention. Thus, the invention should not be construed as being limited to the description in the following embodiments.

In the following embodiments, the same portions or portions having similar functions are denoted by the same reference numerals in different drawings, and explanation thereof will not be repeated.

Note that the position, the size, the range, or the like of each structure illustrated in the drawings and the like are not accurately represented in some cases for easy understanding. Thus, the disclosed invention is not necessarily limited to the position, size, range, or the like as disclosed in the drawings and the like.

In this specification and the like, ordinal numbers such as "first", "second", and "third" are used to avoid confusion among components, and the terms do not mean limitation of the number of components.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Thus, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Embodiment 1

In this embodiment, one embodiment of a semiconductor device and a method for manufacturing the semiconductor device will be described with reference to FIGS. 1A and 1B, FIGS. 2A to 2D, FIGS. 3A to 3D, FIGS. 4A and 4B, and FIGS. 5A to 5E.

<Example of Structure of Semiconductor Device>

Figure 1B:
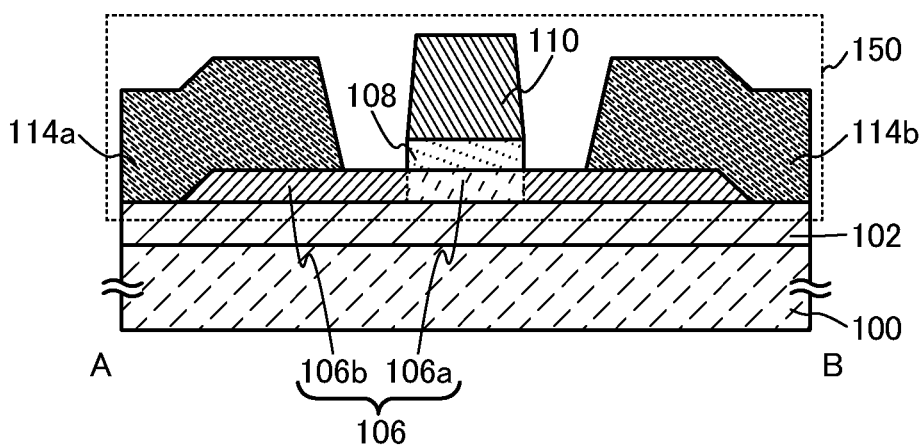

FIGS. 1A and 1B illustrate an example of a plan view and a cross-sectional view of a transistor having a top-gate structure, as an example of a semiconductor device. FIG. 1A is a plan view, and FIG. 1B is a cross-sectional view taken along line A-B in FIG. 1A. Note that in FIG. 1A, some components (e.g., a substrate 100) of a transistor 150 are omitted to avoid complexity.

The transistor 150 illustrated in FIGS. 1A and 1B includes, over the substrate 100, a base film 102, an oxide semiconductor film 106, a gate insulating film 108, a gate electrode 110 which overlaps with at least the oxide semiconductor film 106, and a source electrode 114a and a drain electrode 114b which are electrically connected to the oxide semiconductor film 106.

An oxide semiconductor to be used for the oxide semiconductor film 106 preferably contains indium (In) and zinc (Zn). As a stabilizer for reducing a variation in electrical characteristics of a transistor including the oxide semiconductor, gallium (Ga) is preferably additionally contained. Tin (Sn) is preferably contained as a stabilizer. It is also preferable that one or more kinds of elements selected from hafnium (Hf), zirconium (Zr), titanium (Ti), scandium (Sc), yttrium (Y), lanthanoid (e.g., cerium (Ce), neodymium (Nd), or gadolinium (Gd)) be contained as a stabilizer.

As the oxide semiconductor, for example, any of the following can be used: an indium oxide, a tin oxide, a zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn. Note that an In—Ga—Zn-based oxide has sufficiently high resistance when there is no electric field and thus the off-state current can be sufficiently reduced. In addition, also having high mobility, the In—Ga—Zn-based oxide is suitable for a semiconductor material used in a semiconductor device.

For example, an In—Ga—Zn-based oxide with an atomic ratio where In:Ga:Zn=1:1:1 (=1/3:1/3:1/3), In:Ga:Zn=3:1:2 (=1/2:1/6:1/3), In:Ga:Zn=1:3:2 (=1/6:1/2:1/3), or In:Ga:Zn=2:2:1 (=2/5:2/5:1/5), or an oxide whose atomic ratio is in the neighborhood of the above atomic ratios can be used. Alternatively, an In—Sn—Zn-based oxide with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose atomic ratio is in the neighborhood of the above atomic ratios may be used.

Alternatively, a material represented by $InMO_3(ZnO)_m$ (m>0, m is not an integer) may be used as an oxide semiconductor. Note that M represents one or more metal elements selected from Ga, Fe, Mn, and Co. Further alternatively, as the oxide semiconductor, a material expressed by $In_2SnO_5(ZnO)_n$ (n>0, n is a natural number) may be used. A film formed using an oxide semiconductor material (hereinafter referred to as an "oxide semiconductor film") can be formed in the following manner, for example: an oxide semiconductor film is formed by a PVD method such as a sputtering method, an electron beam evaporation method, or the like; a resist mask is formed over the film by a photolithography method or the like; and then, the semiconductor film is selectively removed by a dry etching method, a wet etching method, or the like.

The oxide semiconductor film 106 can be in a single crystal state, a polycrystalline (also referred to as polycrystal) state, an amorphous state, or the like. A c-axis aligned crystalline oxide semiconductor (CAAC-OS) film is preferably used as the oxide semiconductor film. The thickness of the oxide semiconductor film 106 is greater than or equal to 5 nm and less than or equal to 200 nm, preferably greater than or equal to 10 nm and less than or equal to 30 nm.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned with a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and layers each containing metal atoms and oxygen atoms overlap with each other. The direction of a normal vector of the layers is a c-axis direction. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since each of the c-axes of the crystal parts included in the CAAC-OS film are aligned with the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor including the CAAC-OS film, a change in electrical characteristics due to irradiation with visible light or ultraviolet light is small. Thus, the transistor has high reliability.

As illustrated in FIG. 1B, an end of the oxide semiconductor film 106 is preferably tapered at an angle of 20° to 50°. Note that a taper angle is a tilt angle formed by a side surface and the bottom surface of a film having a tapered shape (e.g., the oxide semiconductor film 106) in the case where the film is observed from the direction perpendicular to a cross section (the plane perpendicular to a surface of a substrate). When the oxide semiconductor film 106 has an end tapered at an angle of 20° to 50°, the generation of oxygen vacancies can be suppressed, and thus, generation of leakage current of the transistor 150 can be reduced.

As the base film 102, a single layer or a stack of an oxide film having crystallinity is used. The oxide film used as the base film 102 preferably contains indium (In) and zinc (Zn) which are constituent elements of the oxide semiconductor film 106 to reduce lattice mismatch with the oxide semiconductor film 106. It is preferable that one or more selected from zirconium (Zr), yttrium (Y), and cerium (Ce) be contained in addition to In and Zn. When these materials are contained, the conductivity of the base film 102 can be reduced and thus carriers flowing between the source electrode and the drain electrode are less likely to be adversely affected by the base film 102.

As an oxide material used for the base film 102, for example, an In—Zr—Zn-based oxide, an In—Y—Zn-based oxide, or an In—Ce—Zn-based oxide can be used.

In the case where a film generally used as an insulating film, such as an amorphous film of silicon oxide or the like, is used as the base film 102, an impurity which is an element inhibiting crystallization of the oxide semiconductor film, such as silicon, is taken into the oxide semiconductor film, particularly into the oxide semiconductor film in the vicinity of an interface with the film of silicon oxide; thus, part of the oxide semiconductor film is likely to be in an amorphous state. In contrast, as described in one embodiment of this specification, in the case where the oxide film having crystallinity, which contains a constituent element of the oxide semiconductor film, is used as the base film 102, the base film 102 does not contain an element inhibiting crystallization of the oxide semiconductor film or the concentration of the element is not enough to inhibit crystallization, so that a reduction in crystallinity of the oxide semiconductor film 106 due to entry of an impurity (also referred to as an element inhibiting crystallization) from the base film 102 can be suppressed. Thus, the oxide semiconductor film 106 can have crystallinity in a large region in the thickness direction from the vicinity of the interface with the base film 102.

Further, the above-described oxide film can be a film having crystallinity by performing heat treatment immediately after or after the formation of the oxide film. As a result, lattice mismatch between the base film 102 and the oxide semiconductor film 106 can be reduced and while depositing the oxide semiconductor film 106, crystal growth of the oxide semiconductor film 106, reflecting a state of crystals in the base film 102 (or using a crystal in the base film 102 as a seed crystal), occurs from the vicinity of the interface with the base film 102. Thus, the oxide semiconductor film 106 can have crystallinity in a large region in the thickness direction from the vicinity of the interface with the base film 102.

In addition, since the above-described oxide material includes a constituent element of the oxide semiconductor film 106, lattice mismatch with the oxide semiconductor film 106 is small. Thus, the interface state density at the interface between the base film 102 and the oxide semiconductor film 106 can be decreased. Accordingly, the transistor 150 having favorable electrical characteristics (e.g., small off-state current or a small variation in the threshold voltage) can be obtained.

In the case where the base film 102 has a stacked-layer structure, the oxide film having crystallinity may be formed over a film having a significant effect of preventing impurity diffusion, such as a silicon oxide film, a silicon oxynitride film, a silicon nitride oxide film, a silicon nitride film, an aluminum oxide film, an aluminum oxynitride film, an aluminum nitride oxide film, or an aluminum nitride film. Alternatively, the oxide film having crystallinity may be formed over a gallium oxide film, an yttrium oxide film, a lanthanum oxide film, or the like.

When the base film 102 has the above-described stacked-layer structure, an effect of preventing diffusion of impurities inside or on a surface of the substrate 100 into the oxide semiconductor film 106 is increased; thus, the deterioration of the electrical characteristics of the transistor 150 can be reduced. Accordingly, a semiconductor device including the transistor 150 as its component can be improved in performance such as operation characteristics.

Note that the details of the other components will be described in description of a method for manufacturing the transistor 150 below, with reference to FIGS. 2A to 2D and FIGS. 3A to 3D.

An insulating film or a planarizing insulating film may further be formed over the transistor 150.

An example of a manufacturing process of the transistor 150 illustrated in FIGS. 1A and 1B will be described below with reference to FIGS. 2A to 2D and FIGS. 3A to 3D.
<Manufacturing Process of Transistor 150>

An example of a manufacturing process of the transistor 150 illustrated in FIGS. 1A and 1B will be described with reference to FIGS. 2A to 2D and FIGS. 3A to 3D.

Figure 2A:
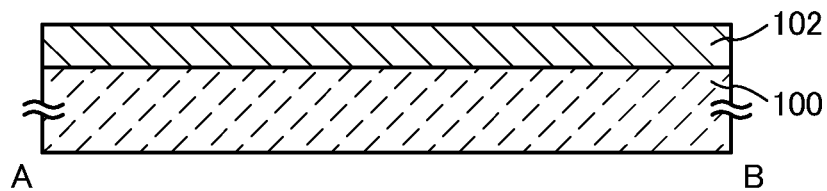
FIGS. 2A to 2D are cross-sectional views illustrating an example of a manufacturing process of a semiconductor device.

First, the substrate 100 is prepared, and the base film 102 is formed over the substrate 100 (see FIG. 2A).

There is no particular limitation on a substrate that can be used as the substrate 100 as long as it has heat resistance high enough to withstand heat treatment performed later. For example, a glass substrate of barium borosilicate glass, aluminoborosilicate glass, or the like, a ceramic substrate, a quartz substrate, a sapphire substrate, or the like can be used. Alternatively, a single crystal semiconductor substrate or a polycrystalline semiconductor substrate of silicon, silicon carbide, or the like, a compound semiconductor substrate of silicon germanium or the like, an SOI substrate, or the like can be used.

A flexible substrate may be used as the substrate 100. In the case of using a flexible substrate, a transistor including the oxide semiconductor film 106 may be directly formed on the flexible substrate, or a transistor including the oxide semiconductor film 106 may be formed over a different manufacturing substrate and then separated to be transferred to the flexible substrate. In order that the transistor be separated from the manufacturing substrate to be transferred to the flexible substrate, it is preferable to provide a separation layer between the manufacturing substrate and the transistor including the oxide semiconductor film 106.

Treatment for reducing impurities (e.g., hydrogen, moisture, or organic substances) adsorbed on the surface of the substrate 100 is preferably performed before the base film 102 is formed. When the substrate surface is sufficiently clean, the treatment for reducing impurities adsorbed on the substrate surface is not necessarily performed.

As a method for reducing impurities adsorbed on the substrate surface, for example, plasma treatment, heat treatment, or chemical treatment may be performed. Preferably, plasma treatment is performed. Specifically, plasma treatment can be performed on the substrate surface in such a manner that plasma is generated in an atmosphere containing a rare gas (e.g., helium, neon, argon, krypton, or xenon), oxygen, or nitrogen and bias voltage is applied to the substrate. After the treatment, it is preferable to form the base film 102 without exposure to the air because impurities can be prevented from being adsorbed on the surface of the substrate 100 owing to exposure to the air.

In addition, the substrate 100 is preferably subjected to heat treatment at a temperature lower than the strain point of the substrate 100 in advance to be shrunk (thermal shrinkage). As a result, the degree of shrinkage due to substrate heating in the manufacturing process of the transistor 150 can be reduced, so that mask misalignment in a light exposure step or the like can be suppressed, for example.

As described in "Example of Structure of Semiconductor Device", a film containing indium (In) and zinc (Zn) and further containing one or more selected from zirconium (Zr), yttrium (Y), and cerium (Ce) may be formed as the base film 102 by a sputtering method or the like. The film has enough crystallinity so that a crystal therein can function as a seed crystal of the oxide semiconductor film 106 formed in a later step. The crystal structure of the base film 102 which satisfies the above conditions will be described together with the deposition conditions, in Example 1.

Since the base film 102 includes a constituent element of the oxide semiconductor film 106, lattice mismatch with the oxide semiconductor film 106 is small. Thus, the interface state density at the interface between the base film 102 and the oxide semiconductor film 106 can be decreased.

The base film 102 is preferably formed using an oxide insulating film. When the base film 102 is formed using an oxide insulating film, oxygen can be released by heating the base film 102 after the oxide semiconductor film 106 is formed in the later step; thus, excessive oxygen in the base film 102 can be supplied to the oxide semiconductor film 106. In particular, the base film 102 preferably contains a large amount of oxygen which exceeds at least the amount in the stoichiometric ratio in (a bulk of) the base film 102. Oxygen vacancy in the oxide semiconductor film partly generates a carrier, which can cause a variation in the threshold voltage of the transistor. However, when oxygen vacancy in the oxide semiconductor film 106 is repaired by oxygen supplied from the base film 102, the transistor 150 including the oxide semiconductor film can have favorable electrical characteristics. In order that the base film 102 be an insulating film containing a large amount of oxygen which exceeds at least the amount in the stoichiometric ratio as described above, the base film 102 is preferably formed by a sputtering method.

To release oxygen by heat treatment means that the amount of released oxygen molecules is greater than or equal to $1.0 \times 10^{18}$ molecules/cm$^3$, preferably greater than or equal to $3.0 \times 10^{19}$ molecules/cm$^3$, more preferably $1.0 \times 10^{20}$ molecules/cm$^3$ in thermal desorption spectroscopy (TDS).

Alternatively, for example, the following method may be employed to form the base film 102 containing a large amount of oxygen which exceeds the amount in the stoichiometric ratio: the substrate over which the base film 102 is formed is introduced into a heating apparatus (for example, a rapid thermal anneal (RTA) apparatus such as a gas rapid thermal anneal (GRTA) apparatus or a lamp rapid thermal anneal (LRTA) apparatus can be used) and subjected to heat treatment in a high-purity oxygen gas, a high-purity dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system). It is preferable that the oxygen gas or the dinitrogen monoxide gas do not contain water, hydrogen, and the like. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). Note that the pressure in the apparatus is set to be high in the heat treatment, whereby oxygen can be efficiently added to the base film 102.

Still alternatively, for example, the following method may be employed to form the base film 102 containing a large amount of oxygen which exceeds the amount in the stoichiometric ratio: oxygen (including at least one of an oxygen radical, an oxygen atom, and an oxygen ion) is added to the base film 102 by an ion implantation method, an ion doping method, a plasma immersion ion implantation method, plasma treatment, or the like.

A surface of the base film 102 preferably has high planarity. Specifically, the base film 102 preferably has an average surface roughness ($R_a$) of 1 nm or less, further preferably 0.3 nm or less, still further preferably 0.1 nm or less. To increase the surface planarity of the base film 102, planarization treatment such as chemical mechanical polishing (CMP) treatment can be performed, for example. When the surface planarity of the base film 102 is increased, the state of the interface between the base film 102 and the oxide semiconductor film 106 can be improved, whereby a variation in electrical characteristics of the transistor 150 can be reduced.

The base film 102 may have a stacked-layer structure as described in "Example of Structure of Semiconductor Device". When the base film 102 has such a stacked-layer structure, the effect of preventing the diffusion of impurities (e.g., metal elements such as aluminum, magnesium, strontium, and boron; hydrogen; or water) from the substrate 100 into the oxide semiconductor film is increased. As a result, an effect of preventing the deterioration of the electrical characteristics of the transistor (e.g., a normally-on state of the transistor (a negative shift of the threshold voltage), a variation in threshold voltage, or a decrease in field-effect mobility) is further increased.

Further, in order that hydrogen or water be contained in the oxide semiconductor film 106 as little as possible at the time of forming the oxide semiconductor film 106 over the base film 102 in a later step, it is preferable that the substrate provided with the base film 102 be preheated in a preheating chamber of a sputtering apparatus as pretreatment for a film formation step of the oxide semiconductor film 106 to eliminate impurities such as hydrogen or moisture which are adsorbed to the substrate 100 and the base film 102, and evacuate the preheating chamber. Here, the heat treatment may be performed at a temperature higher than or equal to 100° C. and lower than or equal to 450° C., for example. Evacuation of the deposition chamber is preferably performed with a rough vacuum pump such as a dry pump, and a high vacuum pump such as a sputter ion pump, a turbo molecular pump, or a cryopump, in appropriate combination. The turbo molecular pump has an outstanding capability in evacuating a large-sized molecule, whereas it has a low capability in evacuating hydrogen or moisture. Further, combination with a cryopump having a high capability in evacuating moisture or a sputter ion pump having a high capability in evacuating hydrogen is effective. At this time, when impurities are removed while an inert gas is introduced, the rate of elimination of moisture or the like, which is difficult to eliminate only by evacuation, can be further increased.

Note that before the formation of the oxide semiconductor film 106, treatment (also referred to as reverse sputtering treatment) in which an argon gas is introduced and plasma is generated to remove powdery substances (also referred to as particles or dust) or an organic substance attached on the surface of the base film 102 is preferably performed. Note that a gas of nitrogen, helium, oxygen, or the like may be used instead of an argon gas.

Figure 2B:
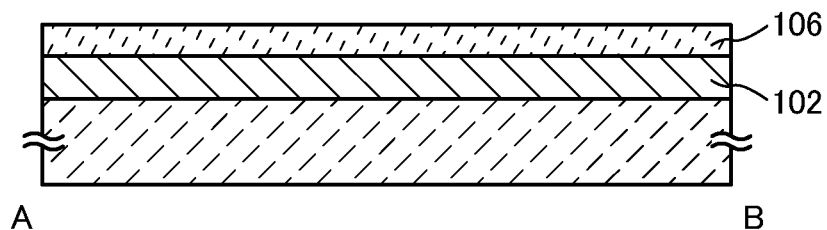

Then, the oxide semiconductor film 106 is formed by a sputtering method over the base film 102 (see FIG. 2B). The thickness of the oxide semiconductor film 106 is preferably greater than or equal to 1 nm and less than or equal to 200 nm, further preferably greater than or equal to 1 nm and less than or equal to 30 nm, still further preferably greater than or equal to 1 nm and less than or equal to 10 nm. When the oxide semiconductor film 106 has a thickness in the above range, a short-channel effect of the transistor 150 can be suppressed. Note that the base film 102 and the oxide semiconductor film 106 are preferably formed successively without exposure to the air.

In this embodiment, the oxide semiconductor film 106 is formed using an In—Ga—Zn-based oxide target by a sputtering method. The oxide semiconductor film 106 can be formed by a sputtering method in a rare gas (typically, argon) atmosphere, an oxygen atmosphere, or a mixed atmosphere of a rare gas and oxygen.

As a target used for forming an In—Ga—Zn—O film as the oxide semiconductor film 106 by a sputtering method, for example, an oxide target with an atomic ratio where In:Ga:Zn=1:1:1, an oxide target with an atomic ratio where In:Ga:Zn=3:1:2, an oxide target with an atomic ratio where In:Ga:Zn=2:1:3, or an oxide target with an atomic ratio where In:Ga:Zn=1:3:2 can be used. However, a material and composition of a target used for the formation of the oxide semiconductor film 106 are not limited to the above.

The relative density of the oxide target is greater than or equal to 90% and less than or equal to 100%, preferably greater than or equal to 95% and less than or equal to 99.9%. By using the oxide target with high relative density, the oxide semiconductor film 106 can be a dense film.

It is preferable that a high-purity gas from which impurities such as hydrogen, water, a hydroxyl group, or hydride are removed be used as a sputtering gas used for the formation of the oxide semiconductor film 106.

When the oxide semiconductor film 106 contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film 106 is preferably lower than $5\times10^{18}$ atoms/cm$^3$, further preferably lower than or equal to $1\times10^{18}$ atoms/cm$^3$, still further preferably lower than or equal to $5\times10^{17}$ atoms/cm$^3$, yet still further preferably lower than or equal to $1\times10^{16}$ atoms/cm$^3$.

Note that the concentration of hydrogen in the oxide semiconductor film is measured by secondary ion mass spectrometry (SIMS).

For example, it is preferable to use a deposition gas having a purity greater than or equal to 6N, preferably greater than or equal to 7N (i.e., the impurity concentration in the gas is less than or equal to 1 ppm, preferably less than or equal to 0.1 ppm).

To remove moisture (including water, water vapor, hydrogen, a hydroxyl group, or hydroxide) in a deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water ($H_2O$) (preferably, also a compound containing a carbon atom), and the like are removed, whereby the concentration of impurities such as hydrogen or moisture in the oxide semiconductor film formed in the deposition chamber can be reduced.

In addition, it is preferable that the oxide semiconductor film contain nitrogen as little as possible. This is because, similarly to the case where hydrogen is contained, when nitrogen is bonded to the oxide semiconductor, part of the nitrogen serves as a donor and causes generation of an electron which is a carrier. Thus, an oxide semiconductor film in which the peak of the amount of ammonia molecules released from the film is less than or equal to $5.0 \times 10^{21}$ molecules/cm$^3$, preferably less than or equal to $1.0 \times 10^{21}$ molecules/cm$^3$, further preferably less than or equal to $8.0 \times 10^{21}$ molecules/cm$^3$ is preferably used. The peak of the amount of ammonia molecules released from the film is obtained by TDS measurement performed after the film is heated.

When the oxide semiconductor film 106 contains an alkali metal or an alkaline earth metal, the alkali metal or the alkaline earth metal and an oxide semiconductor are bonded to each other, so that carriers are generated in some cases, which causes an increase in the off-state current of the transistor. Accordingly, it is preferable that the concentration of an alkali metal or an alkaline earth metal in the oxide semiconductor film 106 be lower than or equal to $1 \times 10^{18}$ atoms/cm$^3$, preferably lower than or equal to $2 \times 10^{16}$ atoms/cm$^3$.

There are two methods for forming a CAAC-OS film when the CAAC-OS film is used as the oxide semiconductor film 106. One of the methods is to form an oxide semiconductor film at a temperature higher than or equal to 200° C. and lower than or equal to 450° C. to form, in the oxide semiconductor film, crystal parts in each of which the c-axis is aligned with the direction parallel to a normal vector of a surface where the oxide semiconductor film is formed or a normal vector of a surface of the oxide semiconductor film. The other method is to form an oxide semiconductor film with a small thickness and then heat it at a temperature higher than or equal to 200° C. and lower than or equal to 700° C., to form, in the oxide semiconductor film, crystal parts in each of which the c-axis is aligned with the direction parallel to a normal vector of a surface where the oxide semiconductor film is formed or a normal vector of a surface of the oxide semiconductor film.

The oxide semiconductor film 106 having crystallinity reflecting the crystallinity of a base (in this embodiment, the base film 102 corresponds to the base) is deposited. Thus, in the case where an amorphous film of silicon oxide or the like is used as the base, for example, the oxide semiconductor film 106 is likely to be in an amorphous state in the vicinity of the interface with the base film 102.

In contrast, as described in one embodiment of this specification, in the case where an oxide film having crystallinity is used as the base film 102, crystal growth of the oxide semiconductor film 106, reflecting the state of crystals in the base film 102 (or using a crystal in the base film 102 as a seed crystal), occurs from the vicinity of the interface with the base film 102 while depositing the oxide semiconductor film 106, because lattice mismatch between the oxide semiconductor film 106 and the base film 102 is small. Thus, the oxide semiconductor film 106 can be a CAAC-OS film having crystallinity in a large region in the thickness direction from the vicinity of the interface with the base film 102.

Note that in the case where the oxide semiconductor film 106 is formed by a sputtering method, when a constituent element of the oxide semiconductor film 106 or the like having high energy collides with the base film 102, a bond of constituent elements of the base film 102 is cut and as a result, the element whose bond is cut enters the oxide semiconductor film 106 (this phenomenon is called a mixing phenomenon or a mixing effect). In particular, the phenomenon significantly occurs in the oxide semiconductor film 106 in the vicinity of the interface with the base film 102.

In the case where a film generally used as an insulating film, such as an amorphous film of silicon oxide or the like, is used as the base film 102 and the mixing phenomenon occurs, an impurity which is an element inhibiting crystallization of the oxide semiconductor film, such as silicon, is taken into the oxide semiconductor film, particularly into the oxide semiconductor film in the vicinity of an interface with the film of silicon oxide; thus, part of the oxide semiconductor film becomes in an amorphous state, which leads to an adverse effect on the electrical characteristics of the transistor (e.g., off-state current or a variation in the threshold voltage). In contrast, as described in one embodiment of this specification, in the case where the oxide film with crystallinity, which contains a constituent element of the oxide semiconductor film, is used as the base film 102, the base film 102 does not contain an element inhibiting crystallization of the oxide semiconductor film or the concentration of the element is not enough to inhibit crystallization. For this reason, a reduction in crystallinity of the oxide semiconductor film 106 due to the entry of an impurity (also referred to as an element inhibiting crystallization) from the base film 102 can be suppressed even if the mixing phenomenon occurs. Thus, a variation in electrical characteristics of the transistor can be suppressed.

By heating the substrate 100 during film formation, the concentration of impurities such as hydrogen or water in the formed oxide semiconductor film 106 can be reduced (this can be also referred to as dehydration treatment or dehydrogenation treatment). In addition, damage by sputtering can be reduced, which is preferable.

Note that when a crystalline (single-crystal or polycrystalline) oxide semiconductor film other than a CAAC-OS film is formed as the oxide semiconductor film 106, the film formation temperature is not particularly limited. Also in the case where a crystalline oxide semiconductor film other than a CAAC-OS film is formed, when an oxide film having crystallinity is used as the base film 102, crystal growth of the oxide semiconductor film 106, reflecting the state of crystals in the base film 102, occurs from the vicinity of the interface with the base film 102 while depositing the oxide semiconductor film, so that the oxide semiconductor film 106 can have crystallinity in a large region in the thickness direction from the vicinity of the interface with the base film 102.

After the formation of the oxide semiconductor film 106, heat treatment may be performed on the oxide semiconductor film 106. The temperature of the heat treatment is higher than or equal to 300° C. and lower than or equal to 700° C., or lower than the strain point of the substrate. The heat treatment is performed, whereby excess hydrogen (including water and a hydroxyl group) can be removed.

The heat treatment can be performed in such a manner that, for example, an object to be processed is introduced into an electric furnace in which a resistance heater or the like is used and heated at 450° C. in a nitrogen atmosphere for one hour. During the heat treatment, the oxide semiconductor film 106 is not exposed to air to prevent entry of water and hydrogen.

The heat treatment apparatus is not limited to the electric furnace and may be an apparatus for heating an object to be processed by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, GRTA process may be performed as follows. The object to be processed is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object to be processed. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

The dehydration or dehydrogenation treatment may be accompanied by elimination of oxygen which is a main component material for an oxide semiconductor film to lead to a reduction in oxygen. An oxygen vacancy exists in a portion where oxygen is eliminated in an oxide semiconductor film, and a donor level which leads to a change in electrical characteristics of a transistor is formed owing to the oxygen vacancy. Thus, in the case where the dehydration or dehydrogenation treatment is performed, oxygen is preferably supplied to the oxide semiconductor film 106. By supply of oxygen to the oxide semiconductor film 106, an oxygen vacancy in the film can be repaired.

The oxygen vacancy in the oxide semiconductor film 106 may be repaired in the following manner, for example: after the oxide semiconductor film 106 is subjected to the dehydration treatment (dehydrogenation treatment), a high-purity oxygen gas, a high-purity dinitrogen monoxide gas, a high-purity nitrous oxide gas, or ultra dry air (the moisture amount is less than or equal to 20 ppm (−55° C. by conversion into a dew point), preferably less than or equal to 1 ppm, more preferably less than or equal to 10 ppb, in the measurement with the use of a dew-point instrument of a cavity ring down laser spectroscopy (CRDS) system) may be introduced into the same furnace. It is preferable that the oxygen gas or the dinitrogen monoxide gas do not contain water, hydrogen, and the like. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). Note that the pressure in the apparatus is set to be high in the heat treatment, whereby oxygen can be efficiently added to the oxide semiconductor film 106.

Alternatively, the oxygen vacancy in the oxide semiconductor film 106 can be repaired in the following manner, for example: oxygen (including at least one of an oxygen radical, an oxygen atom, and an oxygen ion) is added to the oxide semiconductor film 106 by an ion implantation method, an ion doping method, a plasma immersion ion implantation method, plasma treatment, or the like.

As described above, the deposited oxide semiconductor film 106 is subjected to the dehydration treatment (dehydrogenation treatment), whereby hydrogen or moisture is removed from the oxide semiconductor film so that the oxide semiconductor film is purified so as to contain impurities as little as possible. Then, oxygen that is a main component material of the oxide semiconductor film, which is reduced through the dehydration treatment (dehydrogenation treatment), is supplied (also referred to as peroxide treatment), whereby the oxygen vacancy can be repaired. In this manner, the oxide semiconductor film 106 can be made to be an i-type (intrinsic) semiconductor film or a semiconductor extremely close to an i-type semiconductor film. Accordingly, the Fermi level (Ef) of the oxide semiconductor film can be changed to the same level as the intrinsic Fermi level (Ei). Thus, by using the oxide semiconductor film, a variation in the threshold voltage $V_{th}$ of the transistor and the like can be reduced.

It is preferable that the oxide semiconductor film 106 be subjected to dehydration treatment (dehydrogenation treatment) before a step of supplying oxygen to the oxide semiconductor film 106.

Note that in the above description, the dehydrogenation treatment and the peroxide treatment are performed before processing of the oxide semiconductor film 106 into an island shape; however, one embodiment of the disclosed invention is not construed as being limited thereto. The treatment may be performed after processing of the oxide semiconductor film 106 into an island shape.

Figure 2C:
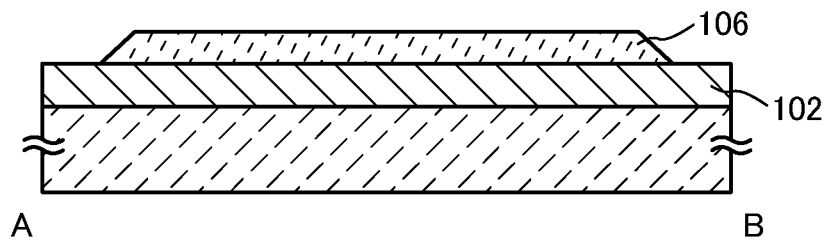

Next, the oxide semiconductor film 106 is processed into the island-shaped oxide semiconductor film 106 by a photolithography process (see FIG. 2C). A resist mask which is used for the formation of the island-shaped oxide semiconductor film 106 may be formed by an ink-jet method. Formation of the resist mask by an ink-jet method needs no photomask; thus, manufacturing cost can be reduced. Note that the oxide semiconductor film 106 may be etched by either dry etching or wet etching, or by both dry etching and wet etching.

Here, as illustrated in FIG. 2C, the end of the oxide semiconductor film 106 is preferably tapered at an angle of 20° to 50°. When the oxide semiconductor film 106 has a tapered end, generation of oxygen vacancies can be suppressed, and thus, generation of leakage current of the transistor 150 can be reduced.

Figure 2D:
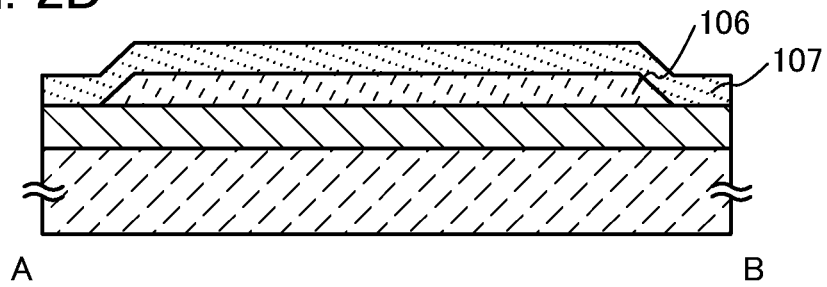

Then, an insulating film 107 for forming the gate insulating film 108 is formed over the oxide semiconductor film 106 (see FIG. 2D). Here, the thickness of the insulating film 107 can be, for example, greater than or equal to 1 nm and less than or equal to 50 nm, for example. The insulating film 107 can be formed by, for example, a sputtering method, an MBE method, a CVD method, a pulse laser deposition method, an ALD method, or the like as appropriate.

An oxide insulating film having a sufficient withstand voltage and a sufficient insulating property is preferably used as the insulating film 107. For example, the insulating film 107 can be formed by a CVD method, a sputtering method, or the like to have a single-layer structure or a stacked-layer structure of any of a silicon oxide film, a silicon oxynitride film, a silicon nitride film, a silicon nitride oxide film, an aluminum oxide film, an aluminum nitride film, an aluminum oxynitride film, an aluminum nitride oxide film, a gallium oxide film, an yttrium oxide film, a lanthanum oxide film, and the like. Alternatively a film of a high-k material, such as a hafnium oxide film, a hafnium silicate film (HfSi$_x$O$_y$ (x>0, y>0)), a hafnium silicate film to which nitrogen is added (HfSiO$_x$N$_y$ (x>0, y>0)), or a hafnium aluminate film (HfAl$_x$O$_y$ (x>0, y>0)) may be used as at least part of the insulating film 107. Accordingly, gate leakage current can be reduced.

With the use of the oxide insulating film as the insulating film 107, part of oxygen in the oxide insulating film can be released by heat treatment and supplied to the oxide semiconductor film 106 in a manner similar to that of the base film 102. Thus, an oxygen vacancy in the oxide semiconductor film 106 can be repaired. For the details of the treatment, the description of the base film 102 may be referred to. There is no particular limitation on the timing when the heat treatment is performed on the insulating film 107 as long as it is performed after the formation of the insulating film 107.

In particular, the insulating film 107 preferably contains a large amount of oxygen which exceeds at least the amount in the stoichiometric ratio in (a bulk of) the insulating film 107. For example, a film of silicon oxide represented by SiO$_{2+\alpha}$ ($\alpha$>0) is preferably used as the insulating film 107. When such a silicon oxide film is used as the insulating film 107, oxygen can be supplied to the oxide semiconductor film 106, so that the transistor 150 including the oxide semiconductor film 106 can have favorable transistor characteristics.

Thus, in the case where the insulating film 107 has a stacked-layer structure, it is preferable that a gallium oxide film, an aluminum oxide film, an aluminum oxynitride film, an aluminum nitride oxide film, a silicon nitride film, a silicon oxynitride film, a silicon nitride oxide film, an yttrium oxide film, a lanthanum oxide film, or the like be stacked over a silicon oxide film. Alternatively a film of a high-k material, such as a hafnium oxide film, a hafnium silicate film (HfSi$_x$O$_y$ (x>0, y>0)), a hafnium silicate film to which nitrogen is added (HfSiO$_x$N$_y$ (x>0, y>0)), or a hafnium aluminate film (HfAl$_x$O$_y$ (x>0, y>0)) may be stacked over a silicon oxide film. The use of such a high-k material for at least part of the insulating film 107 enables a reduction in gate leakage current.

When the oxide insulating film is used as the insulating film 107, oxygen can be released by heating the oxide insulating film, so that oxygen can be supplied to the oxide semiconductor film 106. Thus, an oxygen vacancy in the oxide semiconductor film 106 can be repaired. In particular, the insulating film 107 preferably contains a large amount of oxygen which exceeds at least the amount in the stoichiometric ratio in (a bulk of) the insulating film 107. For example, a film of silicon oxide represented by SiO$_{2+\alpha}$ ($\alpha$>0) is preferably used as the insulating film 107. When such a silicon oxide film is used as the insulating film 107, oxygen can be supplied to the oxide semiconductor film 106, so that the transistor 150 including the oxide semiconductor film 106 can have favorable transistor characteristics.

In order that the insulating film 107 be an insulating film containing a large amount of oxygen which exceeds at least the amount in the stoichiometric ratio, the insulating film 107 is preferably formed by a sputtering method. In the case where a sputtering method is used, impurities such as hydrogen or moisture in a deposition apparatus are removed as much as possible by the method in which the high-purity gas is used, the method in which the deposition apparatus is baked and the impurities are removed with the use of the evacuation apparatus, the method in which the substrate is preheated, or the like as described above. Thus, the concentration of hydrogen and moisture in the insulating film 107 can be low. Also in terms of the above, it is preferable that the insulating film 107 be formed by a sputtering method.

Figure 3A:
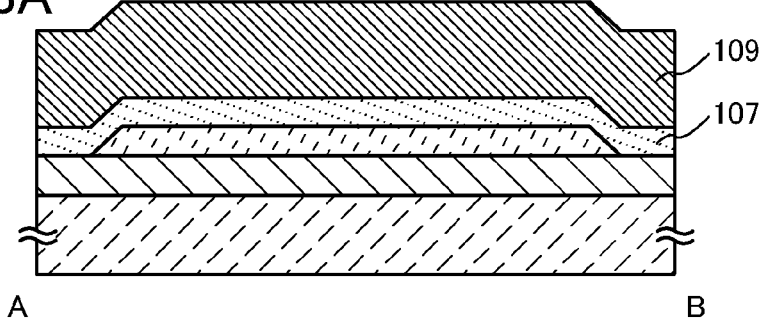
FIGS. 3A to 3D are cross-sectional views illustrating an example of a manufacturing process of a semiconductor device.

Next, a conductive film 109 for forming the gate electrode 110 (including wirings formed in the same layer as the gate electrode) is formed over the insulating film 107 (see FIG. 3A). The conductive film 109 can be formed using, for example, a metal material such as molybdenum, titanium, tantalum, tungsten, aluminum, copper, neodymium, or scandium, or an alloy material including any of these materials as a main component. Alternatively, the conductive film used for the gate electrode may be formed using a conductive metal oxide. As the conductive metal oxide, an indium oxide (In$_2$O$_3$), a tin oxide (SnO$_2$), a zinc oxide (ZnO), an indium tin oxide (In$_2$O$_3$—SnO$_2$, which is abbreviated to ITO in some cases), an indium zinc oxide (In$_2$O$_3$—ZnO), or any of these metal oxide materials in which silicon or a silicon oxide is included can be used. The gate electrode can be formed to have a single-layer structure or a stacked-layer structure using any of the above materials. There is no particular limitation on the method for forming the conductive film, and a variety of film formation methods such as an evaporation method, a CVD method, a sputtering method, or a spin coating method can be employed.

As one layer of the conductive film 109 which is in contact with the insulating film 107, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the conductive film 109, so that a "normally-off switching element" can be obtained.

Figure 3B:
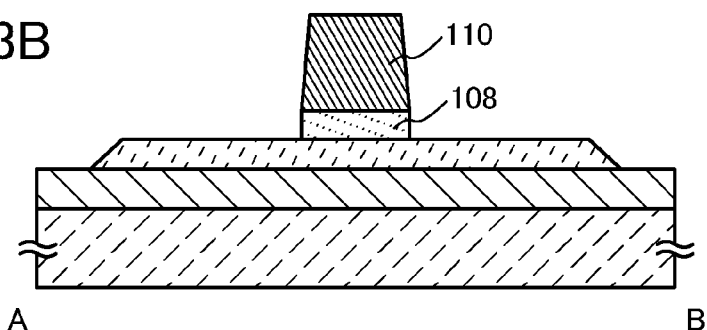
Figure 3C:
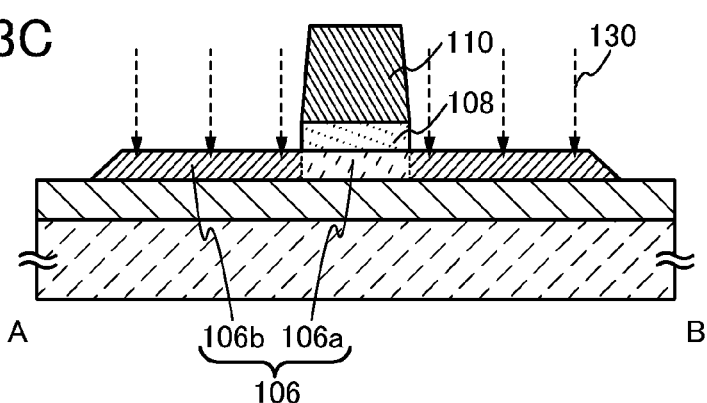

Then, by a photolithography process, a resist mask is formed over the conductive film 109, and etching is selectively performed, so that the gate electrode 110 and the gate insulating film 108 are formed; after that, the resist mask is removed (see FIG. 3B). Note that the resist mask which is used for the formation of the gate electrode 110 and the gate insulating film 108 may be formed by an ink-jet method. Formation of the resist mask by an ink-jet method needs no photomask; thus, manufacturing cost can be reduced. Note that the gate electrode 110 and the gate insulating film 108 may be etched by either dry etching or wet etching, or by both dry etching and wet etching.

Next, by an ion doping method or an ion implantation method, an impurity ion 130 by which the conductivity of the oxide semiconductor film 106 is changed is added to the oxide semiconductor film 106. At this time, the gate electrode 110 and the gate insulating film 108 function as a mask, whereby a high-resistance region 106a (which functions as a channel formation region) and a low-resistance region 106b are formed in a self-aligned manner in the oxide semiconductor film 106 (see FIG. 3C). One or more selected from the following can be used as the impurity ion 130: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (CO, titanium (Ti), and zinc (Zn). Note that because an ion implantation method uses a mass separator with which only necessary ion is extracted, only the impurity ion 130 can be selectively added to an object by an ion implantation method. An ion implantation method is thus preferably employed, in which case entry of impurities (e.g., hydrogen) into the oxide semiconductor film 106 is reduced as compared with the case where the ion is added by an ion doping method. Note that the use of an ion doping method is not excluded.

Next, a conductive film which to be used as a source electrode and a drain electrode (including wirings formed in the same layer as the source electrode and the drain electrode) is formed over the oxide semiconductor film 106. As the conductive film to be used as the source electrode and the drain electrode, for example, a metal film containing an element selected from aluminum, chromium, copper, tantalum, titanium, molybdenum, or tungsten, or a metal nitride film containing any of the above elements as its component (a titanium nitride film, a molybdenum nitride film, or a tungsten nitride film) can be used. Alternatively, the conductive film may have a structure in which a film of a high-melting-point metal such as titanium, molybdenum, or tungsten, or a metal nitride film of any of these metals (a titanium nitride film, a molybdenum nitride film, or a tungsten nitride film) is stacked on either or both of the bottom surface and the top surface of a metal film of aluminum, copper, or the like. Further alternatively, the conductive film to be used as the source electrode and the drain electrode may be formed using a conductive metal oxide. As the conductive metal oxide, an indium oxide ($In_2O_3$), a tin oxide ($SnO_2$), a zinc oxide (ZnO), an indium tin oxide ($In_2O_3$—$SnO_2$, which is abbreviated to ITO), or an indium zinc oxide ($In_2O_3$—ZnO) can be used. The conductive film to be used as the source electrode and the drain electrode can be formed to have a single-layer structure or a stacked-layer structure using any of the above-described materials. There is no particular limitation on the method for forming the conductive film, and a variety of film formation methods such as an evaporation method, a CVD method, a sputtering method, or a spin coating method can be employed.

Then, by a photolithography process, a resist mask is formed over the conductive film, and selective etching is performed, so that the source electrode 114a and the drain electrode 114b are formed; after that, the resist mask is removed. Thus, the transistor 150 is manufactured (see FIG. 3D). For the light exposure for forming the resist mask in the photolithography process, ultraviolet light, KrF laser, or ArF laser is preferably used. Thus, in the case where the channel length L (shown by an arrow Z in FIG. 3D) is less than 25 nm, the light exposure at the time of forming the resist mask in the photolithography process is preferably performed using, for example, extreme ultraviolet light having an extremely short wavelength of several nanometers to several tens of nanometers. In the light exposure by extreme ultraviolet light, the resolution is high and the focus depth is large. Thus, the channel length L of the transistor formed later can be reduced, whereby the operation speed of a circuit can be increased.

Figure 3D:
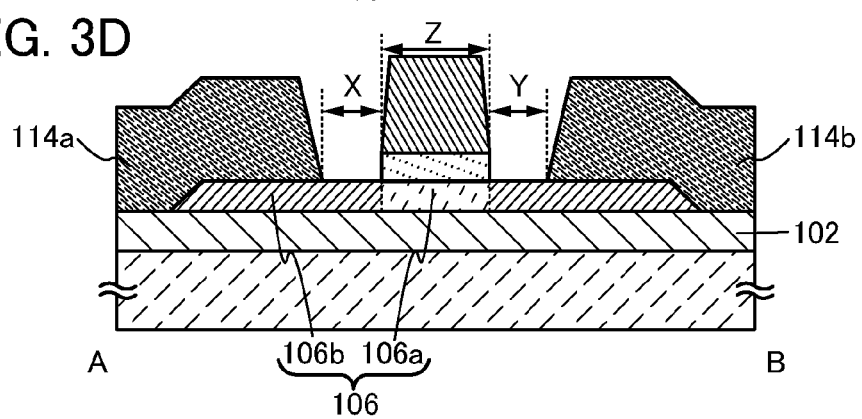

Note that for controlling a decrease in on-state current of the transistor 150, the following distances are preferably as short as possible: a distance between one end of a portion where the oxide semiconductor film 106 overlaps with the gate electrode 110, and an end of a portion where the oxide semiconductor film 106 is in contact with the source electrode 114a, which is closest to the gate electrode (shown by an arrow X in FIG. 3D, which is referred to as an "Loff width" in this specification); and a distance between the other end of the portion where the oxide semiconductor film 106 overlaps with the gate electrode 110, and an end of a portion where the oxide semiconductor film 106 is in contact with the drain electrode 114b, which is closest to the gate electrode (shown by an arrow Y in FIG. 3D, which is also referred to as an "Loff width" in this specification). In the case where micro exposure beyond the performance limit of a light exposure apparatus is performed, different photomasks may be used in formation of the source electrode 114a and the drain electrode 114b to shorten the distances shown by the arrows X and Y in FIG. 3D, for example. Thus, at the time of the light exposure, alignment can be performed such that only one of the source electrode 114a and the drain electrode 114b is as close to the gate electrode 110 as possible, and accordingly, a narrow Loff width can be obtained.

Further, for reducing manufacturing time and manufacturing cost of the transistor 150, the number of photomasks and the number of steps in a photolithography process are preferably reduced. In order that the number of masks and the number of steps are reduced, an etching step may be performed with the use of a multi-tone mask which is a light-exposure mask through which light is transmitted to have a plurality of intensities for example. A resist mask formed with the use of a multi-tone mask has a plurality of thicknesses and further can be changed in shape by etching; thus, the resist mask can be used in a plurality of etching steps for processing into different patterns. Thus, a resist mask corresponding to at least two kinds or more of different patterns can be formed by one multi-tone mask. Thus, the number of light-exposure masks can be reduced and the number of steps in a corresponding photolithography process can be also reduced, whereby simplification of a process can be realized.

It is preferable that etching conditions be optimized so as not to etch and divide the oxide semiconductor film 106 when the conductive film is etched. However, it is difficult to obtain etching conditions in which only the conductive film is etched and the oxide semiconductor film 106 is not etched at all. In some cases, only part of the oxide semiconductor film 106, e.g., 5% to 50% both inclusive, in thickness of the oxide semiconductor film 106 is etched when the conductive film is etched, whereby the oxide semiconductor film 106 having a groove portion (a recessed portion) is formed.

In the case where the conductive film to be used as the source electrode and the drain electrode (including wirings formed in the same layer as the source electrode and the drain electrode) is formed using an oxide semiconductor material, it is necessary for the conductive film to be formed using an oxide semiconductor material which is less etched than the oxide semiconductor film 106 in order that the oxide semiconductor film 106 be etched as little as possible when the conductive film is etched to form the source electrode 114a and the drain electrode 114b.

When an oxide semiconductor material is used for the source electrode 114a and the drain electrode 114b, an interface between the oxide semiconductor film 106 and each of the source electrode 114a and the drain electrode 114b might be unclear depending on a material and a film-formation condition of the oxide semiconductor film 106. In the case where the interface is unclear, a portion which can be referred to as mixture regions or mixture layers of the oxide semiconductor film 106 and each of the source electrode 114a and the drain electrode 114b might be formed.

The conductive film to be used as the source electrode 114a and the drain electrode 114b can also be formed using a conductive material or a semiconductor material whose resistance is reduced by introduction of an impurity ion.

Through the above-described steps, the transistor 150 illustrated in FIG. 1B is manufactured.

An insulating film may be formed over the transistor 150. The insulating film can be formed using the same material and the same film formation method as the gate insulating film 108; thus, for the insulating film, the above description of the gate insulating film 108 can be referred to. Note that an aluminum oxide film is highly effective in suppressing entry of impurities such as moisture and hydrogen from outside. Thus, it is preferable to use, as the insulating film, an aluminum oxide film or a stacked-layer film including an aluminum oxide film. It is more preferable to use an aluminum oxide film having a film density of 3.2 g/cm$^3$ or higher, preferably 3.6 g/cm$^3$ or higher. Thus, it is possible to suppress entry of impurities such as moisture and hydrogen into the oxide semiconductor film 106.

A planarizing insulating film may be formed over the transistor 150. The planarizing insulating film may be formed in such a manner that a material having an insulating property is applied by a spin coating method, a printing method, a dispensing method, an ink-jet method, or the like, and cure treatment (e.g., heat treatment or light irradiation treatment) is performed depending on the applied material. As the material having an insulating property, for example, an organic resin such as an acrylic resin, a polyimide resin, a polyamide resin, a polyamide-imide resin, or an epoxy resin can be used. It is also possible to use a low-dielectric constant material (low-k material), a siloxane-based resin, phosphosilicate glass (PSG), borophosphosilicate glass (BPSG), or the like. Note that the planarizing insulating film may be formed by stacking a plurality of insulating films formed of any of these materials. Note that the planarizing insulating film contains comparatively much impurity such as moisture; thus, the planarizing insulating film is preferably formed over the above-described insulating film (e.g., an aluminum oxide or a stacked-layer film containing an aluminum oxide).

According to one embodiment of the disclosed invention, the amount of impurities contained in the portion of the oxide semiconductor film in the vicinity of the interface with the insulating film can be reduced in the semiconductor device including the oxide semiconductor in the above manner. Accordingly, even the deterioration of the electrical characteristics of the transistor including an extremely thin oxide semiconductor film, such as a reduction in on-state current of the transistor 150 due to an adverse effect of the high-resistance region 106a on the formation of a channel can be suppressed. Thus, a semiconductor device including the transistor 150 as its component can be improved in performance such as operation characteristics.

The structures, methods, and the like described in this embodiment can be combined as appropriate with any of the structures, methods, and the like described in the other embodiments.

Embodiment 2

In this embodiment, one embodiment of a semiconductor device having a structure different from that in Embodiment 1 and a method for manufacturing the semiconductor device will be described with reference to FIGS. 4A and 4B and FIGS. 5A to 5E.

<Example of Structure of Semiconductor Device>

Figure 4A:
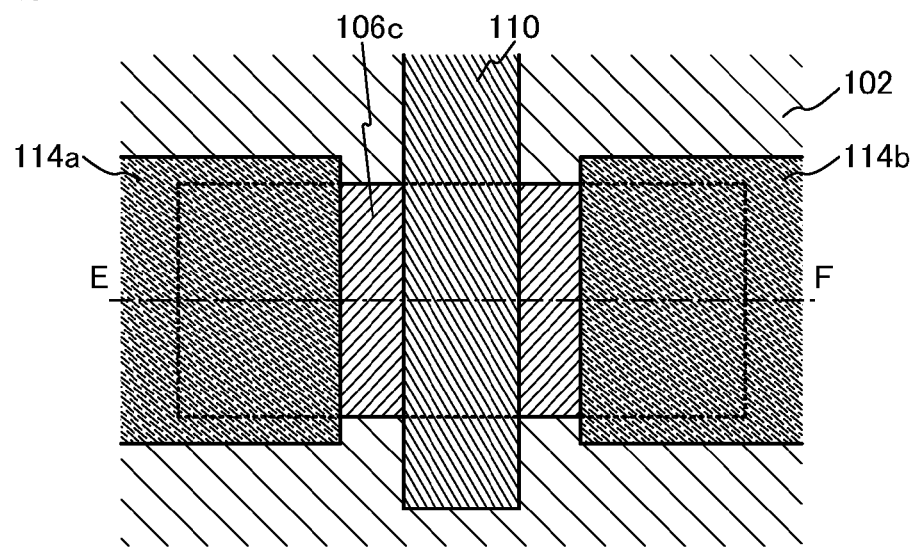
FIGS. 4A and 4B are a plan view and a cross-sectional view illustrating one embodiment of a semiconductor device.
Figure 4B:
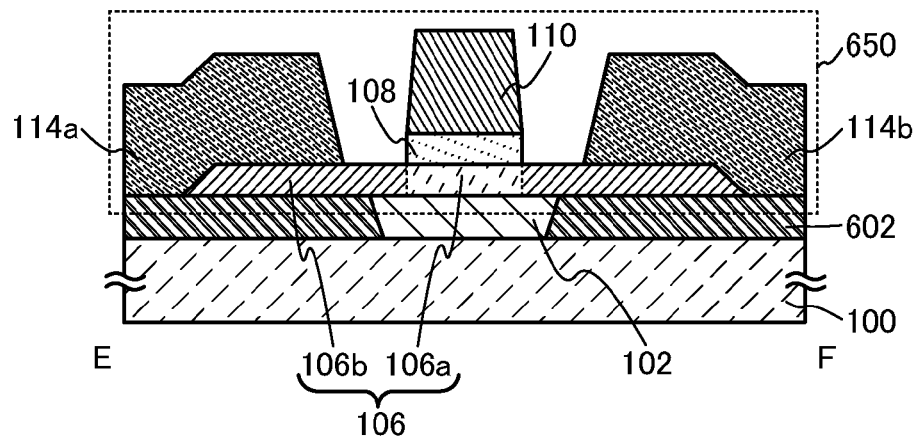

FIGS. 4A and 4B illustrate an example of a plan view and a cross-sectional view of a transistor having a top-gate structure, as an example of a semiconductor device. FIG. 4A is a plan view, and FIG. 4B is a cross-sectional view taken along line E-F in FIG. 4A. Note that in FIG. 4A, some components (e.g., the substrate 100) of a transistor 650 are omitted to avoid complexity.

The transistor 650 of this embodiment is different from the transistor described in Embodiment 1 in that a conductive film 602 is provided in the same plane as the base film 102 and is adjacent to the base film 102.

In general, in a transistor including an oxide semiconductor film as an active layer, a contact resistance tends to be high in a portion where the oxide semiconductor film is in contact with a conductive film. However, when a transistor has the above-described structure, the source electrode 114a and the drain electrode 114b are in contact with the oxide semiconductor film 106 through the conductive film 602 not only on the top surface side of the oxide semiconductor film 106 but also on the bottom surface side thereof. Thus, a contact resistance between the oxide semiconductor film 106 and the source electrode 114a and a contact resistance between the oxide semiconductor film 106 and the drain electrode 114b can be reduced, and a variation in contact resistance can be reduced. Accordingly, it is possible to provide a high-performance transistor in which on-state current is high and a variation in threshold voltage is suppressed. Thus, it can be said that the above-described structure is one of the structures suitable for a transistor including an oxide semiconductor.

<Manufacturing Process of Transistor 650>

An example of a manufacturing process of the transistor 650 illustrated in FIGS. 4A and 4B will be described with reference to FIGS. 5A to 5E.

First, a conductive film is formed over the substrate 100. In a photolithography process, a resist mask is formed over the conductive film and selective etching is performed, so that the conductive film 602 is formed. Then, the resist mask is removed (see FIG. 5A). For a material of the conductive film 602 and the like, the description of the gate electrode 110 and the source electrode 114a (or the drain electrode 114b) in the above embodiment can be referred to.

Figure 5A:
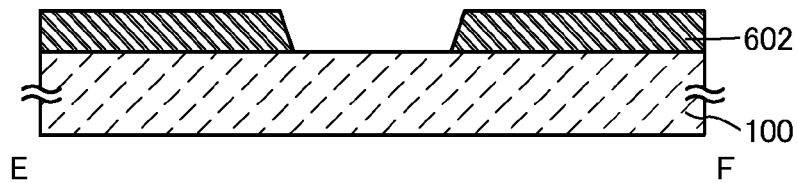
FIGS. 5A to 5E are cross-sectional views illustrating an example of a manufacturing process of a semiconductor device.
Figure 5B:
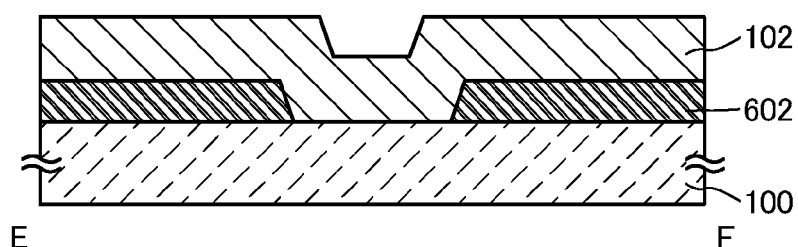

Then, the base film 102 is formed over the substrate 100 and the conductive film 602 (see FIG. 5B). Here, the surface of the base film 102 is preferably higher than at least a surface of the conductive film 602. By planarizing treatment to be described later, the surface of the conductive film 602 can be approximately the same in height as the surface of the base film 102. Thus, it is possible to avoid a problem such as a break in the oxide semiconductor film 106 due to difference in height between the conductive film 602 and the base film 102, which occurs when the oxide semiconductor film is formed in a later step. In addition, the oxide semiconductor film 106 can be extremely thin. Thus, it can be said that the planarizing treatment is one of effective means to miniaturize a transistor.

Figure 5C:
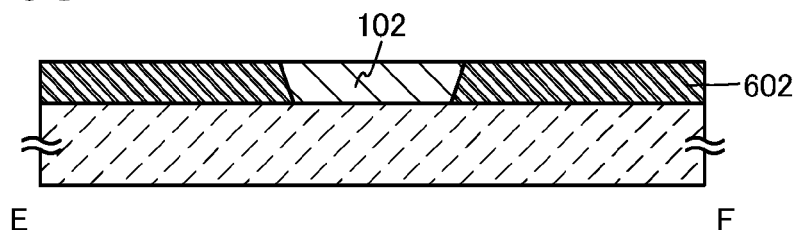

The planarizing treatment is performed on the base film 102 to form the base film 102 having a surface in approximately the same plane as the surface of the conductive film 602 (see FIG. 5C). Note that the planarizing treatment performed on the base film 102 is preferably chemical mechanical polishing (CMP) treatment. Here, the CMP treatment is treatment for planarizing a surface of an object to be processed by a combination of chemical and mechanical actions using the surface as a reference. In general, the CMP treatment is treatment in which a polishing cloth is attached to a polishing stage, the polishing stage and the object to be processed are each rotated or swung while a slurry (abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the conductive film 602 and the surface of the base film 102 can be further increased.

Dry etching treatment or the like may also be performed to planarize the base film 102. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate. For example, a dry etching method such as a reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, or a helicon wave plasma etching method can be used. In particular, when the base film 102 includes an inorganic insulating material containing a large amount of nitrogen, such as silicon nitride or silicon nitride oxide, it might be difficult to remove the inorganic insulating material containing a large amount of nitrogen only by the CMP treatment; thus, CMP treatment and dry etching or the like are preferably performed in combination.

Plasma treatment or the like may also be performed to planarize the base film 102. The plasma treatment is performed in such a manner that an inert gas such as an argon gas is introduced into a vacuum chamber and an electric field is applied so that a surface to be processed serves as a cathode. The plasma treatment has a principle similar to that of a plasma dry etching method, and is a simpler method because treatment in a general sputtering deposition chamber is possible by using an inert gas. That is, the plasma treatment is treatment in which the surface to be processed is irradiated with ions of an inert gas and minute unevenness of the surface is reduced by a sputtering effect. Thus, the plasma treatment is also referred to as "reverse sputtering" in this specification.

Figure 5D:
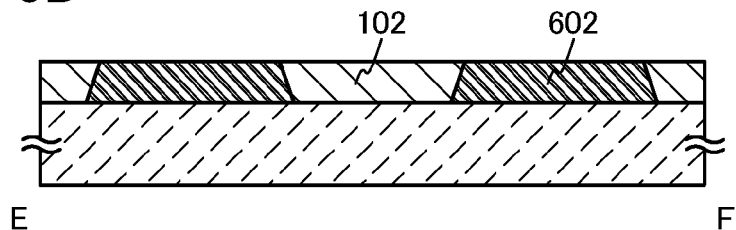
Figure 5E:
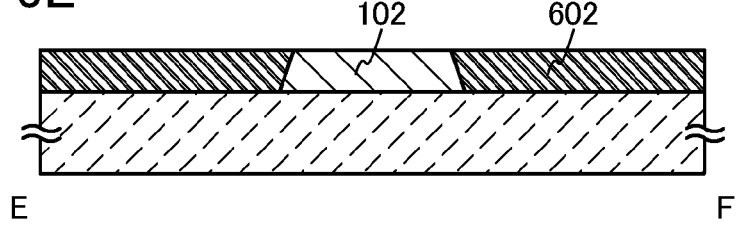

Note that the conductive film 602 and the base film 102 may be formed in an island shape as illustrated in FIG. 5D. Although the conductive film 602 illustrated in FIG. 5C has what is called a forward tapered shape in which a distance between the ends becomes shorter toward the upper surface, the conductive film 602 may have what is called a reverse tapered shape in which a distance between the ends becomes longer toward the upper surface as illustrated in FIG. 5E.

The subsequent steps may be performed referring to FIGS. 2A to 2D and FIGS. 3A to 3D and the description in Embodiment 1 which corresponds to the description of the drawings.

Through the above-described steps, the transistor 650 illustrated in FIG. 4B can be manufactured. In this embodiment, crystal growth of the oxide semiconductor film 106, reflecting the state of crystals in the base film 102, occurs from the vicinity of the interface with the base film 102 while depositing the oxide semiconductor film 106. This is because, in a region where the oxide semiconductor film 106 overlaps with the base film 102, as in Embodiment 1, lattice mismatch between the oxide semiconductor film 106 and the base film 102 is small. Thus, the oxide semiconductor film 106 can be a CAAC-OS film, a single crystal film, or a polycrystalline film having crystallinity in a large region in the thickness direction from the vicinity of the interface with the base film 102.

In the transistor 650 including the above features, a contact resistance between the oxide semiconductor film 106 and the source electrode 114a and a contact resistance between the oxide semiconductor film 106 and the drain electrode 114b can be reduced, and a variation in contact resistance can be reduced. Thus, the transistor with high performance in which on-state current is high and a variation in threshold voltage is prevented can be provided. Accordingly, a semiconductor device including the transistor 650 can have improved operation characteristics. Further, a transistor including an oxide semiconductor film or a semiconductor device including the transistor can be improved in performance. Furthermore, as described above, the surface of the conductive film 602 can be approximately the same in height as the surface of the base film 102, and the oxide semiconductor film 106 can be extremely thin; thus, it can be said that the above-described structure is one of the structures suitable for miniaturization of a transistor.

The structures, methods, and the like described in this embodiment can be combined as appropriate with any of the structures, methods, and the like described in the other embodiments.

Embodiment 3

In this embodiment, one embodiment of a semiconductor device having a structure different from that described in any of the above embodiments and a method for manufacturing the semiconductor device will be described with reference to FIGS. 6A and 6B, FIGS. 7A to 7C, and FIGS. 8A and 8B.

<Example of Structure of Semiconductor Device>

Figure 6A:
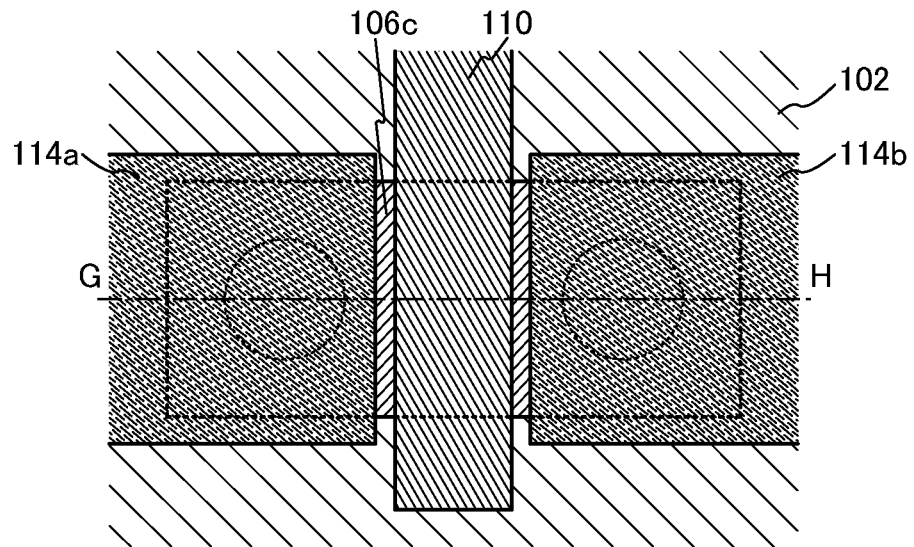
FIGS. 6A and 6B are a plan view and a cross-sectional view illustrating one embodiment of a semiconductor device.
Figure 6B:
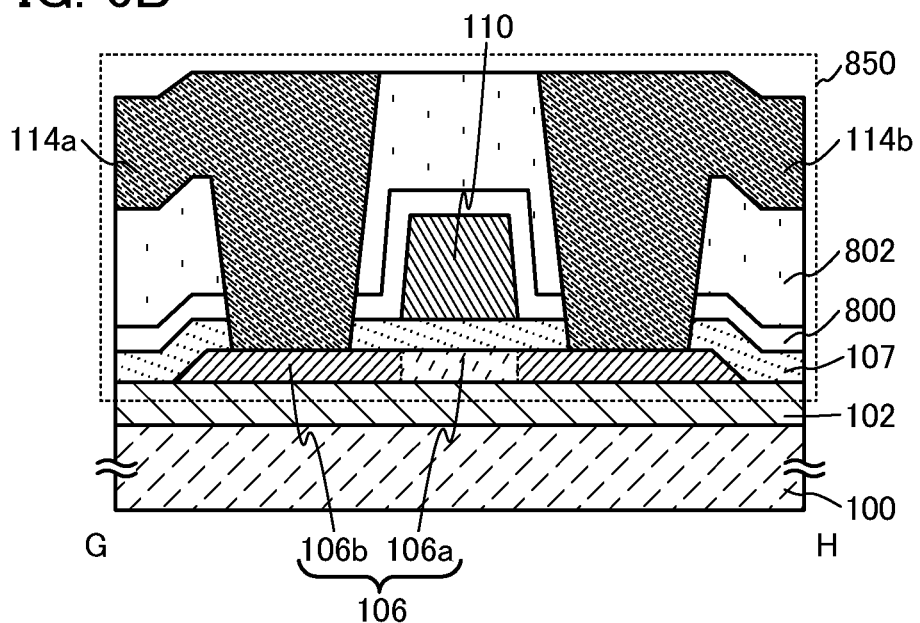

FIGS. 6A and 6B illustrate an example of a plan view and a cross-sectional view of a transistor having a top-gate structure, as an example of a semiconductor device. FIG. 6A is a plan view and FIG. 6B is a cross-sectional view taken along line G-H in FIG. 6A. Note that in FIG. 6A, some components (e.g., the substrate 100) of a transistor 850 are omitted to avoid complexity.

The transistor 850 illustrated in FIGS. 6A and 6B includes, over the substrate 100, the base film 102, the oxide semiconductor film 106, the insulating film 107, the gate electrode 110 which overlaps with at least the oxide semiconductor film 106, an interlayer insulating film 800, an interlayer insulating film 802, and the source electrode 114a and the drain electrode 114*b* which are electrically connected to the oxide semiconductor film 106 through openings formed in the insulating film 107, the interlayer insulating film 800, and the interlayer insulating film 802.

The transistor 850 is different from the transistor described in any of the above embodiments in that the insulating film 107 is formed so as to cover the oxide semiconductor film 106 and that the source electrode 114*a* and the drain electrode 114*b* are electrically connected to the oxide semiconductor film 106 through the openings formed in the insulating film 107, the interlayer insulating film 800, and the interlayer insulating film 802.

The insulating film 107 is formed to cover the oxide semiconductor film 106 in the transistor 850, whereby entry of impurities such as moisture into the oxide semiconductor film 106 can be suppressed. Further, since the insulating film 107 is provided over the oxide semiconductor film 106, it is possible to reduce the occurrence of damage in the oxide semiconductor film 106 (e.g., lattice defects in the oxide semiconductor film 106), which is caused by addition of an impurity ion 130 to the oxide semiconductor film 106.

The transistor 850 has such a structure that the source electrode 114*a* and the drain electrode 114*b* are electrically connected to the oxide semiconductor film 106 through the openings formed in the insulating film 107, the interlayer insulating film 800, and the interlayer insulating film 802. Thus, after formation of the oxide semiconductor film 106, the oxide semiconductor film 106 is subjected to etching step (e.g., an etching gas and plasma at the time of dry etching or an etching agent at the time of wet etching) only in portions under the openings formed in the insulating film 107, the interlayer insulating film 800, and the interlayer insulating film 802. Thus, it is possible to suppress contamination of the transistor 850 with a substance generated by the etching treatment (e.g., a metal compound generated by reaction of an etching gas used at the time of the dry etching with a metal element of the oxide semiconductor film 106, which might have conductivity and thus become a leak path between the source electrode 114*a* and the drain electrode 114*b*). In addition, even when part of the source electrode 114*a* and part of the drain electrode 114*b* are formed to overlap with the gate electrode 110, the source electrode 114*a* and the drain electrode 114*b* are not electrically connected to the gate electrode 110 because the interlayer insulating film is provided between the source electrode 114*a* and the gate electrode 110 and between the drain electrode 114*b* and the gate electrode 110. With such a structure, the source electrode 114*a* and the drain electrode 114*b* can be formed as close to the gate electrode 110 as possible. Thus, it can be said that such a structure is one of the structures suitable for miniaturization of a transistor.

<Manufacturing Process of Transistor 850>

An example of a manufacturing process of the transistor 850 illustrated in FIGS. 6A and 6B will be described with reference to FIGS. 7A to 7C and FIGS. 8A and 8B.

Figure 7A:
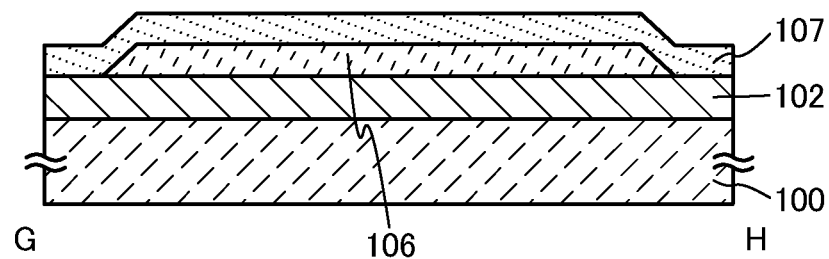
FIGS. 7A to 7C are cross-sectional views illustrating an example of a manufacturing process of a semiconductor device.

First, the base film 102, the oxide semiconductor film 106, and the insulating film 107 are formed over the substrate 100 (see FIG. 7A). Note that the step may be performed referring to FIGS. 2A to 2D and the description in the above embodiments which corresponds to the description of the drawings. When an oxide film having crystallinity is used as the base film 102, crystal growth of the oxide semiconductor film 106, reflecting the state of crystals in the base film 102, occurs from the vicinity of the interface with the base film 102 while depositing the oxide semiconductor film 106, because as in Embodiment 1, lattice mismatch between the oxide semiconductor film 106 and the base film 102 is small.

Thus, the oxide semiconductor film 106 can be a CAAC-OS film, a single crystal film, or a polycrystalline film having crystallinity in a large region in the thickness direction from the vicinity of the interface with the base film 102.

Figure 7B:
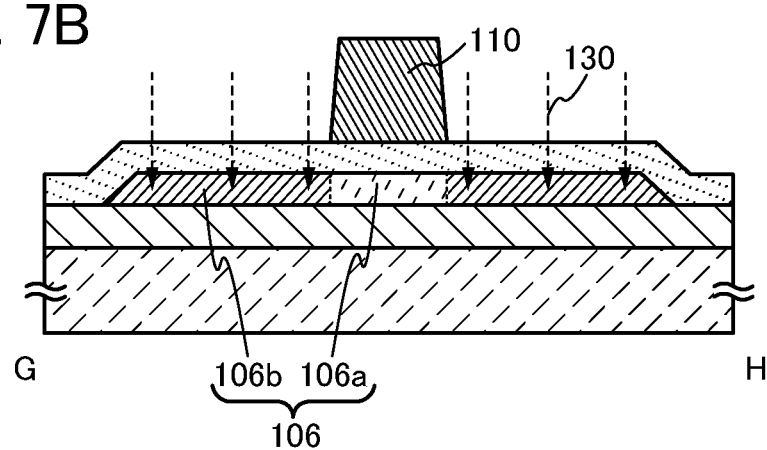

Next, the gate electrode 110 is formed over the insulating film 107, and the impurity ion 130 is added to the oxide semiconductor film 106 with the gate electrode 110 used as a mask, so that the low-resistance region 106*b* is formed in a self-aligned manner in the oxide semiconductor film 106 (see FIG. 7B). Note that the step may be performed referring to FIGS. 3A to 3C and the description in the above embodiments which corresponds to the description of the drawings.

Figure 7C:
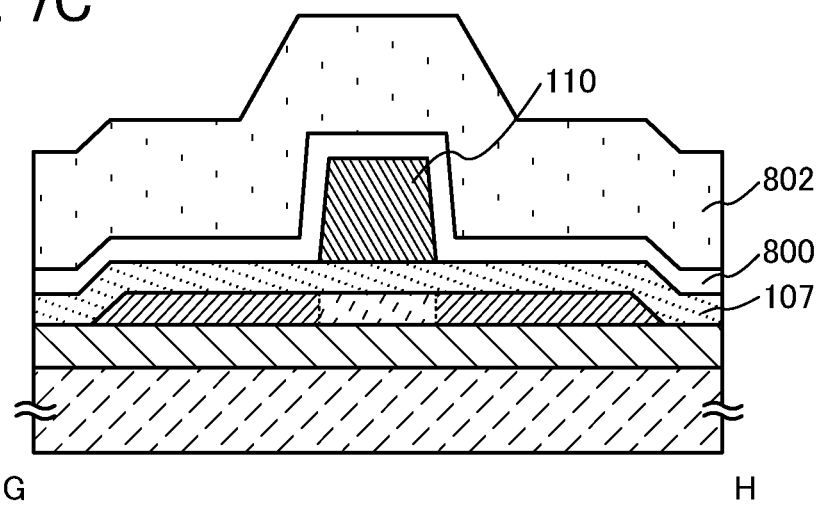

Next, the interlayer insulating film 800 and the interlayer insulating film 802 are formed over the insulating film 107 and the gate electrode 110 (see FIG. 7C).

The interlayer insulating film 800 can be formed using the same material and the same film formation method as the gate insulating film 108; thus, for the interlayer insulating film 800, the description of the gate insulating film 108 in the above embodiment can be referred to. Note that an aluminum oxide film is highly effective in suppressing entry of impurities such as moisture and hydrogen from outside. Thus, it is preferable to use, as the insulating film an aluminum oxide film or a stacked-layer film including an aluminum oxide film. It is more preferable to use an aluminum oxide film having a film density of 3.2 g/cm$^3$ or higher. Thus, it is possible to suppress entry of impurities such as moisture and hydrogen into the oxide semiconductor film 106.

The interlayer insulating film 802 may be formed in such a manner that a material having an insulating property is applied by a spin coating method, a printing method, a dispensing method, an ink-jet method, or the like, and cure treatment (e.g., heat treatment or light irradiation treatment) is performed depending on the applied material. As the material having an insulating property, for example, an organic resin such as an acrylic resin, a polyimide resin, a polyamide resin, a polyamide-imide resin, or an epoxy resin can be used. It is also possible to use a low-dielectric constant material (low-k material), a siloxane-based resin, phosphosilicate glass (PSG), borophosphosilicate glass (BPSG), or the like. Note that the interlayer insulating film may be formed by stacking a plurality of insulating films formed of any of these materials. Note that the interlayer insulating film 802 contains comparatively much impurity such as moisture; thus, the interlayer insulating film is preferably formed over the above-described insulating film (e.g., an aluminum oxide or a stacked-layer film containing an aluminum oxide).

Note that a stacked-layer structure including the interlayer insulating film 800 and the interlayer insulating film 802 is formed in this embodiment; however, only one of them may be formed.

Next, the openings are formed in at least part of the insulating film 107, part of the interlayer insulating film 800, and part of the interlayer insulating film 802, which overlap with the oxide semiconductor film. Then, the source electrode 114*a* and the drain electrode 114*b* which are electrically connected to the oxide semiconductor film 106 through the openings are formed (see FIG. 8A).

Note that the insulating film 107, the interlayer insulating film 800, and the interlayer insulating film 802 may be etched by either dry etching or wet etching, or by both dry etching and wet etching. Note that it is preferable that etching conditions be optimized so as not to etch and divide the oxide semiconductor film 106 when the etching is performed. However, it is difficult to obtain etching conditions in which only the insulating film 107, the interlayer insulating film 800, and the interlayer insulating film 802 are etched and the oxide semiconductor film 106 is not etched at all. In some cases, only part of the oxide semiconductor film 106, e.g., 5% to 50% both inclusive, in thickness of the oxide semiconductor film 106 is etched when the conductive film is etched, whereby the oxide semiconductor film 106 having a groove portion (a recessed portion) is formed.

Note that a step of forming the source electrode 114a and the drain electrode 114b may be performed referring to FIG. 3D and the description in the above embodiments which corresponds to the description of the drawings. Further, after the step, planarizing treatment may be performed on the source electrode 114a, the drain electrode 114b, and the interlayer insulating film 802. By the planarizing treatment, in the case where another transistor is stacked over the transistor 850, the transistor can be easily manufactured. This is because the planarity of a surface over which the transistor is to be formed (i.e., surfaces of the source electrode 114a, the drain electrode 114b, and the interlayer insulating films 802) is increased by the planarizing treatment. Note that for the planarizing treatment, a method of the planarizing treatment described in the above embodiment can be referred to.

Through the above-described steps, the transistor 850 illustrated in FIG. 6B can be manufactured. In the transistor 850, which includes the features described in Embodiment 1, the occurrence of damage in the oxide semiconductor film 106 (e.g., lattice defects in the oxide semiconductor film 106) which is caused by addition of an ion can be reduced as described above. Further, as described above, a portion of the oxide semiconductor film 106, which is subjected to etching treatment, can be limited. Thus, contamination of the transistor by the etching treatment can be suppressed. Accordingly, a semiconductor device including the transistor 850 can have improved operation characteristics. Further, a transistor including an oxide semiconductor film or a semiconductor device including the transistor can be improved in performance. Furthermore, as described above, the source electrode 114a and the drain electrode 114b are not electrically connected to the gate electrode 110 even when parts thereof are formed to overlap with the gate electrode 110. Thus, the source electrode 114a and the drain electrode 114b can be formed as close to the gate electrode 110 as possible, which is one of the structures suitable for miniaturization of a transistor.

Figure 8A:
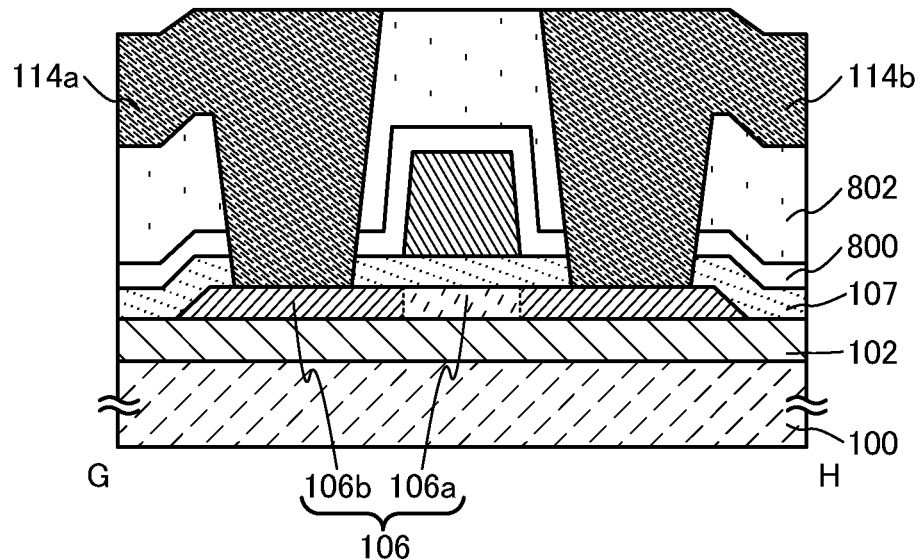
FIGS. 8A and 8B are cross-sectional views illustrating an example of a manufacturing process of a semiconductor device.
Figure 8B:
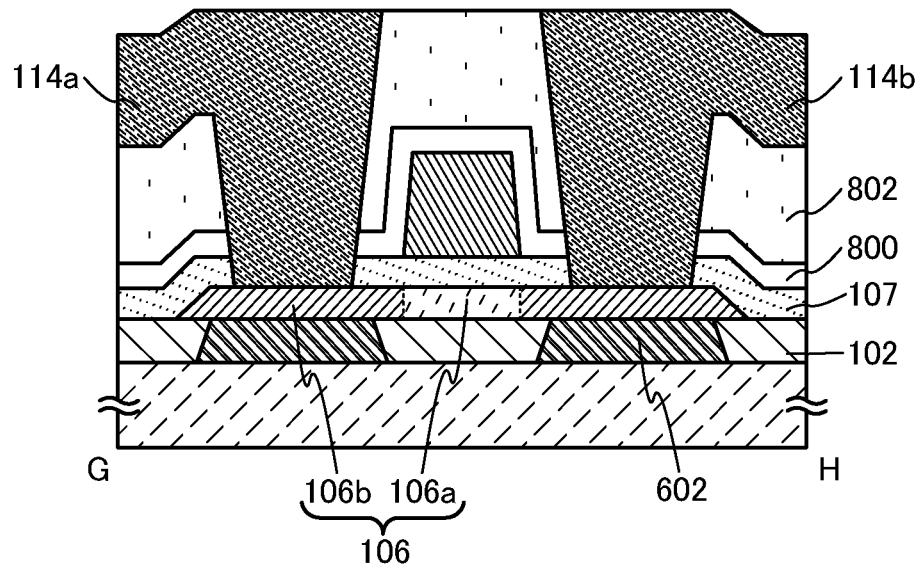

Further, as illustrated in FIG. 8B, the conductive film 602 may be included. Even when portions of the oxide semiconductor film 106, which are located under the openings, are over-etched and thus eliminated at the time of forming the openings in part of the insulating film 107, part of the interlayer insulating film 800, and part of the interlayer insulating film 802, with the transistor 850 having the structure illustrated in FIG. 8B, the source electrode 114a and the drain electrode 114b are electrically connected to the oxide semiconductor film 106 through the conductive film 602, instead of being electrically connected to a sidewall portion of the oxide semiconductor film 106. Thus, a favorable contact resistance can be kept even when such over-etching is performed. Thus, it can be said that the structure illustrated in FIG. 8B is particularly suitable for the case where the oxide semiconductor film 106 is thin (i.e., miniaturization of a transistor).

Embodiment 4

In this embodiment, one embodiment of a semiconductor device having a structure different from that described in any of the above embodiments and a method for manufacturing the semiconductor device will be described with reference to FIGS. 9A and 9B, FIGS. 10A to 10C, FIGS. 11A to 11C, and FIGS. 12A and 12B.

<Example of Structure of Semiconductor Device>

Figure 9A:
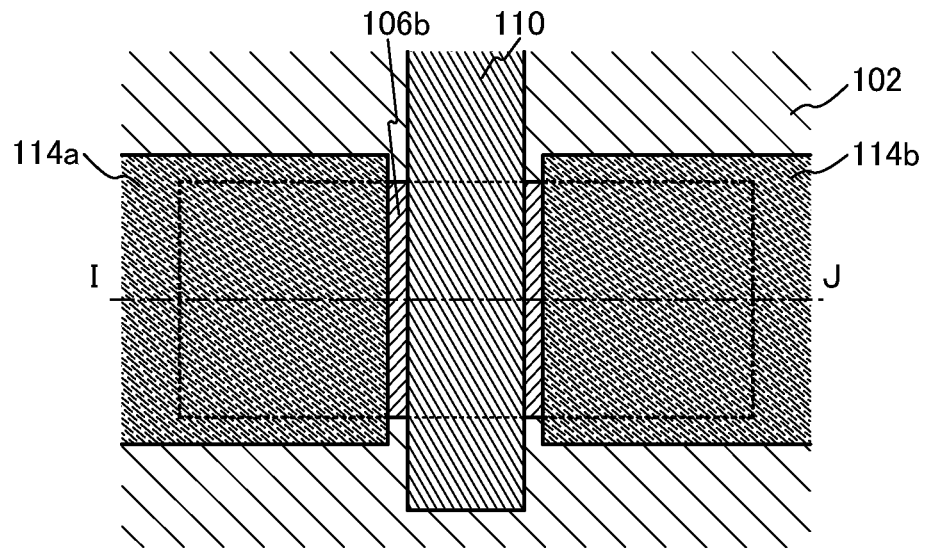
FIGS. 9A and 9B are a plan view and a cross-sectional view illustrating one embodiment of a semiconductor device.
Figure 9B:
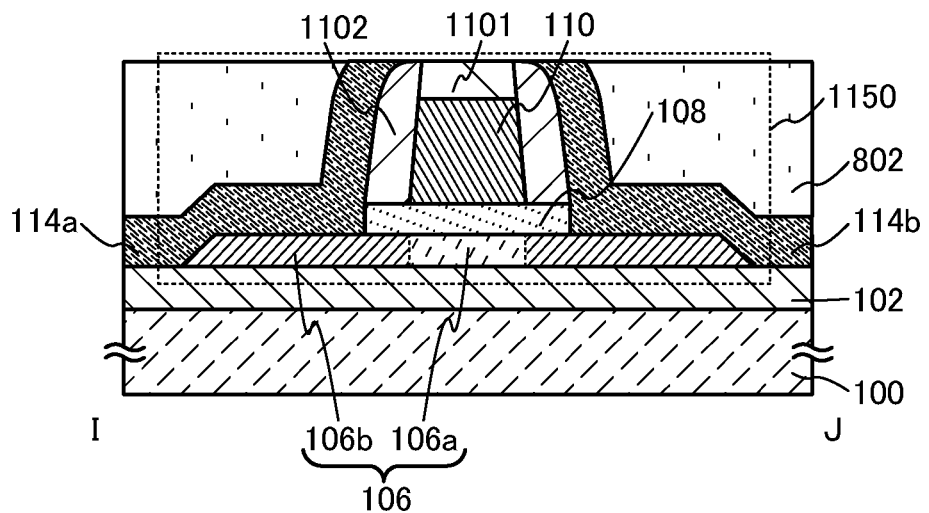

FIGS. 9A and 9B illustrate an example of a plan view and a cross-sectional view of a transistor having a top-gate structure, as an example of a semiconductor device. FIG. 9A is a plan view and FIG. 9B is a cross-sectional view taken along line I-J in FIG. 9A. Note that in FIG. 9A, some components (e.g., the substrate 100) of a transistor 1150 are omitted to avoid complexity.

The transistor 1150 illustrated in FIGS. 9A and 9B includes, over the substrate 100, the base film 102, the oxide semiconductor film 106, the gate insulating film 108, the gate electrode 110 which overlaps with at least the oxide semiconductor film 106, an insulating film 1101, a sidewall insulating film 1102, and the source electrode 114a and the drain electrode 114b which are electrically connected to the oxide semiconductor film 106.

The transistor 1150 is different from the transistor described in any of the above embodiments in the following points: the insulating film 1101 is provided over the gate electrode 110; the sidewall insulating film 1102 is provided on a side surface of the gate electrode 110; and the source electrode 114a and the drain electrode 114b are provided to be in contact with the sidewall insulating film 1102.

The transistor 1150 is manufactured in the following manner: a conductive film to be used as the source electrode 114a and the drain electrode 114b is formed over the oxide semiconductor film 106, the insulating film 1101, and the sidewall insulating film 1102, and then, part of the conductive film is removed by planarizing treatment (also referred to as polishing treatment) performed on the conductive film, so that the source electrode 114a and the drain electrode 114b are formed. This manner is also described later in the description of a method for manufacturing the transistor 1150. Thus, it is not necessary to use a photolithography process for the formation of the source electrode 114a and the drain electrode 114b, and the Loff width can be extremely narrow without regard to the accuracy of a light-exposure machine or the misalignment of a photomask. Thus, a decrease in on-state current of the transistor 1150 can be suppressed. Further, it can be said that the above-described structure is one of the structures suitable for miniaturization of a transistor.

<Manufacturing Process of Transistor 1150>

An example of a manufacturing process of the transistor 1150 illustrated in FIGS. 9A and 9B will be described with reference to FIGS. 10A to 10C, FIGS. 11A to 11C, and FIGS. 12A and 12B.

Figure 10A:
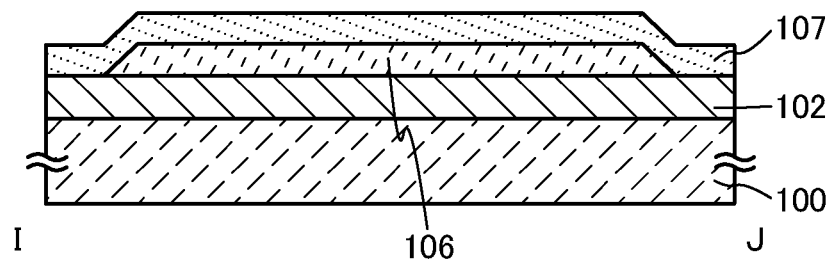
FIGS. 10A to 10C are cross-sectional views illustrating an example of a manufacturing process of a semiconductor device.

First, the base film 102, the oxide semiconductor film 106, and the insulating film 107 are formed over the substrate 100 (see FIG. 10A). Note that the step may be performed referring to FIGS. 2A to 2D and the description in the above embodiments which corresponds to the description of the drawings. When an oxide film having crystallinity is used as the base film 102, crystal growth of the oxide semiconductor film 106, reflecting the state of crystals in the base film 102, occurs from the vicinity of the interface with the base film 102 while depositing the oxide semiconductor film 106, because similarly to Embodiment 1, lattice mismatch between the oxide semiconductor film 106 and the base film 102 is small. Thus, the oxide semiconductor film 106 can be a CAAC-OS film, a single crystal film, or a polycrystalline film having crystallinity in a large region in the thickness direction from the vicinity of the interface with the base film 102.

Figure 10B:
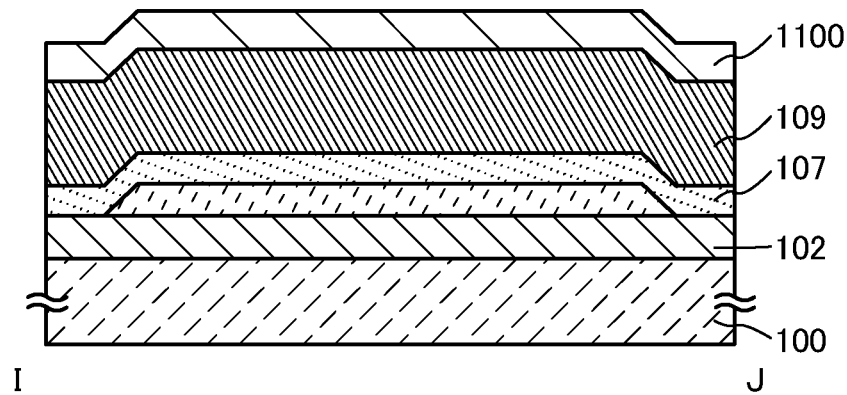

Next, the conductive film 109 for forming the gate electrode 110 (including wirings formed in the same layer as the gate electrode) and an insulating film 1100 for forming the insulating film 1101 are formed (see FIG. 10B). The insulating film 1100 can be formed using the same material and the same film formation method as the gate insulating film 108; thus, for the insulating film 1100, the description of the gate insulating film 108 in the above embodiment can be referred to.

Figure 10C:
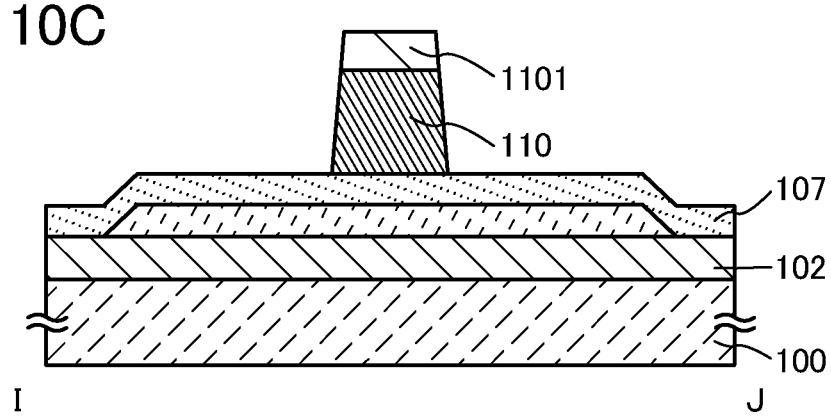

Next, by a photolithography process, the conductive film 109 and the insulating film 1100 are processed into island shapes, so that the gate electrode 110 and the insulating film 1101 are formed (see FIG. 10C). A resist mask which is used for the formation of the gate electrode 110 and the insulating film 1101 may be formed by an ink-jet method. Formation of the resist mask by an ink-jet method needs no photomask; thus, manufacturing cost can be reduced. Note that the conductive film 109 and the insulating film 1100 may be etched by either dry etching or wet etching, or by both dry etching and wet etching.

In this embodiment, description is made in the following order: the conductive film 109 and the insulating film 1100 are formed and processed together to form the gate electrode 110 and the insulating film 1101; then, the sidewall insulating film 1102 is formed. Thus, the insulating film 1101 and the sidewall insulating film 1102 are described as different components as illustrated in FIG. 9B. However, the insulating film 1101 and the sidewall insulating film 1102 may be one film. In the case where the insulating film 1101 and the sidewall insulating film 1102 are formed using one film, after the gate electrode 110 is formed, an insulating film which functions as the insulating film 1101 and the sidewall insulating film 1102 may be formed to cover the gate electrode 110. Note that for a material and a formation method of the insulating film, the descriptions for the insulating film 1101 and the sidewall insulating film 1102 can be referred to.

Next, by an ion doping method or an ion implantation method, an impurity ion 130 having a function of reducing a resistance value of the oxide semiconductor film 106 is added to the oxide semiconductor film 106. At this time, the gate electrode 110 and the insulating film 1101 function as a mask, whereby the high-resistance region 106a (which functions as a channel formation region) and the low-resistance region 106b are formed in a self-aligned manner in the oxide semiconductor film 106 (see FIG. 11A).

Next, an insulating film is formed using the same material and the same method as the base film 102, and the insulating film is etched, so that the sidewall insulating film 1102 is formed. The sidewall insulating film 1102 can be formed in a self-aligned manner by performing a highly anisotropic etching step on the insulating film. For example, a dry etching method is preferably employed. As an etching gas used for the dry etching method, for example, a gas including fluorine such as trifluoromethane, octafluorocyclobutane, or tetrafluoromethane can be used. A rare gas or hydrogen may be added to the etching gas. As the dry etching method, a reactive ion etching (RIE) method in which high-frequency voltage is applied to a substrate, is preferably used.

Figure 11A:
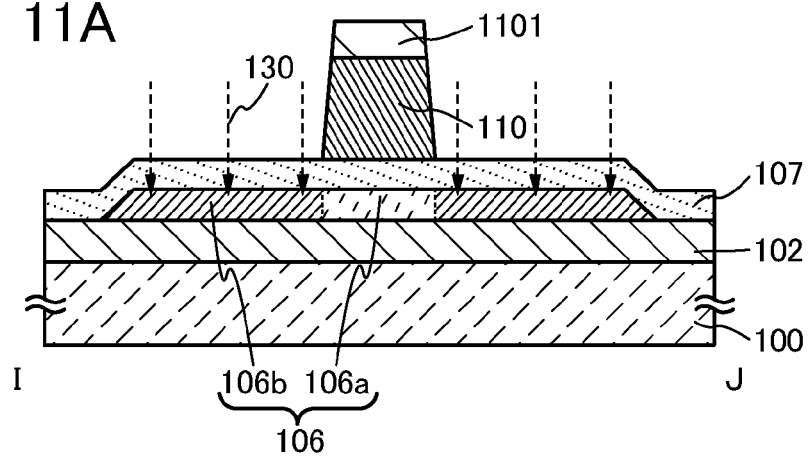
FIGS. 11A to 11C are cross-sectional views illustrating an example of a manufacturing process of a semiconductor device.
Figure 11B:
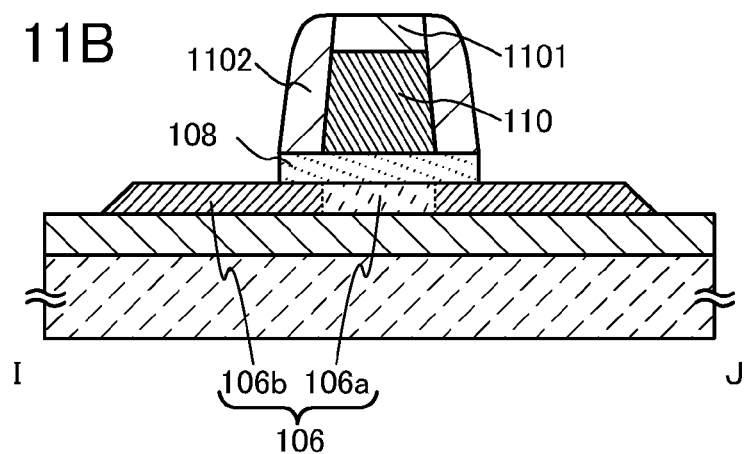

After the formation of the sidewall insulating film 1102, the insulating film 107 is processed with the gate electrode 110, the insulating film 1101, and the sidewall insulating film 1102 used as a mask, so that the gate insulating film 108 can be formed (see FIG. 11B). Note that the gate insulating film 108 may be formed in the same step as the formation of the sidewall insulating film 1102.

Note that although the impurity ion 130 is added to the oxide semiconductor film 106 with the gate electrode 110 and the insulating film 1101 used as a mask just after the formation of the gate electrode 110 and the insulating film 1101 in this embodiment, the impurity ion 130 may be added to the oxide semiconductor film 106 after the formation of the sidewall insulating film 1102, with the gate electrode 110, the insulating film 1101, and the sidewall insulating film 1102 used as a mask. In this manner, regions of the oxide semiconductor film 106 which overlap with the sidewall insulating films 1102 can be included in the high-resistance region 106a.

Figure 11C:
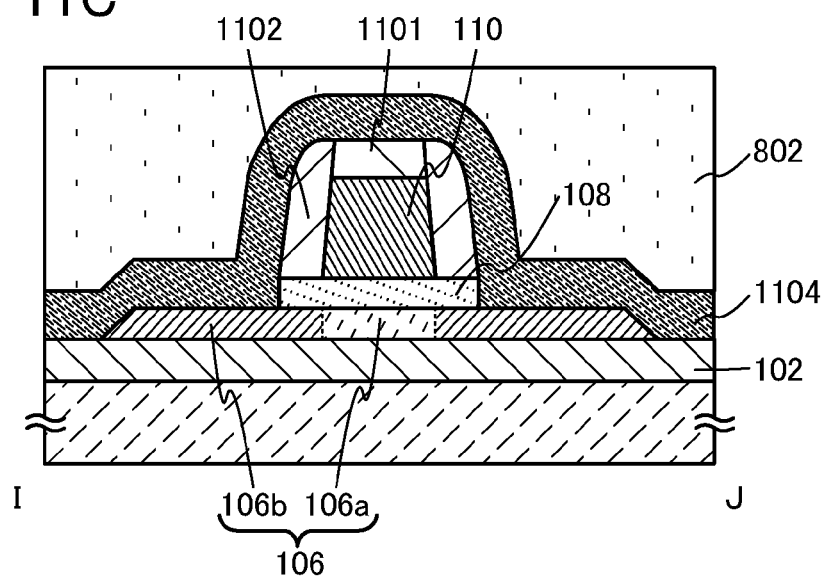

Then, a conductive film 1104 for forming the source electrode 114a and the drain electrode 114b (including wirings formed in the same layer as the source electrode and the drain electrode) is formed over the oxide semiconductor film 106, the insulating film 1101, and the sidewall insulating film 1102, and an interlayer insulating film 802 is formed (see FIG. 11C). As the conductive film 1104, for example, a metal film containing an element selected from aluminum, chromium, copper, tantalum, titanium, molybdenum, or tungsten, or a metal nitride film containing any of the above elements as its component (a titanium nitride film, a molybdenum nitride film, or a tungsten nitride film) can be used. Alternatively, the conductive film 1104 may have a structure in which a film of a high-melting-point metal such as titanium, molybdenum, or tungsten, or a metal nitride film of any of these metals (a titanium nitride film, a molybdenum nitride film, or a tungsten nitride film) is stacked on either or both of the bottom surface and the top surface of a metal film of aluminum, copper, or the like. Further alternatively, the conductive film used for the source electrode and the drain electrode may be formed using a conductive metal oxide. As the conductive metal oxide, an indium oxide ($In_2O_3$), a tin oxide ($SnO_2$), a zinc oxide (ZnO), an indium tin oxide ($In_2O_3$—$SnO_2$, which is abbreviated to ITO), or an indium zinc oxide ($In_2O_3$—ZnO) can be used. The conductive film used for the source electrode and the drain electrode can be formed to have a single-layer structure or a stacked-layer structure using any of the above-described materials. There is no particular limitation on the method for forming the conductive film, and a variety of film formation methods such as an evaporation method, a CVD method, a sputtering method, or a spin coating method can be employed. Note that for the interlayer insulating film 802, the materials and the film formation methods of the interlayer insulating film 802 which are described in Embodiment 3 can be referred to.

Then, planarizing treatment is performed on the top surface of the conductive film 1104 to remove at least part of the conductive film 1104 and at least part of the interlayer insulating film 802, which are located over the insulating film 1101 and the sidewall insulating film 1102. Thus, the conductive film 1104 is divided at least over the insulating film 1100 or the sidewall insulating film 1102, so that the gate electrode 110 is interposed between the source electrode 114a and the drain electrode 114b (see FIG. 12A). Note that for the planarizing treatment here, the description of the planarizing treatment performed on the base film 102 in Embodiment 1 can be referred to.

Note that in the planarizing treatment, not only the conductive film 1104 and the interlayer insulating film 802 but also the insulating film 1101 and the sidewall insulating film 1102 may be processed (polished) at the same time.

Figure 12A:
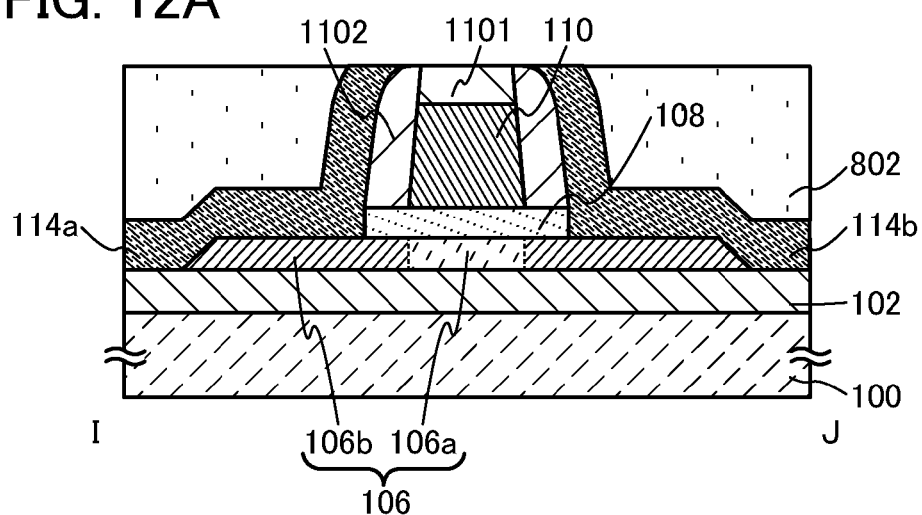
FIGS. 12A and 12B are cross-sectional views illustrating an example of a manufacturing process of a semiconductor device.

Note that in FIG. 12A, surfaces of the source electrode 114a and the drain electrode 114b are located in the same plane as surfaces of the insulating film 1101 and the interlayer insulating film 802. However, in the case where the source electrode 114a, the drain electrode 114b, and the insulating film 1101 are polished with a CMP apparatus, when the source electrode 114a and the drain electrode 114b are polished at a polishing speed different from that of the insulating film 1101 and the interlayer insulating film 802, the surfaces of the source electrode 114a and the drain electrode 114b might be different in height from the surfaces of the insulating film 1101 and the interlayer insulating film 802, whereby a step might be formed. For example, the surfaces of the source electrode 114a and the drain electrode 114b might be lower than the surface of the insulating film 1101 (i.e., the surfaces of the source electrode 114a and the drain electrode 114b might be recessed).

Through the above-described steps, the transistor 1150 illustrated in FIG. 9B can be manufactured. In the transistor 1150, which includes the features described in Embodiment 1, a decrease in on-state current can be suppressed as described above. Accordingly, a semiconductor device including the transistor 1150 can have improved operation characteristics. Further, a transistor including an oxide semiconductor film or a semiconductor device including the transistor can be improved in performance. Furthermore, it is not necessary to use a photolithography process for the formation of the source electrode 114a and the drain electrode 114b, and the Loff width can be extremely narrow without regard to the accuracy of a light-exposure machine or the misalignment of a photomask. Thus, it can be said that the above-described structure is one of the structures suitable for miniaturization of a transistor.

An insulating film may be formed over the transistor 1150. The insulating film can be formed using the same material and the same film formation method as the gate insulating film 108; thus, the description of the gate insulating film 108 can be referred to for the insulating film. Note that an aluminum oxide film is highly effective in suppressing entry of moisture from outside. Thus, it is preferable to use an aluminum oxide film or a stacked-layer film including an aluminum oxide film as the insulating film. It is more preferable to use an aluminum oxide film having a film density of 3.2 g/cm$^3$ or higher, preferably 3.6 g/cm$^3$ or higher. Note that the insulating film may be formed before the formation of the transistor 1150. For example, the conductive film 1104, the insulating film, and the interlayer insulating film 802 may be formed in the order presented after the formation of the sidewall insulating film 1102, and then, the planarizing treatment such as CMP treatment may be formed. The structure illustrated in FIG. 9B is preferable because, even when impurities such as moisture or hydrogen enter the interlayer insulating film 802, the impurities can be prevented from reaching the oxide semiconductor film 106.

Figure 12B:
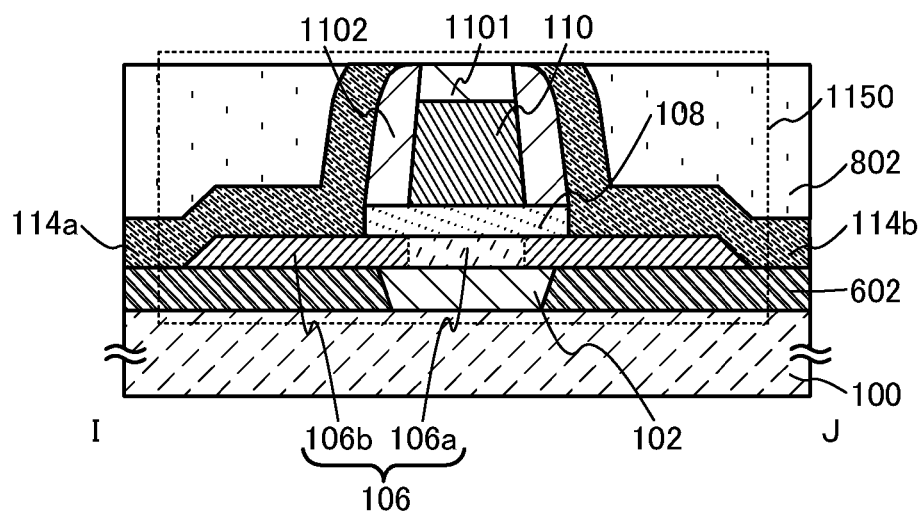

The transistor 1150 may have a structure in which the conductive film 602 is included as illustrated in FIG. 12B. When the transistor 1150 has the structure illustrated in FIG. 12B, the source electrode 114a and the drain electrode 114b are in contact with the oxide semiconductor film 106 through the conductive film 602 not only on the top surface side of the oxide semiconductor film 106 but also on the bottom surface side thereof. Thus, a contact resistance between the oxide semiconductor film 106 and the source electrode 114a and a contact resistance between the oxide semiconductor film 106 and the drain electrode 114b can be reduced, and a variation in contact resistance can be reduced. Thus, it is possible to provide a high-performance transistor in which on-state current is high and a variation in threshold voltage is suppressed. Thus, it can be said that the above-described structure is one of the structures suitable for a transistor including an oxide semiconductor.

Embodiment 5

In this embodiment, one embodiment of a semiconductor device having a structure different from that described in any of the above embodiments and a method for manufacturing the semiconductor device will be described with reference to FIGS. 13A and 13B and FIGS. 14A to 14C.

<Example of Structure of Semiconductor Device>

Figure 13A:
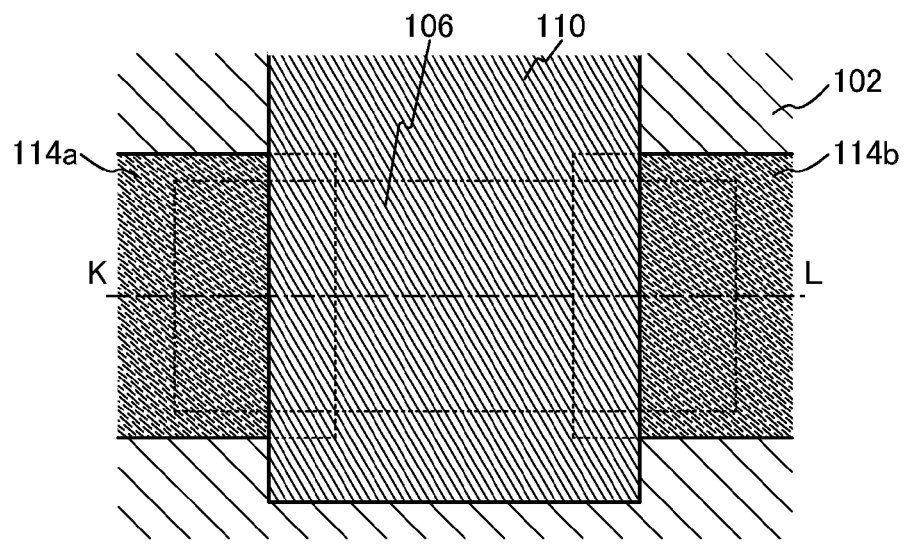
FIGS. 13A and 13B are a plan view and a cross-sectional view illustrating one embodiment of a semiconductor device.
Figure 13B:
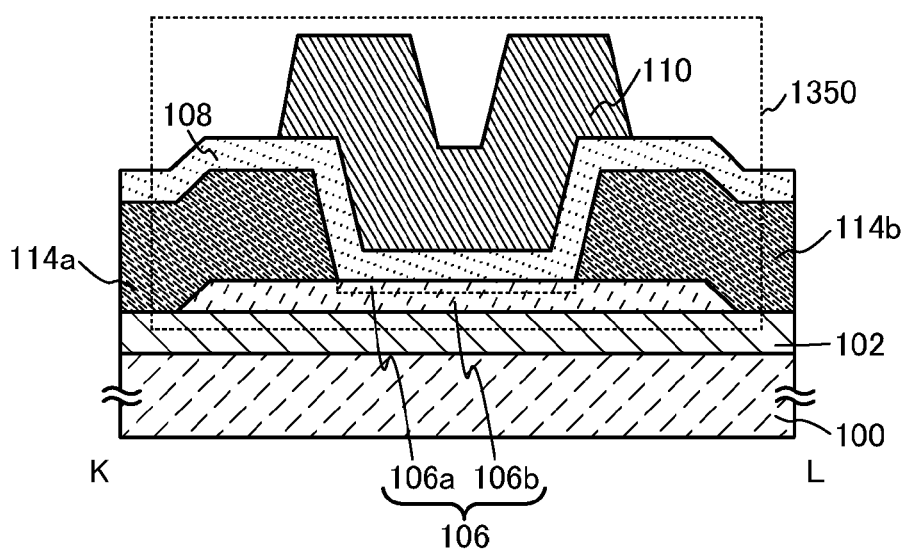

FIGS. 13A and 13B illustrate an example of a plan view and a cross-sectional view of a transistor having a top-gate structure, as an example of a semiconductor device. FIG. 13A is a plan view and FIG. 13B is a cross-sectional view taken along line K-L in FIG. 13A. Note that in FIG. 13A, some components (e.g., the substrate 100) of a transistor 1350 are omitted to avoid complexity.

The transistor 1350 illustrated in FIGS. 13A and 13B includes, over the substrate 100, the base film 102, the oxide semiconductor film 106, the source electrode 114a and the drain electrode 114b which are electrically connected to the oxide semiconductor film 106, the gate insulating film 108, and the gate electrode 110 which overlaps with at least the oxide semiconductor film 106.

The transistor 1350 is different from the transistor described in any of the above embodiments in that the gate insulating film 108 and the gate electrode 110 are formed over an entire part of a region of the oxide semiconductor film 106, which is between the source electrode 114a and the drain electrode 114b.

With the structure in which the gate insulating film is formed only over part of the region of the oxide semiconductor film 106, which is between the source electrode 114a and the drain electrode 114b as in the above embodiments, oxygen (excess oxygen in the gate insulating film 108) is released from an end of the gate insulating film 108 even if the gate insulating film 108 is a film which releases oxygen by heat treatment. Thus, an effect of reducing an oxygen vacancy in the oxide semiconductor film 106 might be reduced.

However, with the structure in which the gate insulating film 108 is formed over the entire surface of the oxide semiconductor film 106 as described in this embodiment, oxygen released by heat treatment can be prevented from being released from the end of the gate insulating film 108. Accordingly, the above-described problem can be solved.

<Manufacturing Process of Transistor 1350>

An example of a manufacturing process of the transistor 1350 illustrated in FIGS. 13A and 13B will be described with reference to FIGS. 14A to 14C.

Figure 14A:
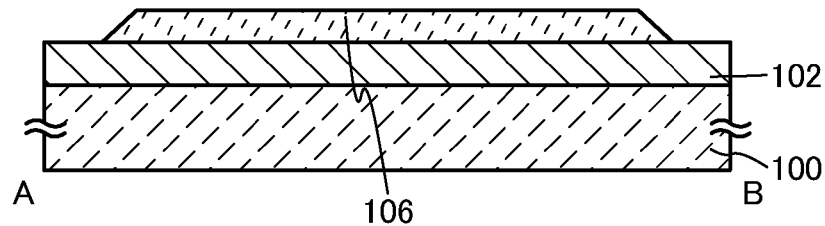
FIGS. 14A to 14C are cross-sectional views illustrating an example of a manufacturing process of a semiconductor device.

First, the base film 102 and the oxide semiconductor film 106 are formed over the substrate 100 (see FIG. 14A). Note that the step may be performed referring to FIGS. 2A to 2C and the description in the above embodiments which corresponds to the description of the drawings.

Figure 14B:
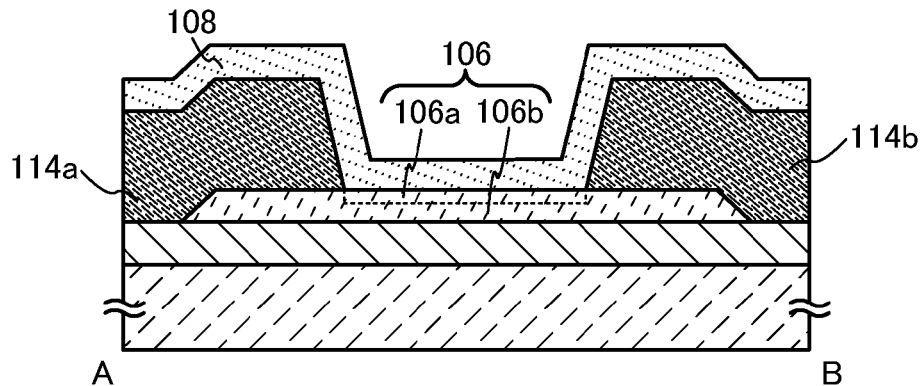

Next, the source electrode 114a and the drain electrode 114b which are in contact with the oxide semiconductor film 106 are formed, and the gate insulating film 108 is formed over the oxide semiconductor film 106, the source electrode 114a, and the drain electrode 114b (see FIG. 14B). Note that the formation of the source electrode 114a and the drain electrode 114b may be performed referring to FIG. 3D and the description thereof, and the formation of the gate insulating film 108 may be performed referring to FIG. 2D and the description thereof.

Figure 14C:
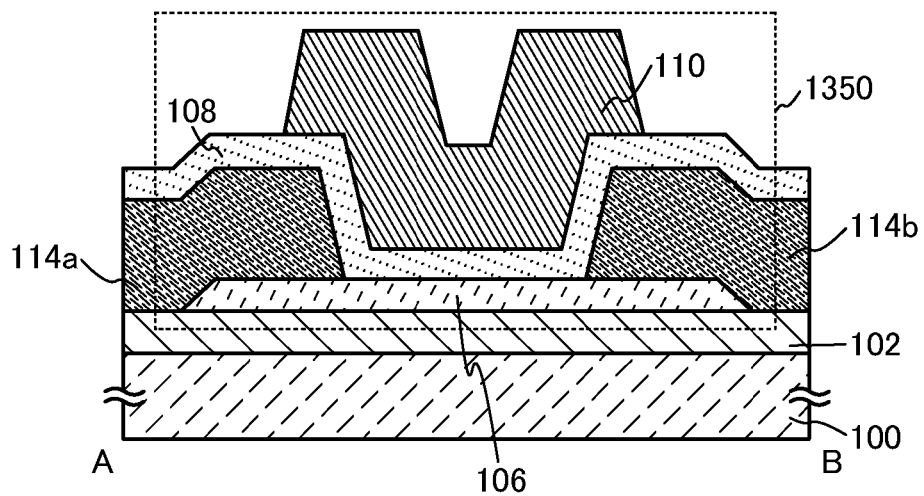

Then, the gate electrode 110 is formed in a region over the gate insulating film 108, which overlaps with the oxide semiconductor film 106 (see FIG. 14C). Note that the step may be performed referring to FIG. 3B and the description thereof.

Through the above-described steps, the transistor 1350 illustrated in FIG. 14C can be manufactured. In the transistor 1350, which includes the features described in Embodiment 1, an effect of reducing an oxygen vacancy can be enhanced because oxygen released from the gate insulating film 108 can be efficiently added to the oxide semiconductor film 106 when the gate insulating film 108 is formed as a film which releases oxygen by heat treatment, as described above.

Embodiment 6

In this embodiment, an example of a semiconductor device which includes the transistor described in any of Embodiments 1 to 5, which can hold stored data even when not powered, and which has an unlimited number of write cycles is described with reference to drawings.

Figure 15A:
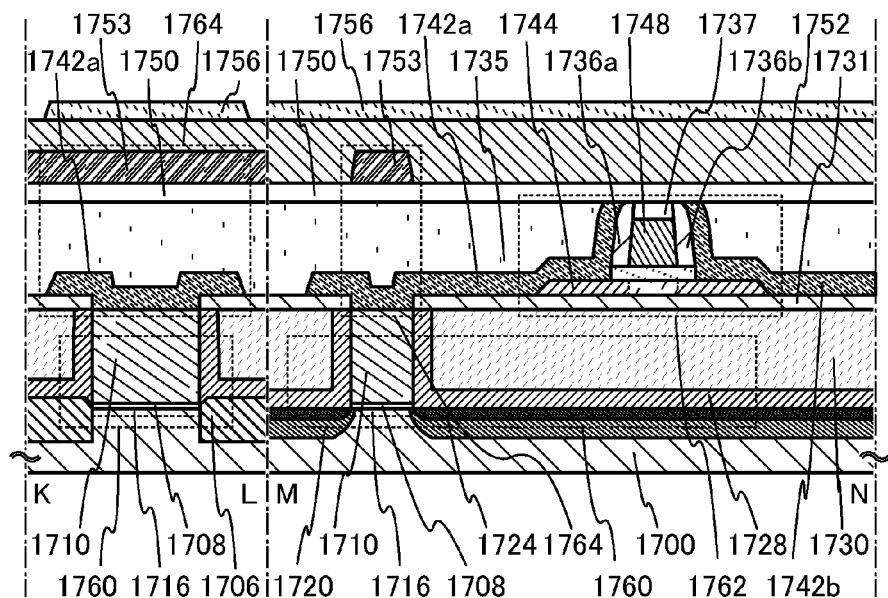
FIGS. 15A to 15C illustrate an example of a structure of a semiconductor device.
Figure 15B:
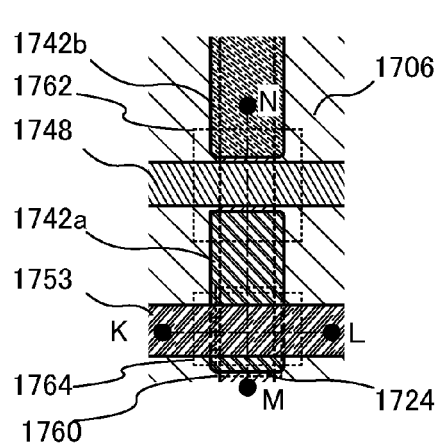
Figure 15C:
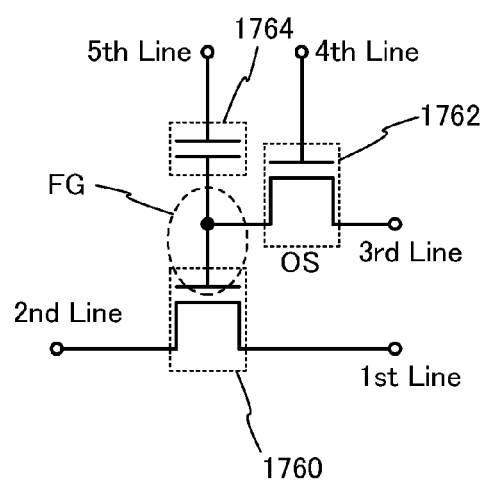

FIGS. 15A to 15C illustrate an example of a structure of a semiconductor device. FIG. 15A is a cross-sectional view of the semiconductor device, FIG. 15B is a plan view of the semiconductor device, and FIG. 15C is a circuit diagram of the semiconductor device. Here, FIG. 15A corresponds to a cross section along line K-L and line M-N in FIG. 15B.

The semiconductor device illustrated in FIGS. 15A and 15B includes a transistor 1760 including a first semiconductor material in a lower portion, and a transistor 1762 including a second semiconductor material in an upper portion. Any of the structures of the transistors described in the above embodiments can be employed for the transistor 1762. Here, description is made on the case where the transistor 1150 of Embodiment 4 is used.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, charge can be held in a transistor including an oxide semiconductor for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device.

The transistor 1760 in FIG. 15A includes a channel formation region 1716 provided in a substrate 1700 containing a semiconductor material (e.g., silicon), impurity regions 1720 provided so that the channel formation region 1716 is sandwiched therebetween, intermetallic compound regions 1724 in contact with the impurity regions 1720, a gate insulating film 1708 provided over the channel formation region 1716, and a gate electrode 1710 provided over the gate insulating film 1708. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode", and a drain region and a drain electrode are collectively referred to as a "drain electrode". That is, in this specification, the term "source electrode" may include a source region.

Further, an element isolation insulating layer 1706 is formed over the substrate 1700 to surround the transistor 1760, and an insulating layer 1728 and an insulating layer 1730 are formed to cover the transistor 1760. Note that, in the transistor 1760, the sidewall insulating layers may be formed on side surfaces of the gate electrode 1710 and the impurity regions 1720 may include a region having a different impurity concentration.

The transistor 1760 formed using a single crystal semiconductor substrate can operate at high speed. Thus, when the transistor is used as a reading transistor, data can be read at a high speed. Two insulating films are formed to cover the transistor 1760. As treatment prior to formation of the transistor 1762 and a capacitor 1764, CMP treatment is performed on the two insulating films, whereby an insulating layer 1728 and an insulating layer 1730 which are planarized are formed and, at the same time, the top surface of the gate electrode 1710 is exposed.

As each of the insulating layer 1728 and the insulating layer 1730, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 1728 and the insulating layer 1730 can be formed by a plasma CVD method, a sputtering method, or the like.

Alternatively, an organic material such as a polyimide resin, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 1728 and the insulating layer 1730.

Note that in this embodiment, a silicon nitride film is used as the insulating layer 1728, and a silicon oxide film is used as the insulating layer 1730.

Planarization treatment is preferably performed on the surface of the insulating layer 1730 in the formation region of the oxide semiconductor film 1744. In this embodiment, a base film 1731 is formed over the insulating layer 1730 sufficiently planarized (the average surface roughness of the surface of the insulating layer 1730 is preferably less than or equal to 0.15 nm) by polishing treatment (such as CMP treatment) and the oxide semiconductor film 1744 is formed over the base film 1731. As the base film 1731, as described in the above embodiment, a single layer or a stack of an oxide film having crystallinity is used. The oxide film used as the base film 1731 preferably contains indium (In) and zinc (Zn) which are constituent elements of the oxide semiconductor film 1744 to reduce lattice mismatch with the oxide semiconductor film 1744. When these materials are contained, the oxide semiconductor film 1744 can be the oxide semiconductor film 1744 having crystallinity in a large region in the thickness direction from the vicinity of the interface with the base film 1731. It is preferable that one or more selected from zirconium (Zr), yttrium (Y), and cerium (Ce) be additionally contained. Accordingly, the conductivity of the base film 1731 can be reduced and thus carriers flowing between the source electrode and the drain electrode selectively flow in the oxide semiconductor film 1744 without being affected by the base film 1731.

The transistor 1762 illustrated in FIG. 15A includes an oxide semiconductor in the channel formation region. Here, an oxide semiconductor film 1744 included in the transistor 1762 is preferably highly purified by removing impurities such as moisture and hydrogen as much as possible, as described in the above embodiment. Further, the oxide semiconductor film in which oxygen vacancies are sufficiently repaired is preferable. By using such an oxide semiconductor, the transistor 1762 which has extremely favorable off-state current characteristics can be obtained.

Since the off-state current of the transistor 1762 is extremely small, stored data can be held for a long time owing to such a transistor. In other words, power consumption can be sufficiently reduced because a semiconductor device in which refresh operation is unnecessary or the frequency of refresh operation is extremely low can be provided.

In the process for manufacturing the transistor 1762, a conductive film over a gate electrode 1748, an insulating film 1737, a sidewall insulating film 1736a, and a sidewall insulating film 1736b is removed by chemical mechanical polishing treatment to form an electrode film 1742a and an electrode film 1742b which function as a source electrode and a drain electrode.

Accordingly, in the transistor 1762, the Loff width can be narrow; thus, the on-state characteristics of the transistor 1762 can be improved.

Further, precise processing can be performed accurately because an etching step using a resist mask is not performed in a step for removing the conductive film over the gate electrode 1748, which is one step of the formation process of the electrode film 1742a and the electrode film 1742b. Consequently, in a process for manufacturing the semiconductor device, a transistor having a miniaturized structure with less variation in shape or characteristics can be manufactured with high yield.

An interlayer insulating film 1735 and an insulating film 1750 each of which has a single-layer structure or a stacked-layer structure are provided over the transistor 1762. In this embodiment, an aluminum oxide film is used as the insulating film 1750. When the aluminum oxide film has high density (the film density is higher than or equal to 3.2 g/cm$^3$, preferably higher than or equal to 3.6 g/cm$^3$), the transistor 1762 can have stable electrical characteristics.

In addition, a conductive layer 1753 is provided in a region overlapping with the electrode film 1742a of the transistor 1762 with the interlayer insulating film 1735 and the insulating film 1750 interposed therebetween, and the electrode film 1742a, the interlayer insulating film 1735, the insulating film 1750, and the conductive layer 1753 form a capacitor 1764. That is, the electrode film 1742a of the transistor 1762 functions as one electrode of the capacitor 1764, and the conductive layer 1753 functions as the other electrode of the capacitor 1764. Note that the capacitor 1764 may be omitted if a capacitor is not needed. Alternatively, the capacitor 1764 may be separately provided above the transistor 1762.

An insulating film 1752 is provided over the transistor 1762 and the capacitor 1764. In addition, a wiring 1756 for connecting the transistor 1762 to another transistor is provided over the insulating film 1752. Although not illustrated in FIG. 15A, the wiring 1756 is electrically connected to the electrode film 1742b through an electrode formed in an opening provided in the interlayer insulating film 1735, the insulating film 1750, the insulating film 1752, and the like.

Here, the electrode is preferably provided to partly overlap with at least part of the oxide semiconductor film 1744 of the transistor 1762.

In FIGS. 15A and 15B, the transistor 1760 is provided to overlap with at least part of the transistor 1762. The source region or the drain region of the transistor 1760 is preferably provided to overlap with part of the oxide semiconductor film 1744. Further, the transistor 1762 and the capacitor 1764 are provided to overlap with at least part of the transistor 1760. For example, the conductive layer 1753 of the capacitor 1764 is provided to overlap with at least part of the gate electrode 1710 of the transistor 1760. With such a planar layout, the area occupied by the semiconductor device can be reduced; thus, higher integration can be achieved.

Note that the electrical connection between the electrode film 1742b and the wiring 1756 may be established by contacting the electrode film 1742b with the wiring 1756 directly or may be established through an electrode provided in an insulating layer which is between the electrode film 1742b and the wiring 1756. Alternatively, the electrical connection may be established through a plurality of electrodes.

Next, an example of a circuit configuration corresponding to FIGS. 15A and 15B is illustrated in FIG. 15C.

In FIG. 15C, a first line (1st Line) is electrically connected to a source electrode of the transistor 1760. A second line (2nd Line) is electrically connected to a drain electrode of the transistor 1760. A third line (3rd line) and one of a source electrode and a drain electrode of the transistor 1762 are electrically connected to each other, and a fourth line (4th line) and a gate electrode of the transistor 1762 are electrically connected to each other. A gate electrode of the transistor 1760 and the other of the source electrode and the drain electrode of the transistor 1762 are electrically connected to one of electrodes of a capacitor 1764, and a fifth line (5th line) and the other of the electrodes of the capacitor 1764 are electrically connected to each other.

The semiconductor device in FIG. 15C utilizes a characteristic in which the potential of the gate electrode of the transistor 1760 can be held, and thus enables data writing, holding, and reading as follows.

Writing and holding of data are described. First, the potential of the fourth line is set to a potential at which the transistor 1762 is turned on, so that the transistor 1762 is turned on. Accordingly, the potential of the third line is supplied to the gate electrode of the transistor 1760 and the capacitor 1764. That is, predetermined charge is given to the gate electrode of the transistor 1760 (writing). Here, charge for supply of a potential level or charge for supply of a different potential level (hereinafter referred to as low level charge and high level charge) is given. After that, the potential of the fourth line is set to a potential at which the transistor 1762 is turned off, so that the transistor 1762 is turned off. Thus, the charge given to the gate electrode of the transistor 1760 is held (holding).

Since the off-state current of the transistor 1762 is extremely low, the charge of the gate electrode of the transistor 1760 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 1760. This is because in general, when the transistor 1760 is an n-channel transistor, an apparent threshold voltage $V_{th\_H}$ in the case where a high level charge is given to the gate electrode of the transistor 1760 is lower than an apparent threshold voltage $V_{th\_L}$ in the case where a low level charge is given to the gate electrode of the transistor 1760. Here, an apparent threshold voltage refers to the potential of the fifth line, which is needed to turn on the transistor 1760. Thus, the potential of the fifth line is set to a potential $V_0$ which is between $V_{th\_H}$ and $V_{th\_L}$, whereby charge given to the gate electrode of the transistor 1760 can be determined. For example, in the case where a high level charge is given in writing, when the potential of the fifth wiring is set to $V_0$ ($>V_{th\_H}$), the transistor 1760 is turned on. In the case where a low level charge is given in writing, even when the potential of the fifth wiring is set to $V_0$ ($<V_{th\_L}$), the transistor 1760 remains in an off state. Thus, the stored data can be read by the potential of the second line.

Note that in the case where memory cells are arrayed to be used, only data of desired memory cells needs to be read. In the case of a memory cell in which reading is not performed, a potential at which the transistor 1760 is turned off, that is, a potential smaller than $V_{th\_H}$ may be given to the fifth wiring regardless of the state of the gate electrode of the transistor 1760. Alternatively, a potential which allows the transistor 1760 to be turned on regardless of a state of the gate electrode, that is, a potential higher than $V_{th\_L}$ may be applied to the fifth lines.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to an embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electrical characteristics and a method for manufacturing the semiconductor device can be provided.

The structures, methods, and the like which are described in this embodiment can be combined as appropriate with any of the structures, methods, and the like which are described in the other embodiments.

Embodiment 7

In this embodiment, a semiconductor device which includes the transistor described in any of Embodiments 1 to 5, which can hold stored data even when not powered, and which does not have a limitation on the number of write cycles, and which has a structure different from the structure described in Embodiment 6 is described with reference to FIGS. 16A and 16B and FIGS. 17A and 17B.

Figure 16A:
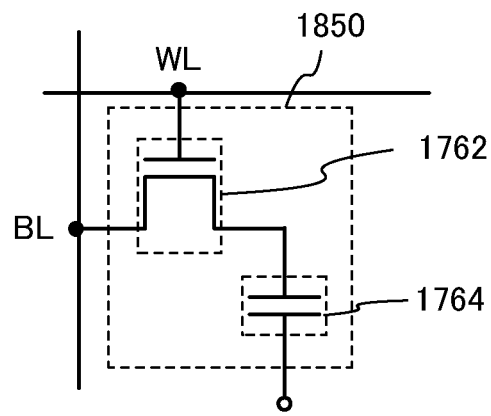
FIGS. 16A and 16B illustrate an example of a structure of a semiconductor device.
Figure 16B:
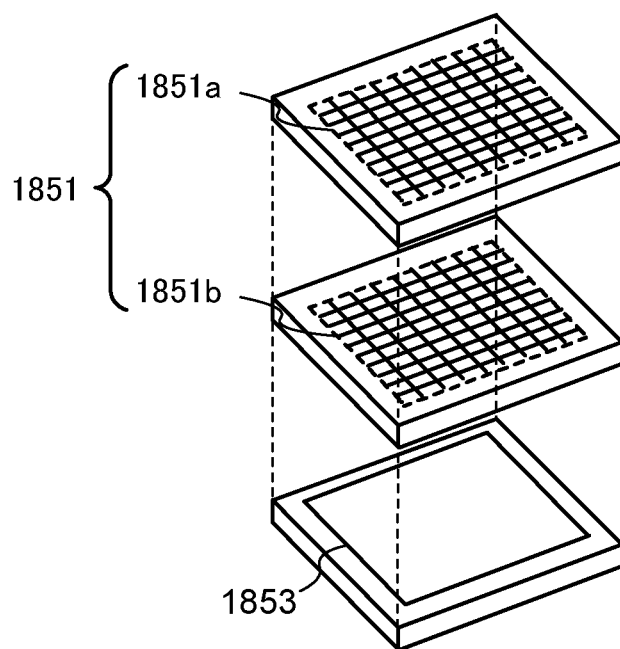

FIG. 16A illustrates an example of a circuit configuration of a semiconductor device, and FIG. 16B is a conceptual diagram illustrating an example of a semiconductor device. First, the semiconductor device illustrated in FIG. 16A is described, and then, the semiconductor device illustrated in FIG. 16B is described below.

In the semiconductor device illustrated in FIG. 16A, a bit line BL is electrically connected to the source electrode or the drain electrode of the transistor 1762, a word line WL is electrically connected to the gate electrode of the transistor 1762, and the source electrode or the drain electrode of the transistor 1762 is electrically connected to a first terminal of a capacitor 1764.

Next, writing and holding of data in the semiconductor device (a memory cell 1850) illustrated in FIG. 16A are described.

First, the potential of the word line WL is set to a potential at which the transistor 1762 is turned on, and the transistor 1762 is turned on. Accordingly, the potential of the bit line BL is supplied to the first terminal of the capacitor 1764 (writing). After that, the potential of the word line WL is set to a potential at which the transistor 1762 is turned off, so that the transistor 1762 is turned off. Thus, the potential at the first terminal of the capacitor 1764 is held (holding).

The transistor 1762 including an oxide semiconductor has extremely low off-state current. For that reason, a potential of the first terminal of the capacitor 1764 (or a charge accumulated in the capacitor 1764) can be held for an extremely long period by turning off the transistor 1762.

Secondly, reading of data is described. When the transistor 1762 is turned on, the bit line BL which is in a floating state and the capacitor 1764 are electrically connected to each other, and the charge is redistributed between the bit line BL and the capacitor 1764. As a result, the potential of the bit line BL is changed. The amount of change in potential of the bit line BL varies depending on the potential of the first terminal of the capacitor 1764 (or the charge accumulated in the capacitor 1764).

For example, the potential of the bit line BL after charge redistribution is $(C_B \times V_{BO} + C \times V)/(C_B + C)$, where V is the potential of the first terminal of the capacitor 1764, C is the capacitance of the capacitor 1764, $C_B$ is the capacitance of the bit line BL (hereinafter also referred to as bit line capacitance), and $V_{BO}$ is the potential of the bit line BL before the charge redistribution. Thus, it can be found that assuming that the memory cell 1850 is in either of two states in which the potentials of the first terminal of the capacitor 1764 are $V_1$ and $V_0$ ($V_1 > V_0$), the potential of the bit line BL in the case of holding the potential $V_1$ ($=(C_B \times V_{BO} + C \times V_1)/(C_B + C)$) is higher than the potential of the bit line BL in the case of holding the potential $V_0$ ($=(C_B \times V_{BO} + C \times V_0)/(C_B + C)$).

Then, by comparing the potential of the bit line BL with a predetermined potential, data can be read.

As described above, the semiconductor device illustrated in FIG. 16A can hold charge that is accumulated in the capacitor 1764 for a long time because the off-state current of the transistor 1762 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 16B is described.

The semiconductor device illustrated in FIG. 16B includes memory cell arrays 1851*a* and 1851*b* including a plurality of memory cells 1850 illustrated in FIG. 16A as memory circuits in the upper portion, and a peripheral circuit 1853 in the lower portion which is necessary for operating a memory cell array 1851 (the memory cell arrays 1851a and 1851b). Note that the peripheral circuit 1853 is electrically connected to the memory cell array 1851.

In the structure illustrated in FIG. 16B, the peripheral circuit 1853 can be provided under the memory cell array 1851 (the memory cell arrays 1851a and 1851b). Thus, the size of the semiconductor device can be decreased.

It is preferable that a semiconductor material of the transistor provided in the peripheral circuit 1853 be different from that of the transistor 1762. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Thus, a variety of circuits (e.g., a logic circuit or a driver circuit) which needs to operate at high speed can be favorably realized by the transistor.

Note that FIG. 16B illustrates, as an example, the semiconductor device in which two memory cell arrays 1851 (the memory cell array 1851a and the memory cell array 1851b) are stacked; however, the number of memory cell arrays to be stacked is not limited thereto. Three or more memory cell arrays may be stacked.

Next, a specific structure of the memory cell 1850 illustrated in FIG. 16A is described with reference to FIGS. 17A and 17B.

Figure 17A:
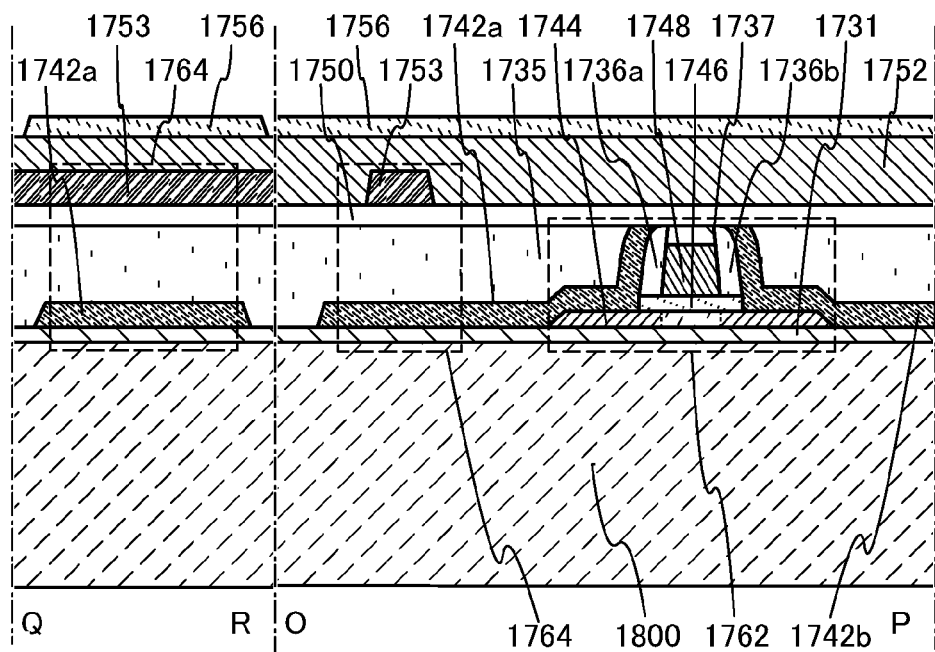
FIGS. 17A and 17B illustrate an example of a structure of a semiconductor device.
Figure 17B:
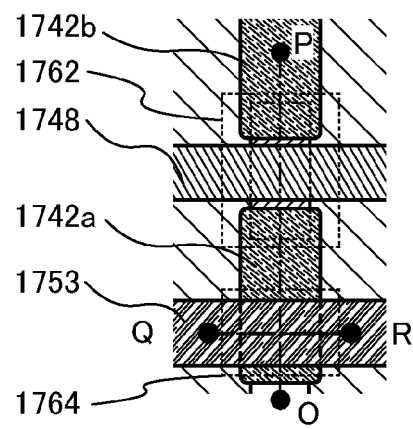

FIGS. 17A and 17B illustrate an example of a structure of the memory cell 1850. FIG. 17A is a cross-sectional view of the memory cell 1850, and FIG. 17B is a plan view of the memory cell 1850. Here, FIG. 17A illustrates a cross section taken along line O-P and line Q-R in FIG. 17B.

The transistor 1762 in FIGS. 17A and 17B can have the same structure as the transistor in any of Embodiments 1 to 5. That is, as the base film 1731 provided over a substrate 1800, as described in the above embodiment, a single layer or a stack of an oxide film having crystallinity is used. The oxide film used as the base film 1731 preferably contains indium (In) and zinc (Zn) which are constituent elements of the oxide semiconductor film 1744 to reduce lattice mismatch with the oxide semiconductor film 1744. When these materials are contained, the oxide semiconductor film 1744 can be the oxide semiconductor film 1744 having crystallinity in a large region in the thickness direction from the vicinity of the interface with the base film 1731. It is preferable that one or more selected from zirconium (Zr), yttrium (Y), and cerium (Ce) be contained in addition to In and Zn. Thus, the conductivity of the base film 1731 can be reduced and thus carriers flowing between the source electrode and the drain electrode selectively flow in the oxide semiconductor film 1744 without being affected by the base film 1731.

An insulating film 1750 having a single-layer structure or a stacked-layer structure is provided over the transistor 1762. In addition, a conductive layer 1753 is provided in a region overlapping with the electrode film 1742a of the transistor 1762 with the insulating film 1750 interposed therebetween, and the electrode film 1742a, the interlayer insulating film 1735, the insulating film 1750, and the conductive layer 1753 form a capacitor 1764. That is, the electrode film 1742a of the transistor 1762 functions as one electrode of the capacitor 1764, and the conductive layer 1753 functions as the other electrode of the capacitor 1764.

An insulating film 1752 is provided over the transistor 1762 and the capacitor 1764. Further, the memory cell 1850 and a wiring 1756 for connecting the adjacent memory cells 1850 are provided over the insulating film 1752. Although not illustrated, the wiring 1756 is electrically connected to the electrode film 1742b of the transistor 1762 through an opening provided in the insulating film 1750, the insulating film 1752, the interlayer insulating film 1735, and the like. The wiring 1756 may be electrically connected to the electrode film 1742b through another conductive layer provided in the opening. Note that the wiring 1756 corresponds to the bit line BL in the circuit diagram of FIG. 16A.

In FIGS. 17A and 17B, the electrode film 1742b of the transistor 1762 can also function as a source electrode of a transistor included in an adjacent memory cell. With such a planar layout, the area occupied by the semiconductor device can be reduced; thus, higher integration can be achieved.

When the planar layout illustrated in FIG. 17A is employed, the area occupied by the semiconductor device can be reduced; thus, the degree of integration can be increased.

As described above, the plurality of memory cells is formed in the upper portion with the transistors including an oxide semiconductor. Since the off-state current of the transistor including an oxide semiconductor is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electrical characteristics and a method for manufacturing the semiconductor device can be provided.

This embodiment can be implemented in appropriate combination with the structures described in the other embodiments.

Embodiment 8

In this embodiment, examples of application of the semiconductor device described in any of the above embodiments to portable devices such as cellular phones, smartphones, or electronic books are described with reference to FIGS. 18A and 18B, FIG. 19, FIG. 20, and FIG. 21.

In a portable device such as a cellular phone, a smartphone, or an e-book reader, an SRAM or a DRAM is used to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 18A:
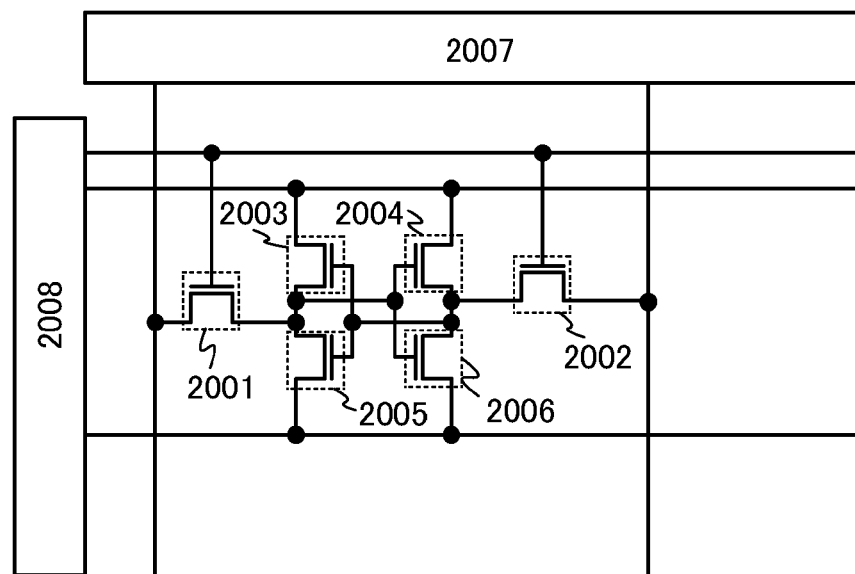
FIGS. 18A and 18B each illustrate an example of a structure of a semiconductor device.

In an ordinary SRAM, as illustrated in FIG. 18A, one memory cell includes six transistors, that is, transistors 2001 to 2006, which are driven with an X decoder 2007 and a Y decoder 2008. The transistor 2003 and the transistor 2005, and the transistor 2004 and the transistor 2006 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Thus, the price per bit of an SRAM is the most expensive among memory devices.

Figure 18B:
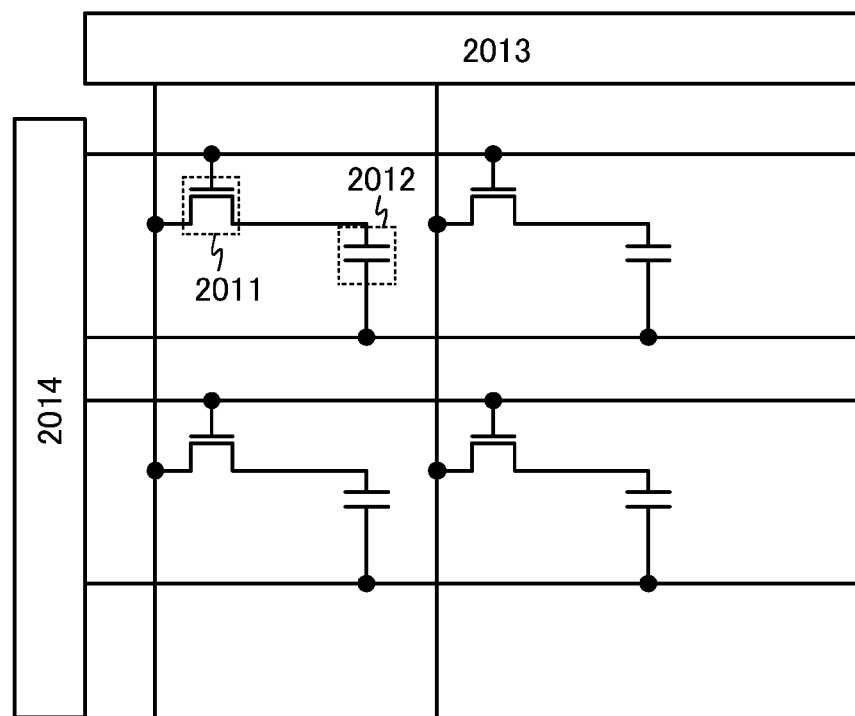

In a DRAM, as illustrated in FIG. 18B, a memory cell includes a transistor 2011 and a storage capacitor 2012, which are driven with an X decoder 2013 and a Y decoder 2014. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Thus, the area of a memory cell can be decreased, and power consumption can be reduced.

Figure 19:
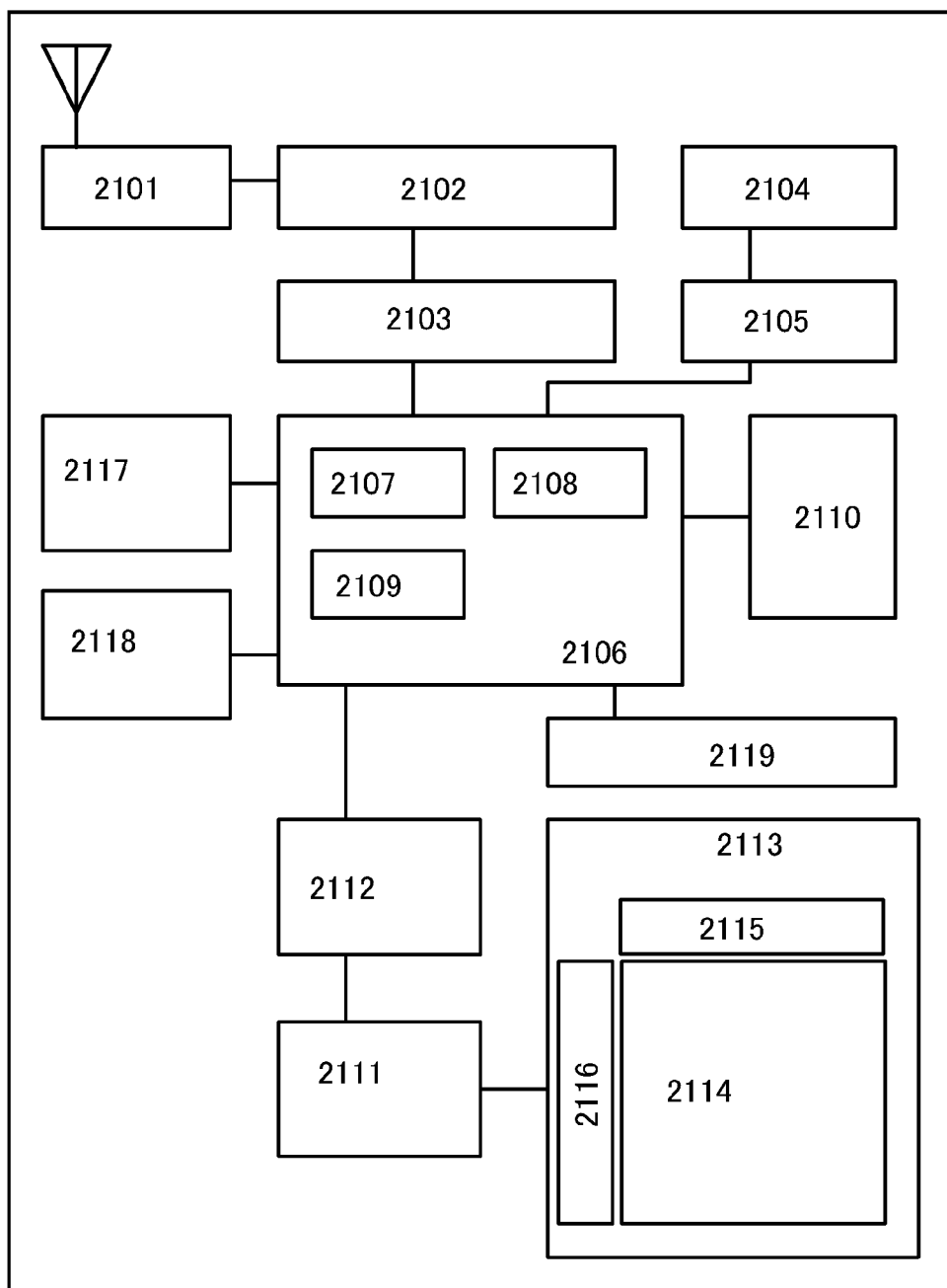
FIG. 19 illustrates an example of a structure of a semiconductor device.

Next, FIG. 19 is a block diagram of a portable device. The portable device illustrated in FIG. 19 includes an RF circuit 2101, an analog baseband circuit 2102, a digital baseband circuit 2103, a battery 2104, a power supply circuit 2105, an application processor 2106, a flash memory 2110, a display controller 2111, a memory circuit 2112, a display 2113, a touch sensor 2119, an audio circuit 2117, a keyboard 2118, and the like. The display 2113 includes a display portion 2114, a source driver 2115, and a gate driver 2116. The application processor 2106 includes a CPU 2107, a DSP 2108, and an interface (IF) 2109. In general, the memory circuit 2112 includes an SRAM or a DRAM. By employing the semiconductor device described in any of the above embodiments for that portion, data can be written and read at high speed and can be held for a long time, and power consumption can be sufficiently reduced.

Figure 20:
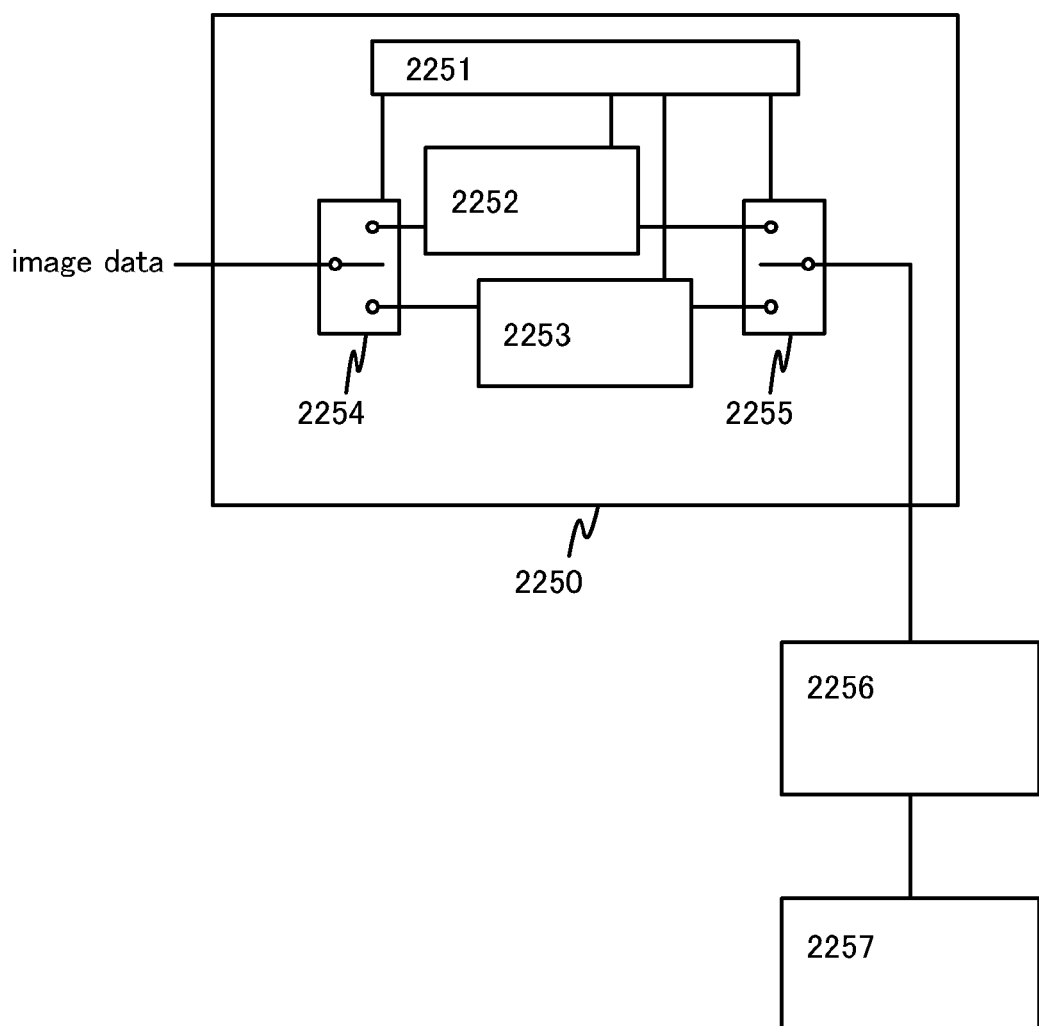
FIG. 20 illustrates an example of a structure of a semiconductor device.

FIG. 20 illustrates an example of using the semiconductor device described in any of the above embodiments in a memory circuit 2250 for a display. The memory circuit 2250 illustrated in FIG. 20 includes a memory 2252, a memory 2253, a switch 2254, a switch 2255, and a memory controller 2251. The memory circuit is connected to a display controller 2256 that reads and controls image data input through a signal line (input image data) and data stored in the memory 2252 and the memory 2253 (stored image data), and is also connected to a display 2257 that displays an image based on a signal input from the display controller 2256.

First, image data (input image data A) is produced by an application processor (not illustrated). The input image data A is stored in the memory 2252 through the switch 2254. Then, the image data stored in the memory 2252 (stored image data A) is transmitted to the display 2257 through the switch 2255 and the display controller 2256, and is displayed on the display 2257.

When the input image data A remains unchanged, the stored image data A is read from the memory 2252 through the switch 2255 by the display controller 2256 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 2253 through the switch 2254. Also during that time, the stored image data A is regularly read from the memory 2252 through the switch 2255. After the completion of storing the new image data (the stored image data B) in the memory 2253, from the next frame for the display 2257, the stored image data B starts to be read, transmitted to the display 2257 through the switch 2255 and the display controller 2256, and is displayed on the display 2257. This reading operation continues until the next new image data is stored in the memory 2252.

By alternately writing and reading image data to and from the memory 2252 and the memory 2253 as described above, images are displayed on the display 2257. Note that the memory 2252 and the memory 2253 are not limited to separate memories, and a single memory may be divided and used. By employing the semiconductor device described in any of the above embodiments for the memory 2252 and the memory 2253, data can be written and read at high speed and held for a long time, and power consumption can be sufficiently reduced.

Figure 21:
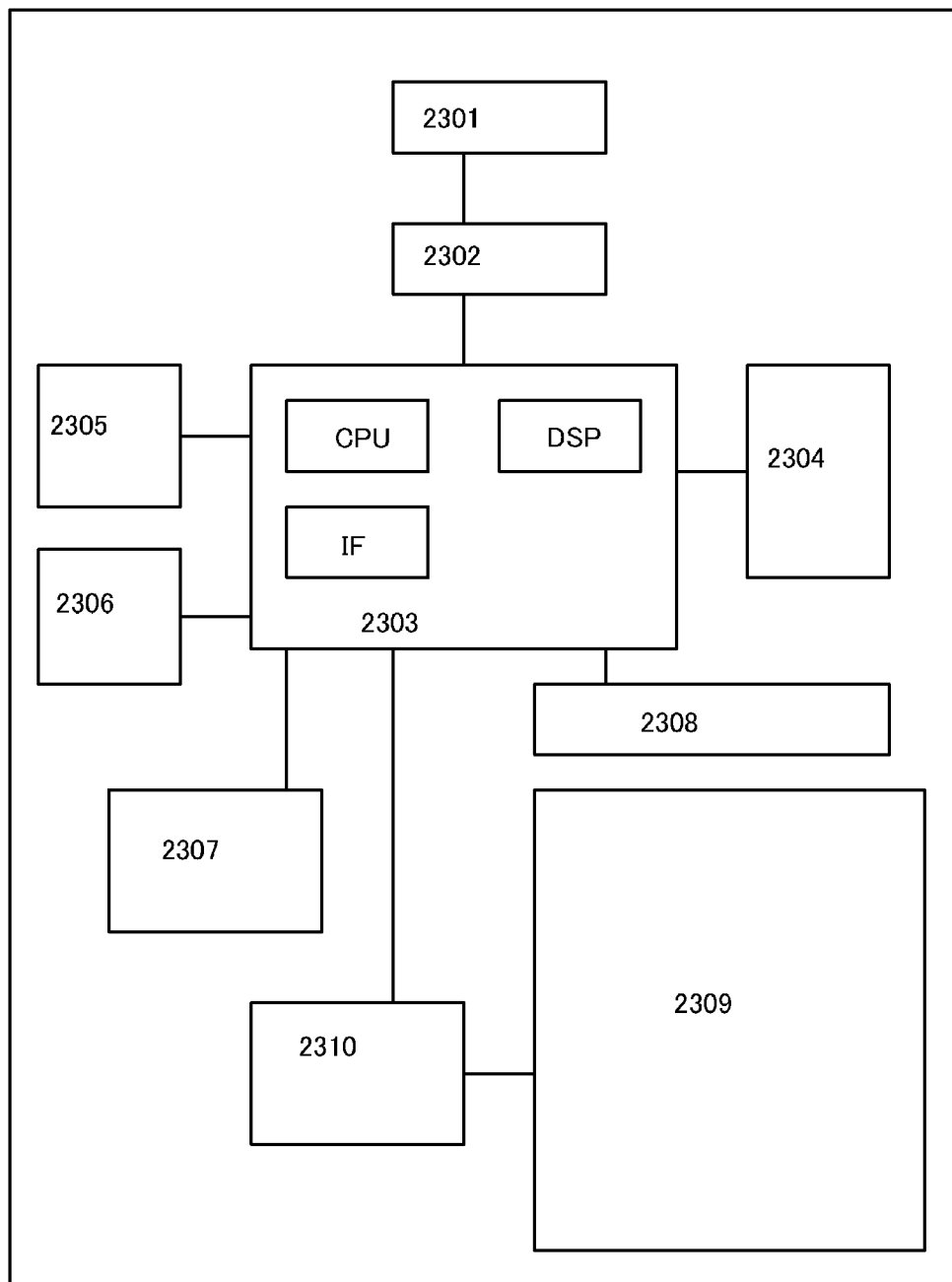
FIG. 21 illustrates an example of a structure of a semiconductor device.

FIG. 21 is a block diagram of an e-book reader. FIG. 21 includes a battery 2301, a power supply circuit 2302, a microprocessor 2303, a flash memory 2304, an audio circuit 2305, a keyboard 2306, a memory circuit 2307, a touch panel 2308, a display 2309, and a display controller 2310.

Here, the semiconductor device described in any of the above embodiments can be used for the memory circuit 2307 in FIG. 21. The memory circuit 2307 has a function of temporarily storing the contents of a book. For example, a user may use a highlight function. In some cases, a user wants to mark a specific portion while reading an e-book reader. This marking function is called a highlight function and is used to make a difference from the other portions by changing the display color, underlining, making characters bold, changing the font of characters, or the like. The function makes it possible to store and hold data of a portion specified by a user. To store the data for a long time, the data may be copied to the flash memory 2304. Also in such a case, the semiconductor device described in any of the above embodiments is used, whereby writing and reading of data can be performed at high speed, data can be stored for a long time, and power consumption can be sufficiently reduced.

As described above, the portable devices described in this embodiment each incorporate the semiconductor device according to any of the above embodiments. Thus, it is possible to obtain a portable device which is capable of reading data at high speed, holding data for a long time, and reducing power consumption.

The structures, methods, and the like which are described in this embodiment can be combined as appropriate with any of the structures, methods, and the like which are described in the other embodiments.

Embodiment 9

A semiconductor device disclosed in this specification and the like can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 22A:
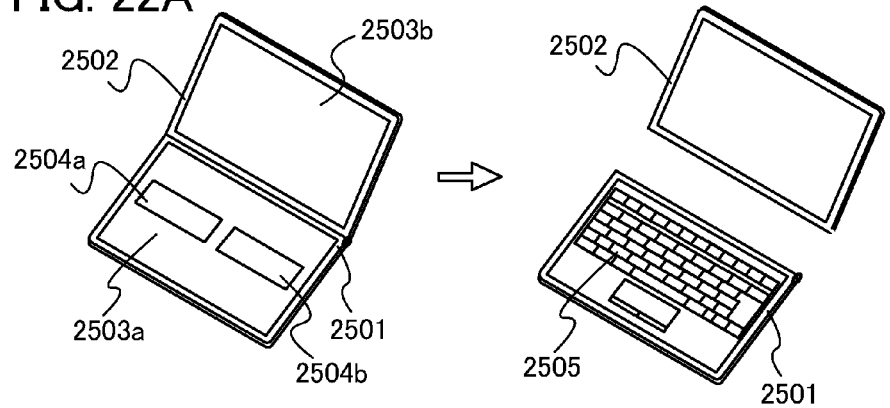
FIGS. 22A to 22E each illustrate an electronic device.

FIG. 22A illustrates a portable information terminal, which includes a housing 2501, a housing 2502, a first display portion 2503a, a second display portion 2503b, and the like. A variety of electronic components (e.g. CPU, MPU, and a memory element) are incorporated inside the housing 2501 and the housing 2502. Further, electronic circuits (e.g., a driver circuit and a selection circuit) necessary for displaying an image are mounted on the first display portion 2503a and the second display portion 2503b. The semiconductor device described in any of the above embodiments is applied to the electronic components or the electronic circuits, whereby a highly reliable portable information terminal can be obtained. Note that the semiconductor device described in any of the above embodiments may be provided in at least one of the housing 2501 and the housing 2502.

At least one of the first display portion 2503a and the second display portion 2503b is a touch panel, and for example, as illustrated in a left part of FIG. 22A, which of "touch input" and "keyboard input" is performed can be selected by selection buttons 2504a and 2504b displayed on the first display portion 2503a. Since the selection buttons with a variety of sizes can be displayed, the portable information terminal can be easily used by people of any generation. In the case where "keyboard input" is selected, for example, a keyboard 2505 is displayed on the first display portion 2503a as illustrated in a right part of FIG. 22A. With the keyboard 2505, letters can be input quickly by keyboard input as in the case of using a conventional information terminal, for example.

Further, the housing 2501 and the housing 2502 of the portable information terminal in FIG. 22A can be separated as illustrated in the right part of FIG. 22A. This structure enables very convenient operations; for example, screen data can be controlled from the housing 2501 while the screen data is shared by a plurality of people with the housing 2502 hung on a wall. Note that in the case where the device is not in use, the housing 2501 and the housing 2502 are preferably made to overlap with each other so that the first display portion 2503a faces the second display portion 2503b. In this manner, the first display portion 2503a and the second display portion 2503b can be protected from an external shock. The second display portion 2503b can also function as a touch panel for a reduction in weight to carry around to be operated by one hand while the other hand supports the housing 2502, which is very convenient.

The portable information terminal illustrated in FIG. 22A can have a function of displaying a variety of kinds of information (e.g., a still image, a moving image, and a text image), a function of displaying a calendar, a date, the time, or the like on the display portion, a function of operating or editing the information displayed on the display portion, a function of controlling processing by a variety of kinds of software (programs), and the like. Further, an external connection terminal (an earphone terminal, a USB terminal, or the like), a recording medium insertion portion, and the like may be provided on the back surface or the side surface of the housing.

The portable information terminal illustrated in FIG. 22A may transmit and receive data wirelessly. Through wireless communication, desired book data or the like can be purchased and downloaded from an electronic book server.

Further, the housing 2501 and the housing 2502 illustrated in FIG. 22A may be equipped with an antenna, a microphone function, or a wireless communication function of being used as a mobile phone.

Figure 22B:
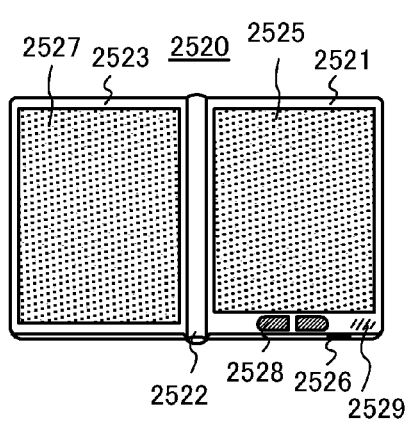

FIG. 22B illustrates an example of an e-book reader. For example, an e-book reader 2520 includes two housings, a housing 2521 and a housing 2523. The housing 2521 and the housing 2523 are combined with a hinge 2522 so that the e-book reader 2520 can be opened and closed with the hinge 2522 as an axis. With such a structure, the e-book reader 2520 can operate like a paper book.

A display portion 2525 and a display portion 2527 are incorporated in the housing 2521 and the housing 2523, respectively. The display portion 2525 and the display portion 2527 may display one image or different images. In the case where the display portion 2525 and the display portion 2527 display different images, for example, a display portion on the right side (the display portion 2525 in FIG. 22B) can display text and a display portion on the left side (the display portion 2527 in FIG. 22B) can display images. By applying the semiconductor device described in any of the above embodiments, the e-book reader 2520 can have high reliability.

In FIG. 22B, the housing 2521 includes an operation portion and the like as an example. For example, the housing 2521 is provided with a power switch 2526, an operation key 2528, a speaker 2529, and the like. With the operation key 2528, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2520 may have a function of an electronic dictionary.

The e-book reader 2520 may have a configuration capable of wirelessly transmitting and receiving data. Through wireless communication, desired book data or the like can be purchased and downloaded from an electronic book server.

Figure 22C:
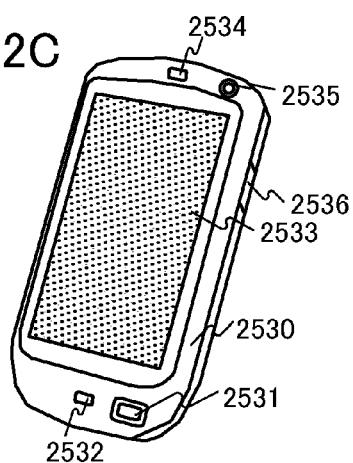

FIG. 22C illustrates a smartphone, which includes a housing 2530, a button 2531, a microphone 2532, a display portion 2533 provided with a touch panel, a speaker 2534, and a camera lens 2535 and functions as a mobile phone. By applying the semiconductor device described in any of the above embodiments, the smartphone can have high reliability.

The display direction of the display portion 2533 can be changed depending on a usage pattern. Since the camera lens 2535 is provided on the same plane as the display portion 2533, videophone is possible. The speaker 2534 and the microphone 2532 can be used for operations such as video calls, sound recording, and playback without being limited to the voice call function.

An external connection terminal 2536 can be connected to an AC adapter and a variety of types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 22D:
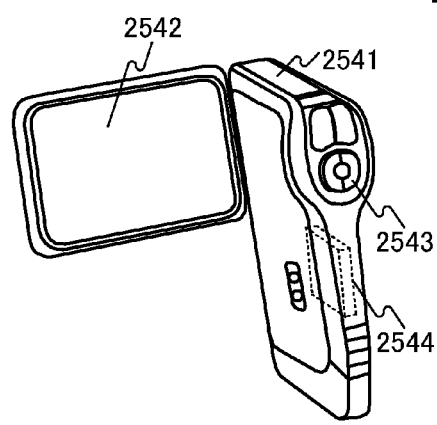

FIG. 22D illustrates a digital video camera which includes a main body 2541, a display portion 2542, an operation switch 2543, a battery 2544, and the like. By applying the semiconductor device described in any of the above embodiments, the digital video camera can have high reliability.

Figure 22E:
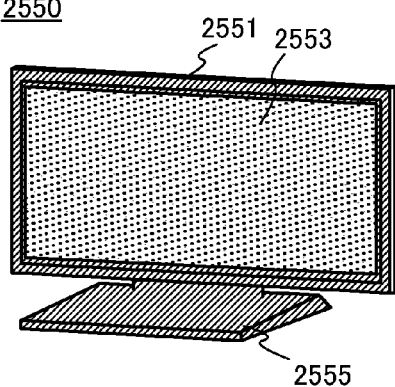

FIG. 22E illustrates an example of a television set. In a television set 2550, a display portion 2553 is incorporated in a housing 2551. The display portion 2553 can display images. Here, the housing 2551 is supported by a stand 2555. By applying the semiconductor device described in any of the above embodiments, the television set 2550 can have high reliability.

The television set 2550 can be operated by an operation switch of the housing 2551 or a separate remote controller. Further, the remote controller may be provided with a display portion for displaying data output from the remote controller.

Note that the television set 2550 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like which are described in this embodiment can be combined as appropriate with any of the structures, methods, and the like which are described in the other embodiments.

Example 1

In this example, described are structural analysis results obtained by X-ray diffraction (XRD), of an In—Y—Zn—O film, an In—Zr—Zn—O film, and an In—Ce—Zn—O film each of which was formed as an oxide film containing indium and zinc used that is as a base film, over a quartz substrate with the use of a sputtering apparatus.

<XRD Measurement Results of In—Y—Zn—O Film>

The In—Y—Zn—O films were formed using three kinds of targets having composition ratios of In:Y:Zn=1:1:1 [atomic ratio], In:Y:Zn=2:1:3 [atomic ratio], and In:Y:Zn=3:1:2 [atomic ratio] as sputtering targets, over quartz substrates to each have a thickness of 100 nm under the following conditions: $O_2$ was 100% in a film formation atmosphere; the flow rate of the $O_2$ gas was 30 sccm; the pressure inside a chamber was 0.4 Pa; a power source was a DC power source; and a power of 200 W was applied. The substrate temperatures during film formation were set to room temperature, 200° C., and 300° C.

Figure 23:
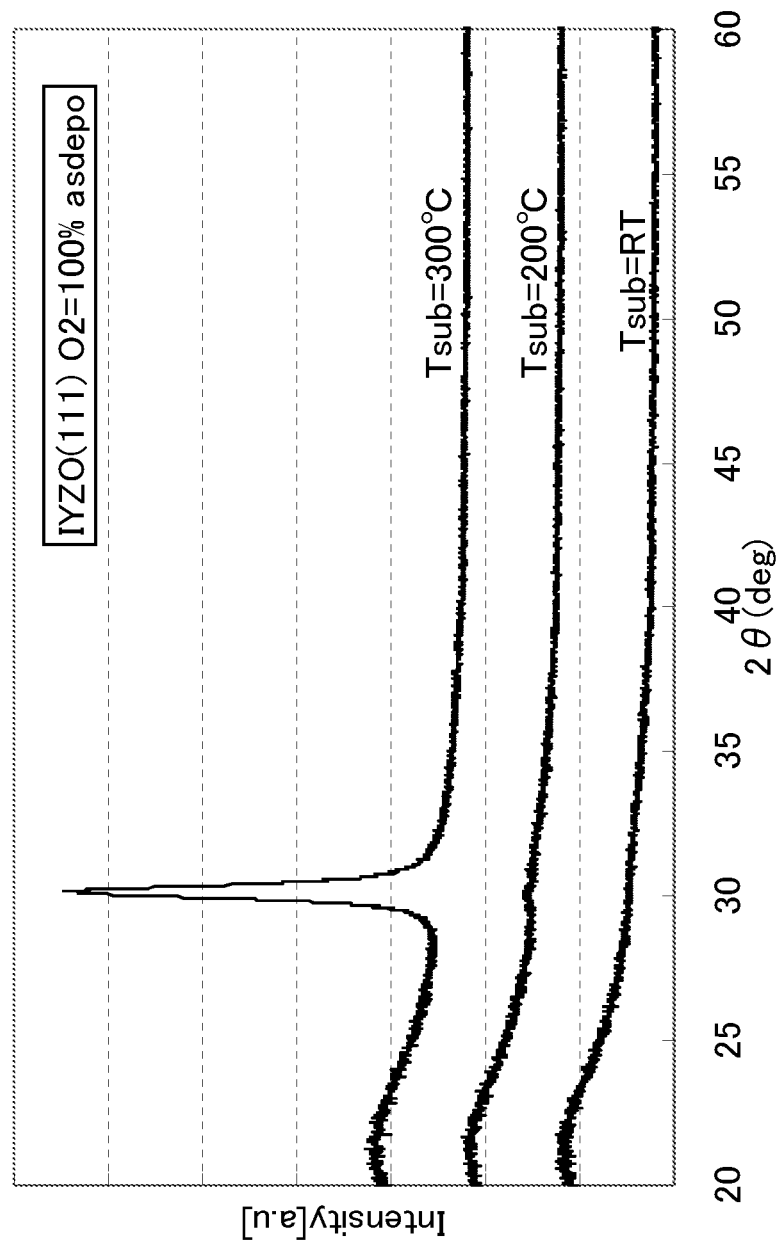
FIG. 23 is a graph showing measurement results in Example of the present invention.
Figure 24:
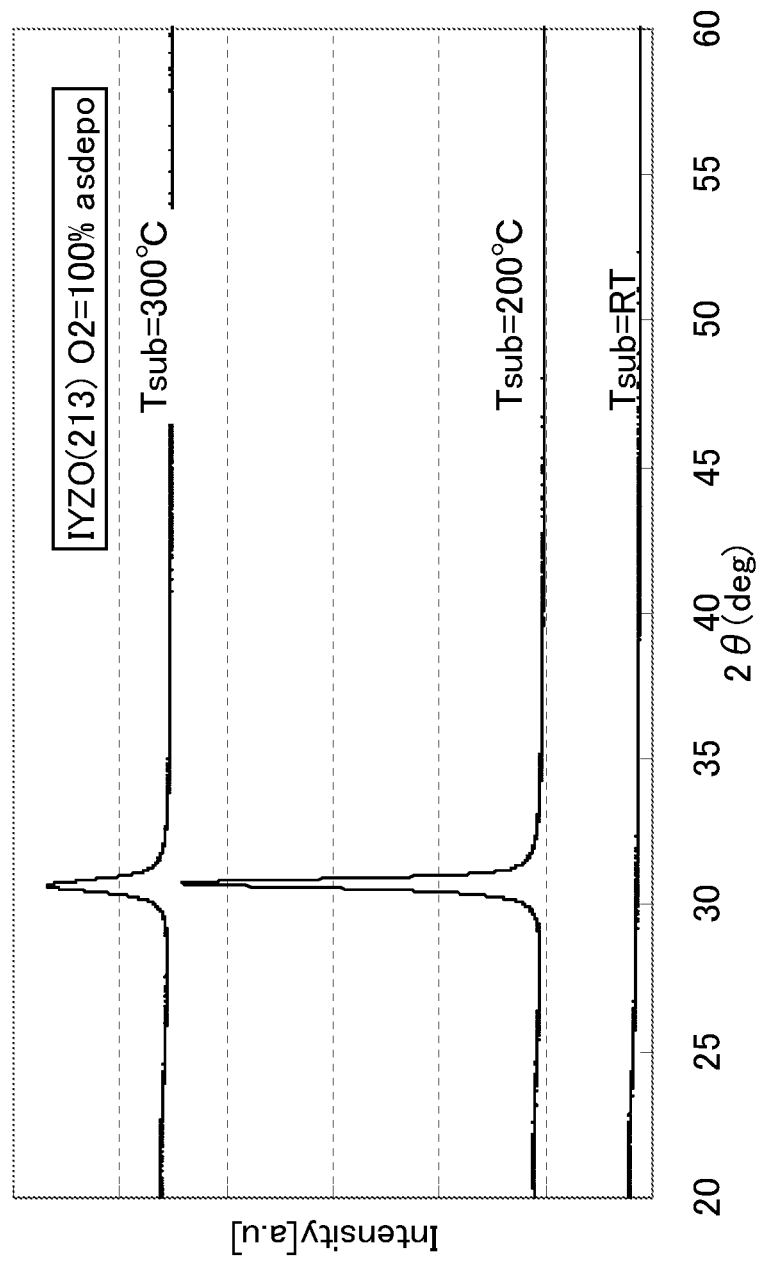
FIG. 24 is a graph showing measurement results in Example of the present invention.
Figure 25:
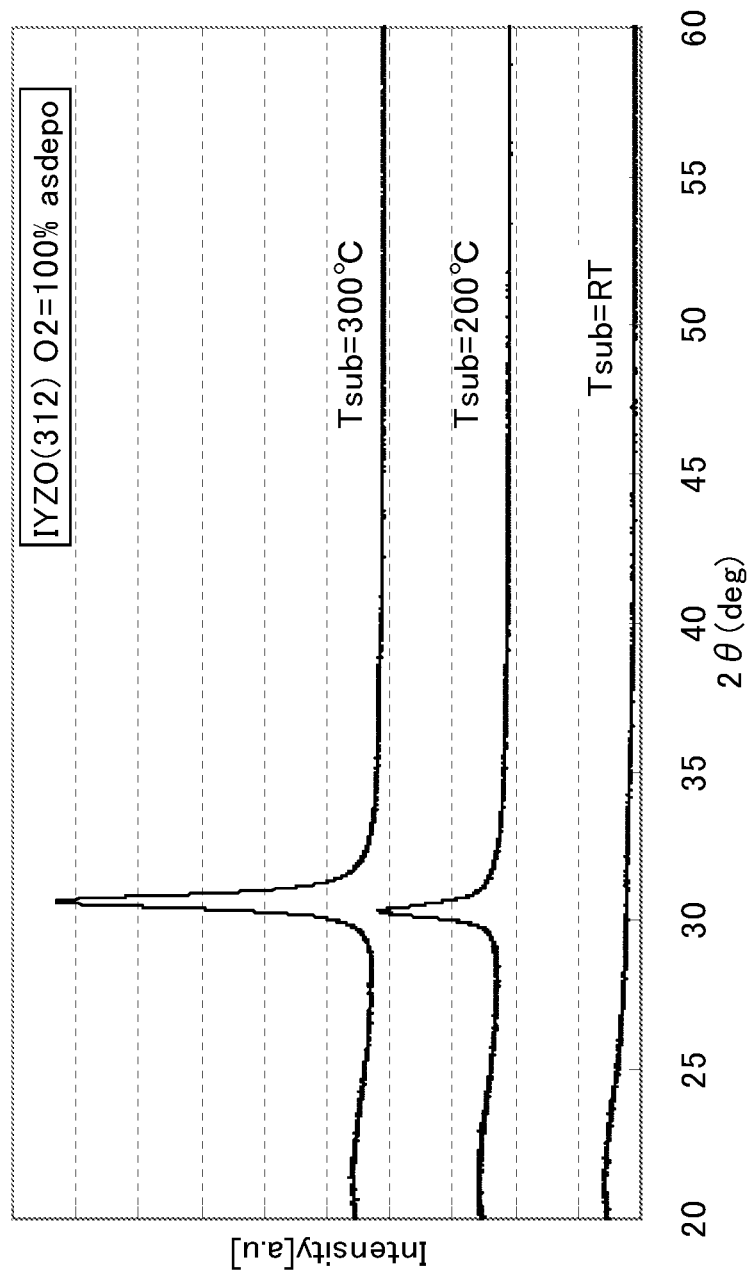
FIG. 25 is a graph showing measurement results in Example of the present invention.

FIG. 23, FIG. 24, and FIG. 25 show XRD measurement results of the In—Y—Zn—O film formed using a target having a composition ratio of In:Y:Zn=1:1:1 [atomic ratio], the In—Y—Zn—O film formed using a target having a composition ratio of In:Y:Zn=2:1:3 [atomic ratio], and the In—Y—Zn—O film formed using a target having a composition ratio of In:Y:Zn=3:1:2 [atomic ratio], respectively. Note that three spectrums in each of FIGS. 23 to 25 show data of the respective In—Y—Zn—O films formed at respective substrate temperatures of room temperature, 200° C., and 300° C. In FIGS. 23 to 25, the horizontal axis represents 2θ (degree) and the vertical axis represents the X-ray reflection intensity (arbitrary unit).

From FIG. 23, a peak is observed at around 2θ=30° in the case of the In—Y—Zn—O film formed using a target having a composition ratio of In:Y:Zn=1:1:1 [atomic ratio] at a substrate temperature of 300° C. during film formation, which indicates that the film has crystallinity. Thus, it can be said that crystal growth of an oxide semiconductor film formed over the In—Y—Zn—O film which was formed (using a target having a composition ratio of In:Y:Zn=1:1:1 [atomic ratio]) at a substrate temperature during film formation of 300° C. is likely to occur by using a crystal in the base film as a seed crystal while depositing the oxide semiconductor film, so that the oxide semiconductor film is likely to have crystallinity in a large region in the thickness direction from a vicinity of an interface with the base film. Note that the peak of the X-ray reflection intensity which appears at around 2θ=30° is the sharpest at a substrate heating temperature of 300° C., which indicates that a state of crystals in the base film depends on the substrate heating temperature during formation of the base film.

From FIG. 24, a peak is observed at around 2θ=30° in the case of the In—Y—Zn—O film formed using a target having a composition ratio of In:Y:Zn=2:1:3 [atomic ratio] at a substrate temperature of 200° C. or 300° C. during film formation, which indicates that the film has crystallinity. Thus, it can be said that crystal growth of an oxide semiconductor film formed over the In—Y—Zn—O film which was formed (using a target having a composition ratio of In:Y:Zn=2:1:3 [atomic ratio]) at a substrate temperature during film formation of 200° C. or 300° C. is likely to occur by using a crystal in the base film as a seed crystal while depositing the oxide semiconductor film, so that the oxide semiconductor film is likely to have crystallinity in a large region in the thickness direction from a vicinity of an interface with the base film. Note that the peak of the X-ray reflection intensity which appears at around 2θ=30° is the sharpest at a substrate heating temperature of 200° C., which indicates that a state of crystals in the base film depends on the substrate heating temperature during formation of the base film.

From FIG. 25, a peak is observed at around 2θ=30° in the case of the In—Y—Zn—O film formed using a target having a composition ratio of In:Y:Zn=3:1:2 [atomic ratio] at a substrate temperature of 200° C. or 300° C. during film formation, which indicates that the film has crystallinity. Thus, it can be said that crystal growth of an oxide semiconductor film formed over the In—Y—Zn—O film which was formed (using a target having a composition ratio of In:Y:Zn=3:1:2 [atomic ratio]) at a substrate temperature during film formation of 200° C. or 300° C. is likely to occur by using a crystal in the base film as a seed crystal while depositing the oxide semiconductor film, so that the oxide semiconductor film is likely to have crystallinity in a large region in the thickness direction from a vicinity of an interface with the base film. Note that the peak of the X-ray reflection intensity which appears at around 2θ=30° is the sharpest at a substrate heating temperature of 300° C., which indicates that a state of crystals in the base film depends on the substrate heating temperature during formation of the base film.

<XRD Measurement Results of In—Zr—Zn—O Film>

The In—Zr—Zn—O films were formed to each have a thickness of 100 nm under the following conditions: a target having composition ratio of In:Zr:Zn=1:1:1 [atomic ratio] was used as a sputtering target; $O_2$ was 100% in a film formation atmosphere; the flow rate of the $O_2$ gas was 30 sccm; the pressure inside a chamber was 0.4 Pa; a power source was a DC power source; and a power of 200 W was applied. The substrate temperatures during film formation were set to room temperature, 200° C., and 300° C.

Figure 26:
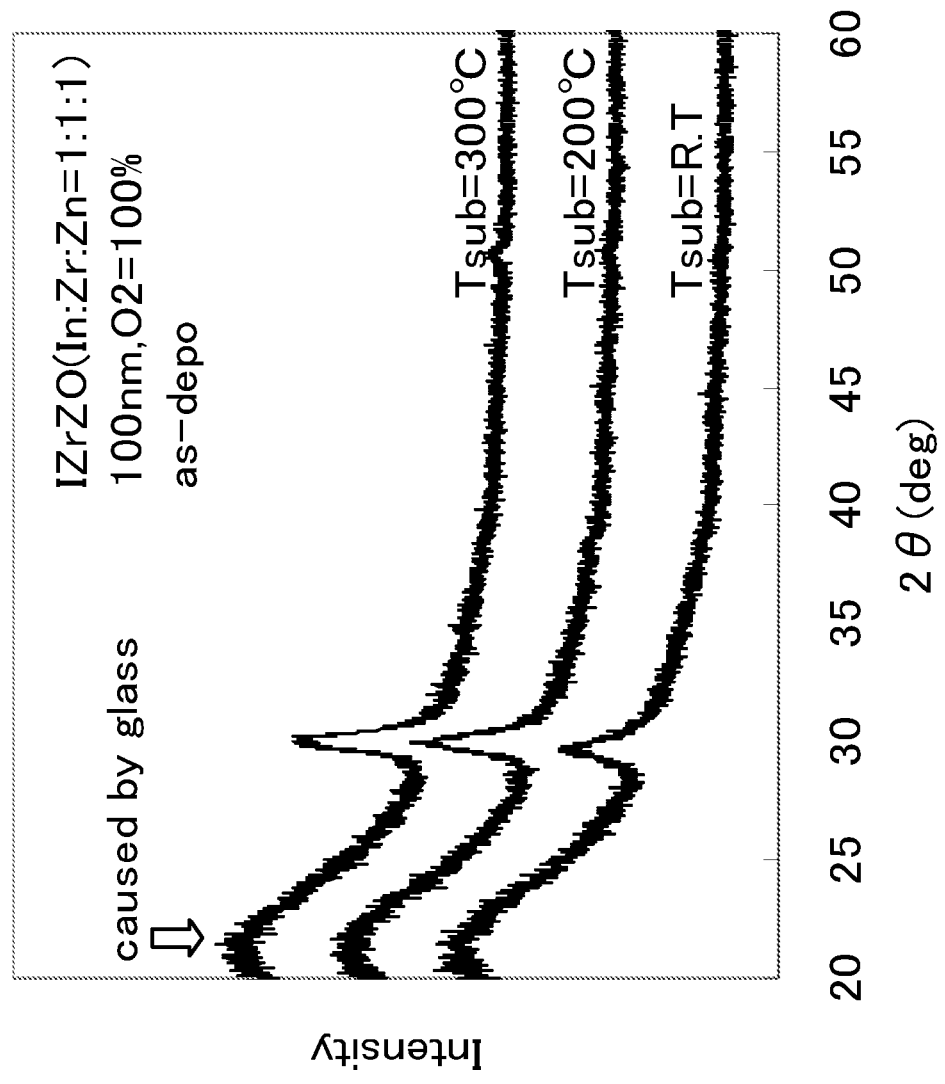
FIG. 26 is a graph showing measurement results in Example of the present invention.

The In—Zr—Zn—O films formed under the above-described conditions were subjected to XRD measurement and states of crystals in the films were examined. The results are shown in FIG. 26. Note that three spectrums in FIG. 26 show data of the In—Zr—Zn—O films formed at respective substrate temperatures of room temperature, 200° C., and 300° C. In FIG. 26, the horizontal axis represents 2θ (degree) and the vertical axis represents the X-ray reflection intensity (arbitrary unit).

From FIG. 26, a peak is observed at around 2θ=30° in the case of all the In—Zr—Zn—O films formed at respective substrate heating temperatures of room temperature, 200° C., and 300° C., which indicates that the films have crystallinity. Thus, it can be said that crystal growth of an oxide semiconductor film formed over the In—Zr—Zn—O film (using a target having a composition ratio of In:Zr:Zn=1:1:1 [atomic ratio]) is likely to occur by using a crystal in the base film as a seed crystal while depositing the oxide semiconductor film, so that the oxide semiconductor film is likely to have crystallinity in a large region in the thickness direction from a vicinity of an interface with the base film. Note that the peak of the X-ray reflection intensity which appears at around 2θ=30° is the sharpest at a substrate heating temperature of 300° C., which indicates that a state of crystals in the base film depends on the substrate heating temperature during formation of the base film.

<XRD Measurement Results of In—Ce—Zn—O Film>

The In—Ce—Zn—O films were formed to each have a thickness of 100 nm under the following conditions: a target having composition ratio of In:Ce:Zn=1:1:1 [atomic ratio] was used as a sputtering target; $O_2$ was 100% in a film formation atmosphere; the flow rate of the $O_2$ gas was 30 sccm; the pressure inside a chamber was 0.4 Pa; a power source was a DC power source; and a power of 200 W was applied. The substrate temperatures during film formation were set to room temperature, 200° C., and 300° C.

Figure 27:
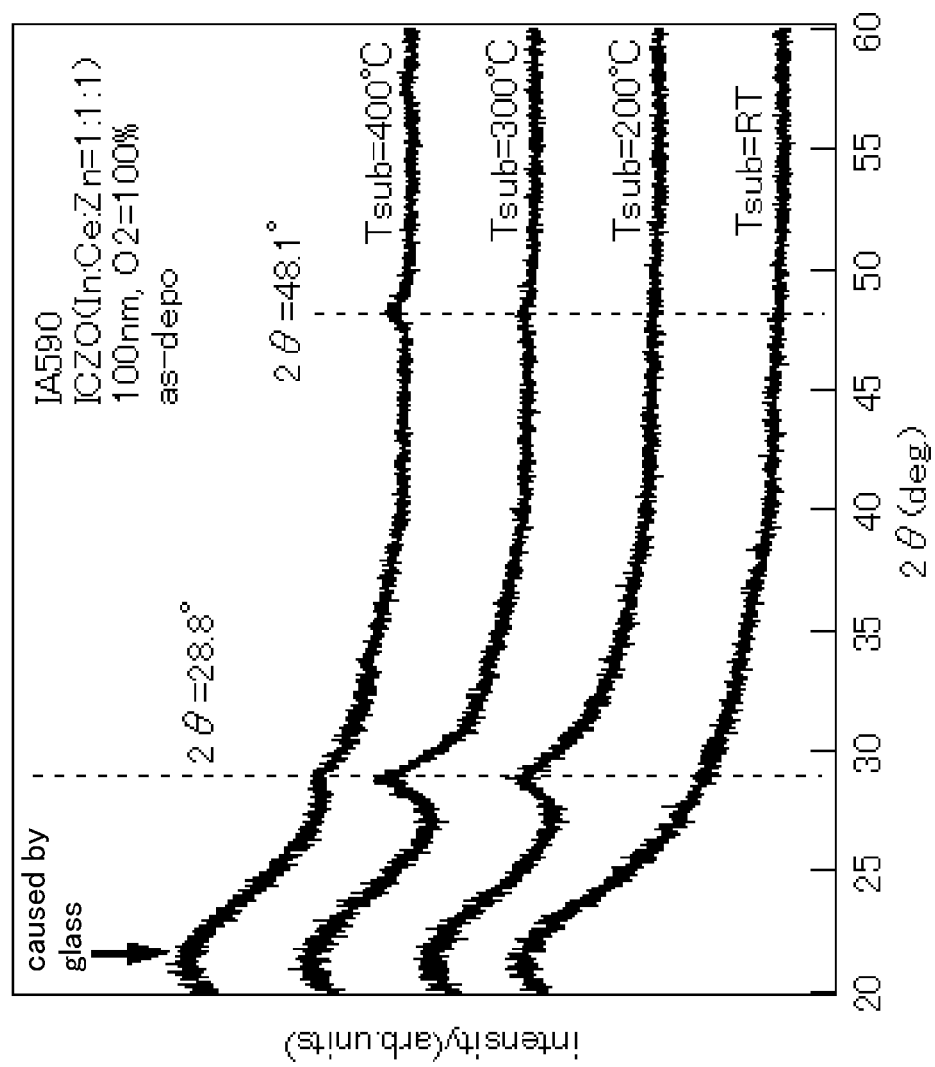
FIG. 27 is a graph showing measurement results in Example of the present invention.

The XRD measurement results of the In—Ce—Zn—O films formed using a target having composition ratio of In:Ce:Zn=1:1:1 [atomic ratio] are shown in FIG. 27. Note that four spectrums in FIG. 27 show data of the In—Ce—Zn—O films formed at respective substrate temperatures of room temperature, 200° C., 300° C., and 400° C. In FIG. 27, the horizontal axis represents 2θ (degree) and the vertical axis represents the X-ray reflection intensity (arbitrary unit).

From FIG. 27, a peak is observed at around 2θ=30° in the case of the In—Ce—Zn—O film formed using a target having a composition ratio of In:Ce:Zn=1:1:1 [atomic ratio] at a substrate heating temperature of 200° C. or 300° C. during film formation, which indicates that the film has crystallinity. Thus, it can be said that crystal growth of an oxide semiconductor film formed over the In—Ce—Zn—O film which was formed (using a target having a composition ratio of In:Ce:Zn=1:1:1 [atomic ratio]) at a substrate heating temperature during film formation of 200° C. or 300° C. is likely to occur by using a crystal in the base film as a seed crystal while depositing the oxide semiconductor film, so that the oxide semiconductor film is likely to have crystallinity in a large region in the thickness direction from a vicinity of an interface with the base film. Note that the peak of the X-ray reflection intensity which appears at around 2θ=30° is the sharpest at a substrate heating temperature of 300° C., which indicates that a state of crystals in the base film depends on the substrate heating temperature during formation of the base film.

This application is based on Japanese Patent Application serial no. 2011-252641 filed with Japan Patent Office on Nov. 18, 2011, the entire contents of which are hereby incorporated by reference.

What is claimed is:

1. A semiconductor element comprising:
    a base film, at least a surface of the base film having crystallinity;
    an oxide semiconductor film having crystallinity over the base film, the oxide semiconductor film comprising a channel formation region;
    a gate insulating film over the oxide semiconductor film;
    a gate electrode over the gate insulating film, the gate electrode overlapping with the channel formation region; and
    a source electrode and a drain electrode which are electrically connected to the oxide semiconductor film,
    wherein the source electrode and the drain electrode are provided over the base film with the oxide semiconductor film interposed therebetween,
    wherein a bottom surface of each of the channel formation region, the source electrode, and the drain electrode is directly in contact with the surface of the base film,
    wherein the base film contains oxygen, indium, and zinc, and
    wherein an entirety of each of the oxide semiconductor film, the source electrode, and the drain electrode is directly above and in contact with the base film to overlap the base film when seen from above.

2. The semiconductor element according to claim 1,
    wherein the oxide semiconductor film has a crystal-amorphous mixed phase structure where crystal parts are included in an amorphous phase, and
    wherein in each of the crystal parts, a c-axis is aligned with a direction parallel to a normal vector of a surface where the oxide semiconductor film is formed or a normal vector of a surface of the oxide semiconductor film, triangular or hexagonal atomic arrangement which is seen from a direction perpendicular to an a-b plane is formed, and metal atoms are arranged in a layered manner or the metal atoms and oxygen atoms are arranged in a layered manner when seen from a direction perpendicular to the c-axis.

3. The semiconductor element according to claim 1,
    wherein a bottom surface of the oxide semiconductor film is directly in contact with the surface of the base film.

4. A semiconductor device comprising the semiconductor element according to claim 1.

5. A semiconductor element comprising:
    a base film over a substrate, at least a surface of the base film having crystallinity;
    an oxide semiconductor film having crystallinity over the base film, the oxide semiconductor film comprising a channel formation region;
    a gate insulating film over the oxide semiconductor film;
    a gate electrode over the gate insulating film, the gate electrode overlapping with the channel formation region; and
    a source electrode and a drain electrode which are electrically connected to the oxide semiconductor film,
    wherein a part of the source electrode and the drain electrode are provided over the base film with the oxide semiconductor film interposed therebetween,
    wherein another part of the source electrode and the drain electrode are provided over the substrate with the base film interposed therebetween,
    wherein a bottom surface of each of the channel formation region, the source electrode, and the drain electrode is directly in contact with the surface of the base film,
    wherein the base film contains oxygen, indium, and zinc,
    wherein the base film further contains one or more of zirconium, yttrium, and cerium, and
    wherein an entirety of each of the oxide semiconductor film, the source electrode, and the drain electrode is directly above and in contact with the base film to overlap the base film when seen from above.

6. The semiconductor element according to claim 5,
    wherein the oxide semiconductor film has a crystal-amorphous mixed phase structure where crystal parts are included in an amorphous phase, and
    wherein in each of the crystal parts, a c-axis is aligned with a direction parallel to a normal vector of a surface where the oxide semiconductor film is formed or a normal vector of a surface of the oxide semiconductor film, triangular or hexagonal atomic arrangement which is seen from a direction perpendicular to an a-b plane is formed, and metal atoms are arranged in a layered manner or the metal atoms and oxygen atoms are arranged in a layered manner when seen from a direction perpendicular to the c-axis.

7. The semiconductor element according to claim 5:
wherein a bottom surface of the oxide semiconductor film is directly in contact with the surface of the base film.

8. A semiconductor device comprising the semiconductor element according to claim 5.

9. The semiconductor element according to claim 1,
wherein the oxide semiconductor film has an impurity region, and
wherein the impurity region does not overlap with the gate electrode.

10. The semiconductor element according to claim 1,
wherein the oxide semiconductor film has an impurity region,
wherein the impurity region does not overlap with the gate electrode, and
wherein the impurity region includes any one of nitrogen, phosphorus, arsenic, antimony, boron, aluminum, argon, helium, neon, indium, fluorine, chlorine, titanium, and zinc.

11. The semiconductor element according to claim 1,
wherein the oxide semiconductor film has a crystal-amorphous mixed phase structure where crystal parts are included in an amorphous phase.

12. The semiconductor element according to claim 1, further comprising a conductive film being directly in contact with a side surface of the base film and a bottom surface of the oxide semiconductor film.

13. The semiconductor element according to claim 5,
wherein the oxide semiconductor film has an impurity region, and
wherein the impurity region does not overlap with the gate electrode.

14. The semiconductor element according to claim 5,
wherein the oxide semiconductor film has an impurity region,
wherein the impurity region does not overlap with the gate electrode, and
wherein the impurity region includes any one of nitrogen, phosphorus, arsenic, antimony, boron, aluminum, argon, helium, neon, indium, fluorine, chlorine, titanium, and zinc.

15. The semiconductor element according to claim 5,
wherein the oxide semiconductor film has a crystal-amorphous mixed phase structure where crystal parts are included in an amorphous phase.

16. The semiconductor element according to claim 5, further comprising a conductive film being directly in contact with a side surface of the base film and a bottom surface of the oxide semiconductor film.

17. The semiconductor element according to claim 1,
wherein a bottom surface of the oxide semiconductor film is directly in contact with the surface of the base film, and
wherein a side surface and a top surface of the oxide semiconductor film are directly in contact with the source electrode and the drain electrode.

18. The semiconductor element according to claim 5,
wherein a bottom surface of the oxide semiconductor film is directly in contact with the surface of the base film, and
wherein a side surface and a top surface of the oxide semiconductor film are directly in contact with the source electrode and the drain electrode.

19. The semiconductor element according to claim 1, wherein a crystal part of the oxide semiconductor film is located at an interface between the base film and the oxide semiconductor film.

20. The semiconductor element according to claim 5,
wherein a crystal part of the oxide semiconductor film is located at an interface between the base film and the oxide semiconductor film.

21. The semiconductor element according to claim 1,
wherein the bottom surface of the oxide semiconductor film is coplanar with the bottom surface of the source electrode and the bottom surface of the drain electrode.

22. The semiconductor element according to claim 5,
wherein the bottom surface of the oxide semiconductor film is coplanar with the bottom surface of the source electrode and the bottom surface of the drain electrode.

* * * * *